US011978779B2

(12) United States Patent
Kim et al.

(10) Patent No.: US 11,978,779 B2
(45) Date of Patent: May 7, 2024

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Juyoun Kim, Suwon-si (KR); Hyung Jong Lee, Osan-si (KR); Seulgi Yun, Hwaseong-si (KR); Seki Hong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 289 days.

(21) Appl. No.: 17/580,847

(22) Filed: Jan. 21, 2022

(65) Prior Publication Data
US 2022/0302274 A1 Sep. 22, 2022

(30) Foreign Application Priority Data

Mar. 18, 2021 (KR) .................. 10-2021-0035442
Apr. 22, 2021 (KR) .................. 10-2021-0052673

(51) Int. Cl.
*H01L 29/423* (2006.01)
*H01L 27/092* (2006.01)

(52) U.S. Cl.
CPC .... *H01L 29/42372* (2013.01); *H01L 27/0924* (2013.01)

(58) Field of Classification Search
CPC ........... H01L 29/42372; H01L 27/0924; H01L 21/823456; H01L 27/092; H01L 21/823468; H01L 21/823475; H01L 27/088; H01L 21/823821; H01L 27/0886; H01L 21/823431; H01L 29/785; H01L 21/823864; H01L 21/823871
See application file for complete search history.

(56) References Cited

U.S. PATENT DOCUMENTS

| | | | |
|---|---|---|---|
| 5,512,770 | A | 4/1996 | Hong |
| 7,285,829 | B2 | 10/2007 | Doyle et al. |
| 7,288,817 | B2 | 10/2007 | Juengling et al. |
| 9,318,575 | B2 | 4/2016 | Jeong et al. |
| 9,969,564 | B2 | 5/2018 | Oren et al. |
| 10,052,661 | B2 | 8/2018 | Hayduchok et al. |
| 10,154,437 | B2 | 12/2018 | Bhushan et al. |
| 10,249,379 | B2 | 4/2019 | Chung |
| 10,314,077 | B2 | 6/2019 | Bhushan et al. |
| 10,529,823 | B2 | 1/2020 | Miao et al. |
| 2018/0190546 | A1 | 7/2018 | Wu et al. |
| 2019/0268000 | A1* | 8/2019 | Song .................. H01L 27/0886 |
| 2020/0303261 | A1 | 9/2020 | Shen et al. |

\* cited by examiner

*Primary Examiner* — Karen Kusumakar
*Assistant Examiner* — Adam S Bowen
(74) *Attorney, Agent, or Firm* — Fish & Richardson P.C.

(57) ABSTRACT

A semiconductor device includes a first active pattern on a substrate. The first active pattern includes a pair of first source/drain patterns and a first channel pattern therebetween. A gate electrode is disposed on the first channel pattern, and a first gate spacer is disposed on a side surface of the gate electrode. The first gate spacer includes a first spacer and a second spacer. A top surface of the first spacer is lower than a top surface of the second spacer. A first blocking pattern is disposed on the first spacer, and a gate contact is coupled to the gate electrode. The first blocking pattern is interposed between the gate contact and the second spacer.

20 Claims, 54 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0035442, filed on Mar. 18, 2021, and Korean Patent Application No. 10-2021-0052673, filed on Apr. 22, 2021, in the Korean Intellectual Property Office, the entire contents of which are hereby incorporated by reference.

BACKGROUND OF THE DISCLOSURE

The present disclosure relates to a semiconductor device, a method of fabricating the same, a semiconductor device including a field effect transistor, and a method of fabricating the same.

A semiconductor device includes an integrated circuit having metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

SUMMARY

An embodiment of the disclosure provides a semiconductor device with improved reliability and electric characteristics.

An embodiment of the disclosure provides a method of fabricating a semiconductor device with improved reliability and electric characteristics.

According to an embodiment of the disclosure, a semiconductor device may include a first active pattern on a substrate. The first active pattern includes a pair of first source/drain patterns and a first channel pattern therebetween. A gate electrode is disposed on the first channel pattern. A first gate spacer is disposed on a side surface of the gate electrode. The first gate spacer includes a first spacer and a second spacer. A top surface of the first spacer is lower than a top surface of the second spacer. A first blocking pattern is disposed on the first spacer, and a gate contact is coupled to the gate electrode. The first blocking pattern may be interposed between the gate contact and the second spacer.

According to an embodiment of the disclosure, a semiconductor device may include an active pattern on a substrate, the active pattern including a pair of source/drain patterns and a channel pattern therebetween. A gate electrode is disposed on the channel pattern. A gate spacer is disposed on a side surface of the gate electrode. A gate capping pattern is disposed on the gate electrode. A gate contact is provided to penetrate the gate capping pattern and coupled to the gate electrode. A blocking pattern is disposed between the gate contact and the gate spacer. The blocking pattern may be extended along a side surface of the gate contact to prevent the gate contact from being formed in a region beyond the gate spacer, and the blocking pattern may include a material having an etch selectivity with respect to the gate spacer.

According to an embodiment of the disclosure, a semiconductor device may include a substrate including a PMOSFET region and an NMOSFET region, which are spaced apart from each other in a first direction. A first active pattern is disposed on the PMOSFET region, and a second active pattern is disposed on the NMOSFET region. A device isolation layer covers lower side surfaces of the first and second active patterns. An upper portion of each of the first and second active patterns protrudes above the device isolation layer. A gate electrode extends in the first direction to cross the first and second active patterns. A first source/drain pattern and a second source/drain pattern, which are respectively provided in the upper portions of the first and second active patterns, are disposed adjacent to sides of the gate electrode. A gate insulating layer is interposed between the gate electrode and the first and second active patterns. A gate spacer is disposed on a side surface of the gate electrode. A gate capping pattern is disposed on a top surface of the gate electrode. A gate cutting pattern penetrates the gate electrode. An interlayer insulating layer is disposed on the gate capping pattern and the gate cutting pattern. An active contact is provided to penetrate the interlayer insulating layer and electrically connect to at least one of the first and second source/drain patterns. A gate contact is provided to penetrate the interlayer insulating layer and the gate capping pattern and electrically connect to the gate electrode. An upper insulating pattern is provided on the active contact adjacent to the gate contact. A blocking pattern is disposed between the gate contact and the gate spacer. A first metal layer is disposed on the interlayer insulating layer. The first metal layer includes a power line vertically overlapped with the gate cutting pattern and first interconnection lines electrically connected to the active contact and the gate contact, respectively. A second metal layer is disposed on the first metal layer. The second metal layer may include second interconnection lines electrically connected to the first metal layer. The blocking pattern may be positioned between the gate contact and the upper insulating pattern, and the gate contact may be spaced apart from the active contact with the blocking pattern and the upper insulating pattern interposed therebetween.

According to an embodiment of the disclosure, a method of fabricating a semiconductor device may include: forming an active pattern on a substrate; forming a sacrificial pattern to cross the active pattern; forming a gate spacer, which includes a first spacer and a second spacer, on a side surface of the sacrificial pattern; forming a source/drain pattern on the active pattern to be adjacent to the sacrificial pattern; removing the sacrificial pattern to form an empty space; forming a gate insulating layer and a gate electrode in the empty space; recessing the first spacer; forming a blocking pattern on the recessed first spacer; forming a gate capping pattern on the gate electrode to cover the blocking pattern; and forming a gate contact, which penetrates the gate capping pattern and is coupled to the gate electrode.

DETAILED DESCRIPTION

Example embodiments of the disclosures will now be described more fully with reference to the accompanying drawings, in which example embodiments are shown.

Figure 1:
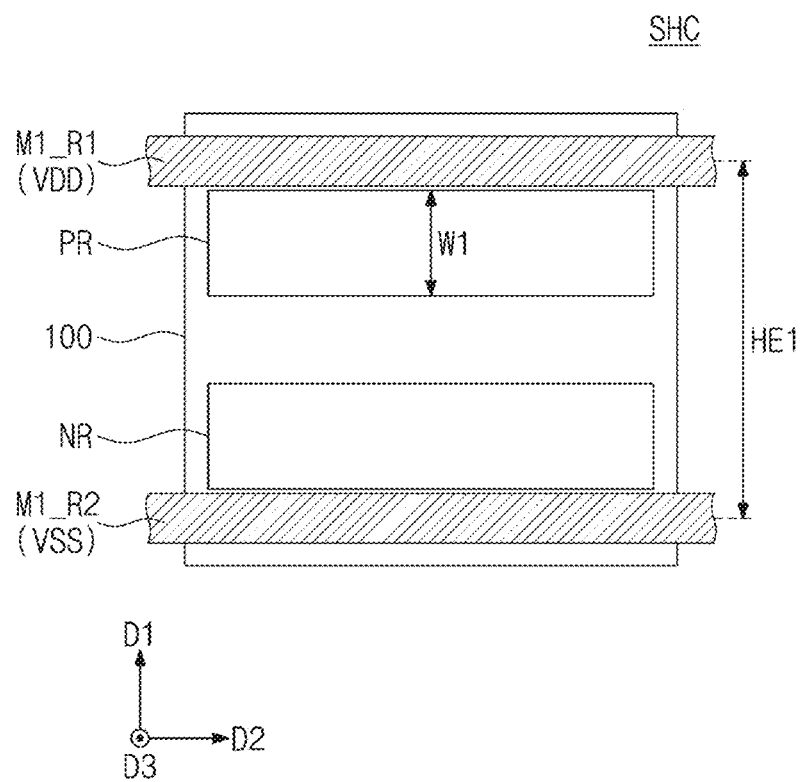
FIGS. 1 to 3 are conceptual diagrams illustrating logic cells of a semiconductor device according to an embodiment of the disclosure.
Figure 2:
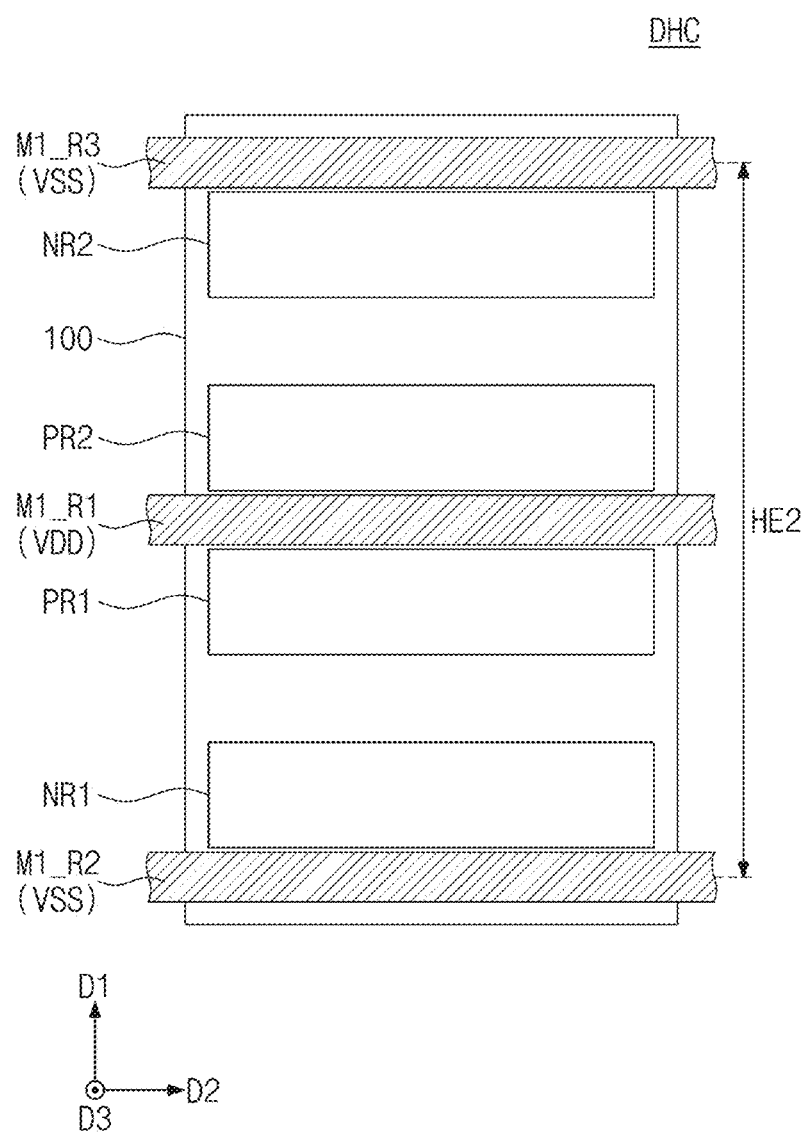
Figure 3:
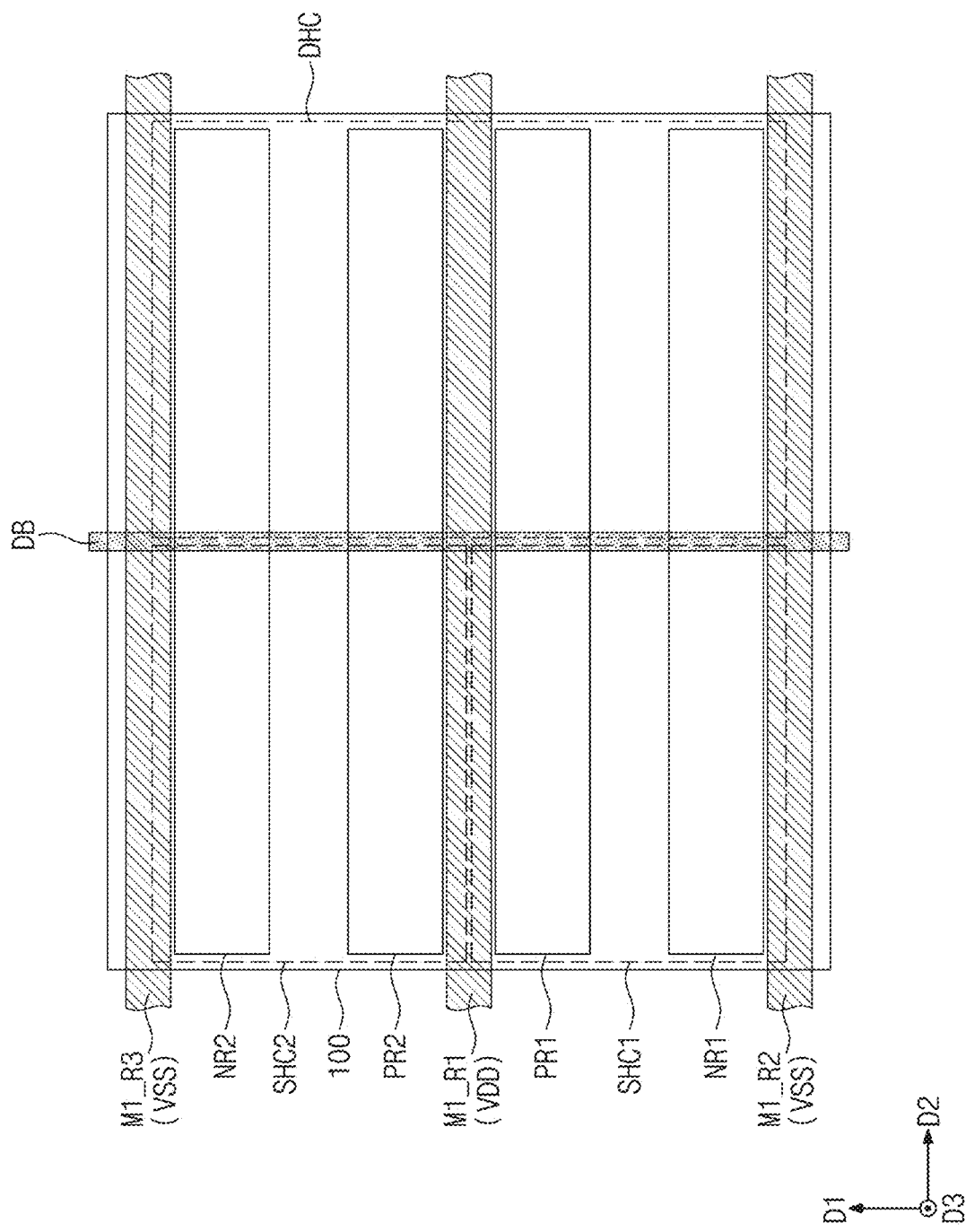

FIGS. 1 to 3 are conceptual diagrams illustrating logic cells of a semiconductor device according to an embodiment of the disclosure.

Referring to FIG. 1, a single height cell SHC may be provided. In detail, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first and second power lines M1_R1 and M1_R2. The single height cell SHC may include one PMOSFET region PR and one NMOSFET region NR. In other words, the single height cell SHC may have a CMOS structure provided between the first and second power lines M1_R1 and M1_R2.

Each of the PMOSFET and NMOSFET regions PR and NR may have a first width W1 in a first direction D1. A length of the single height cell SHC in the first direction D1 may be defined as a first height HE1. The first height HE1 may be substantially equal to a distance (e.g., a pitch) between the first power line M1_R1 and the second power line M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, a first power line M1_R1, a second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage VSS is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region.

Thus, a channel size of a PMOS transistor of the double height cell DHC may be greater than a channel size of a PMOS transistor of the single height cell SHC previously described with reference to FIG. 1. For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2 and a double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. An active region of the double height cell DHC may be electrically separated from an active region of each of the first and second single height cells SHC1 and SHC2 by the division structure DB.

Figure 4:
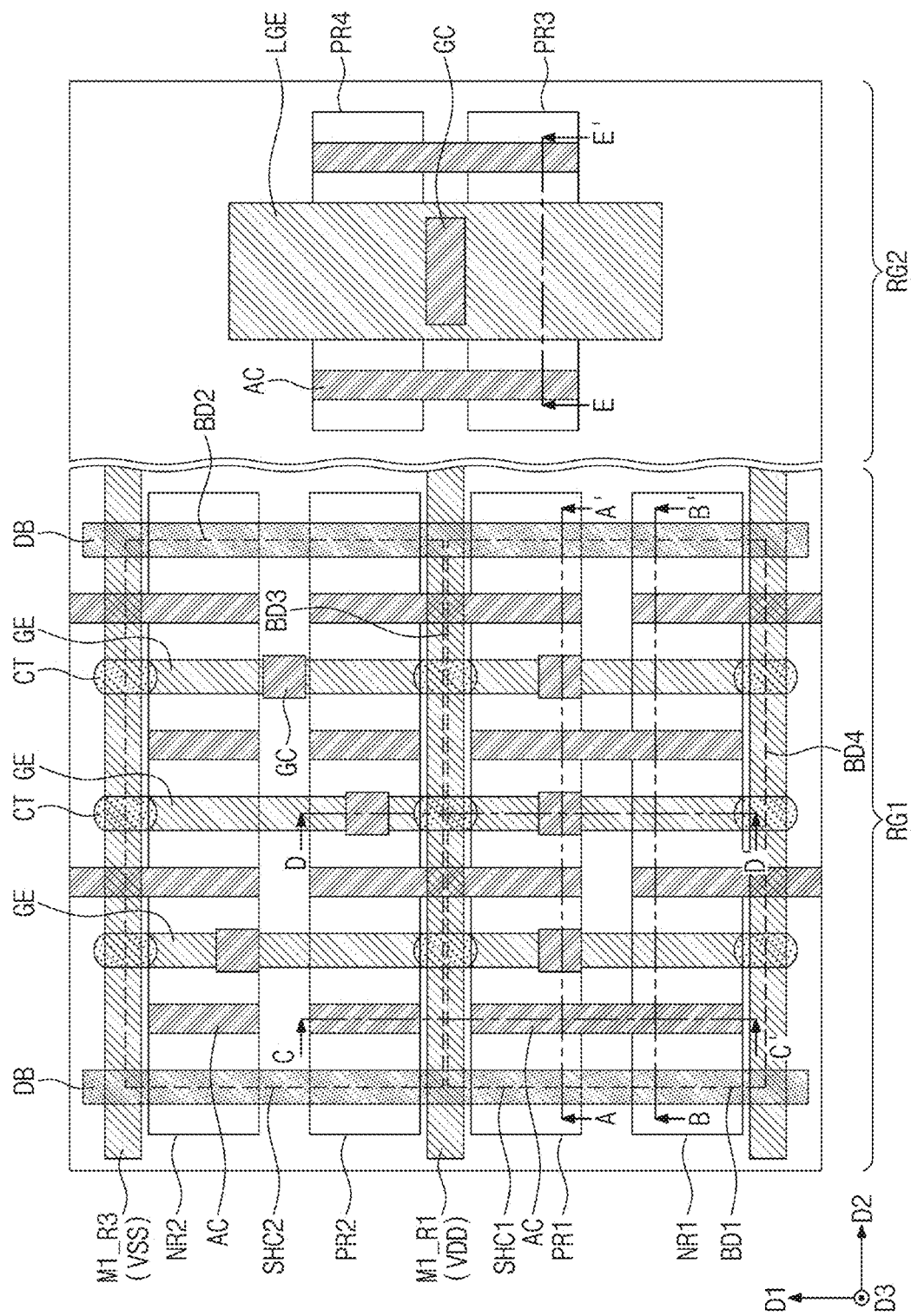
FIG. 4 is a plan view illustrating a semiconductor device according to an embodiment of the disclosure.
Figure 5A:
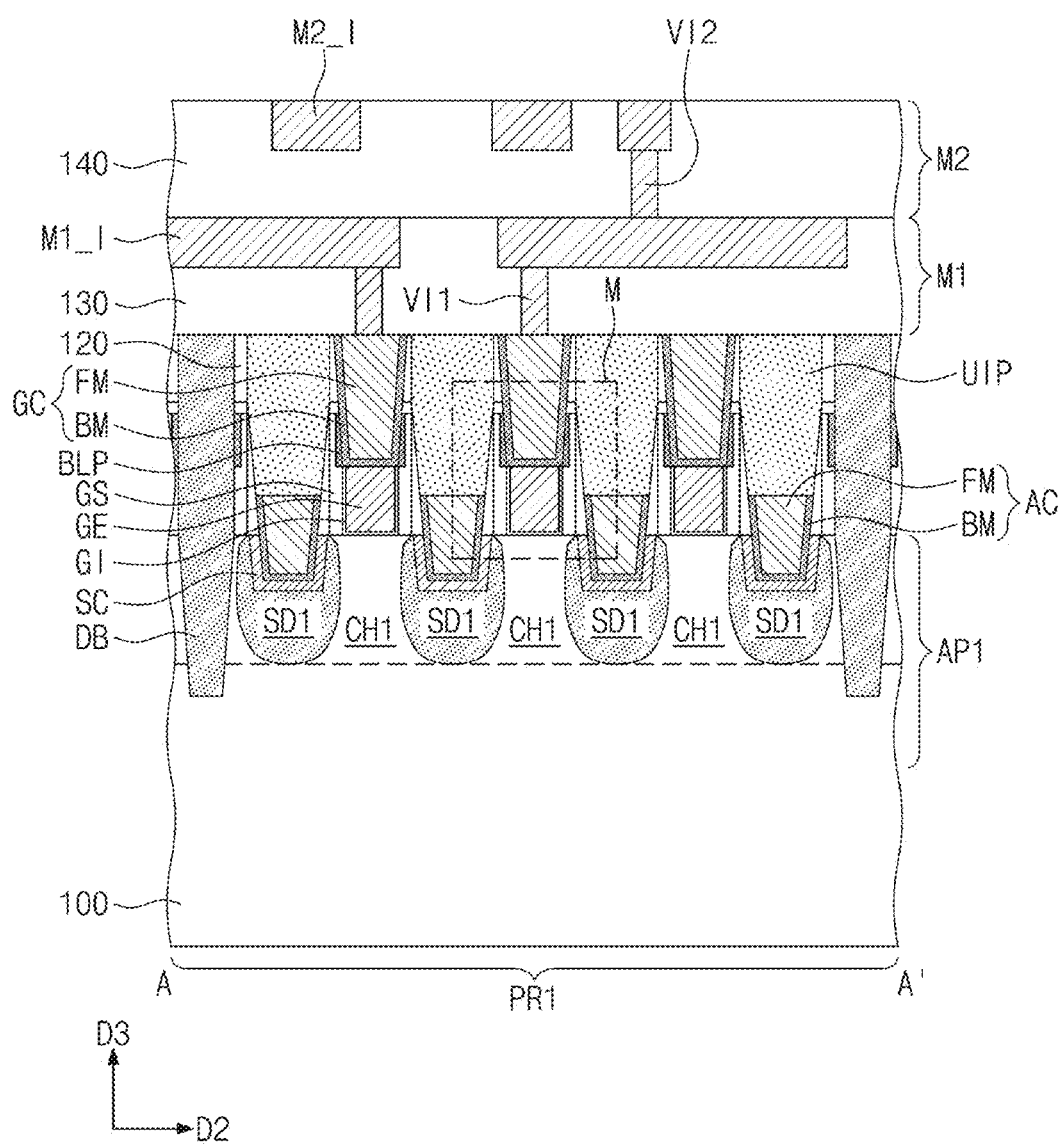
FIGS. 5A to 5E are sectional views taken along lines A-A', B-B', C-C', D-D', and E-E', respectively, of FIG. 4.
Figure 5B:
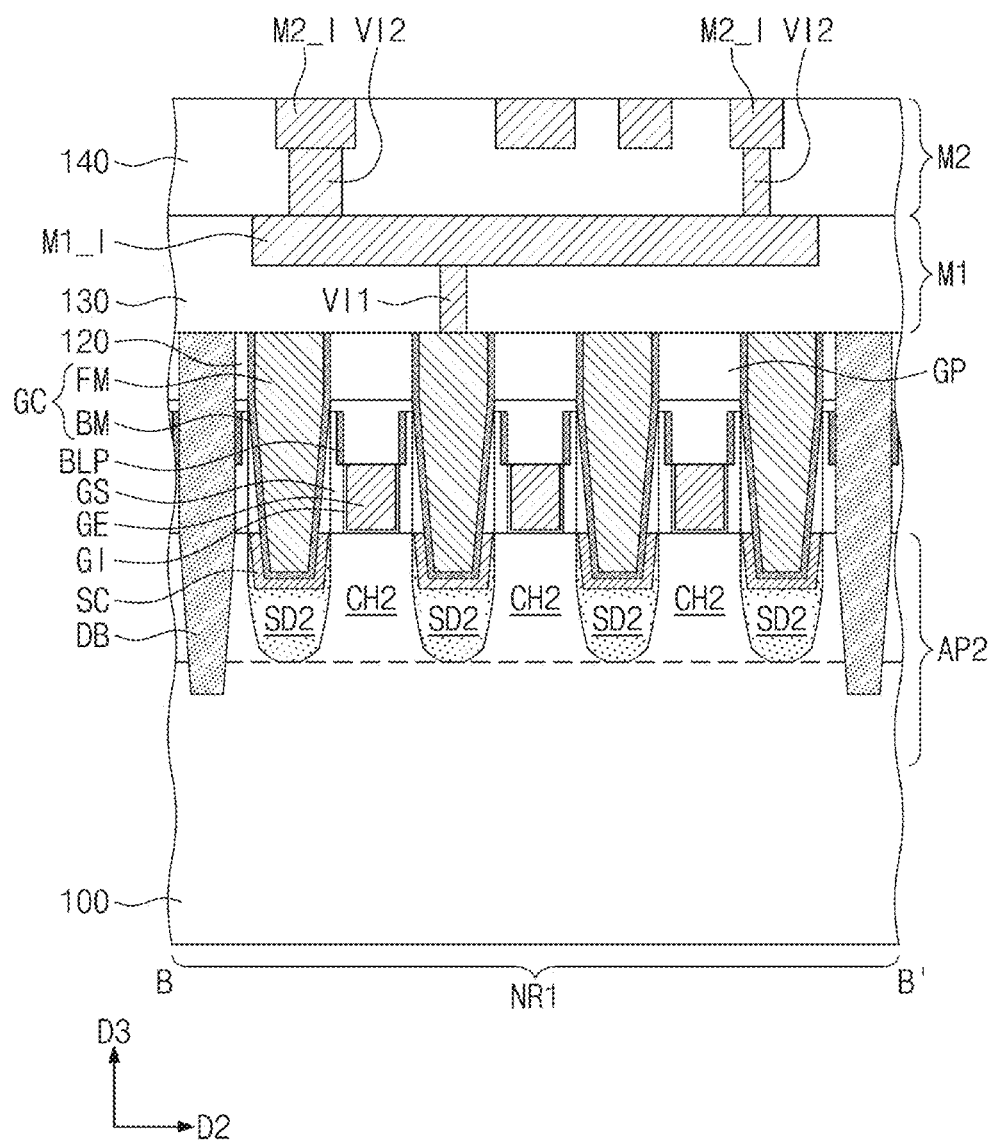
Figure 5C:
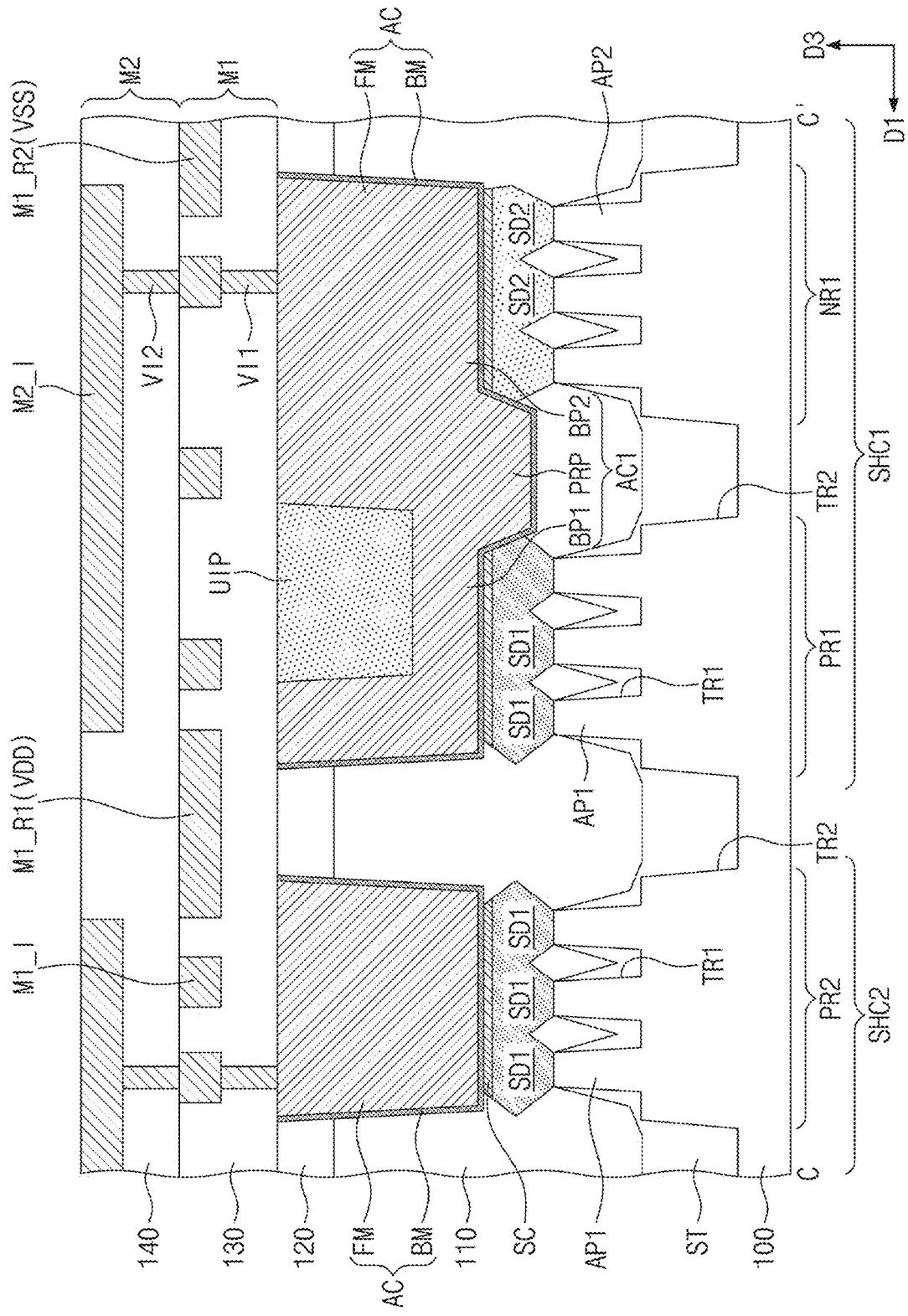
Figure 6:
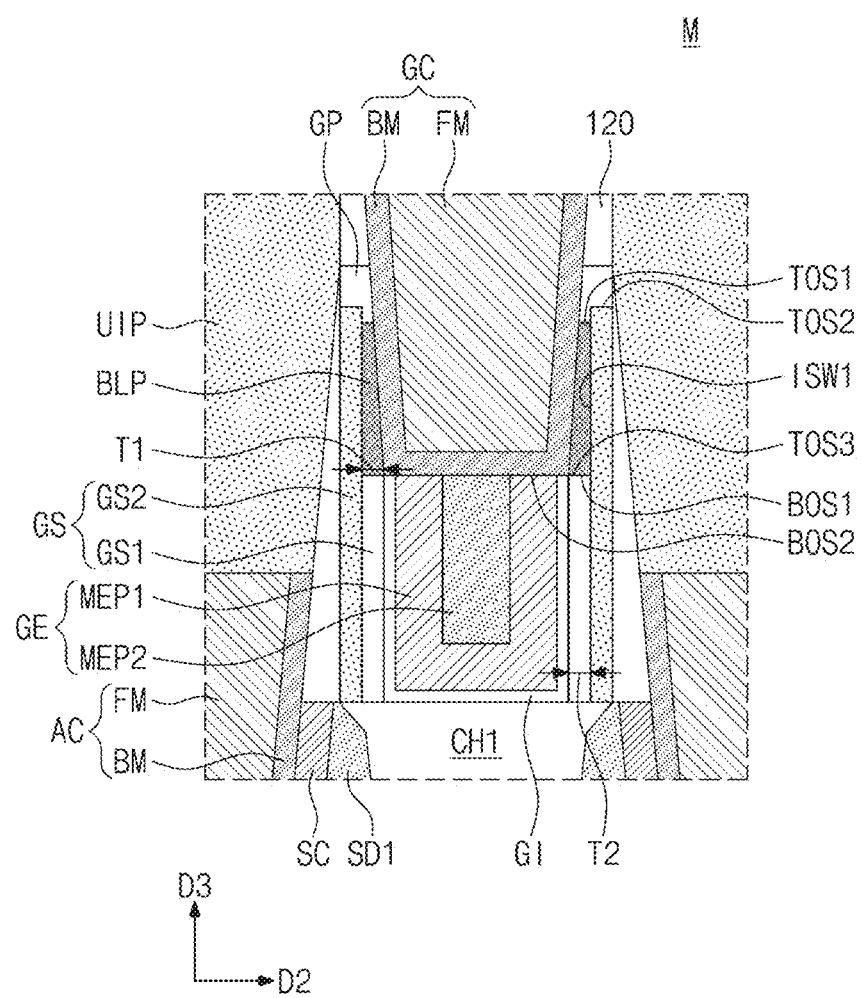
FIG. 6 is an enlarged sectional view of a portion M of FIG. 5A.
Figure 7:
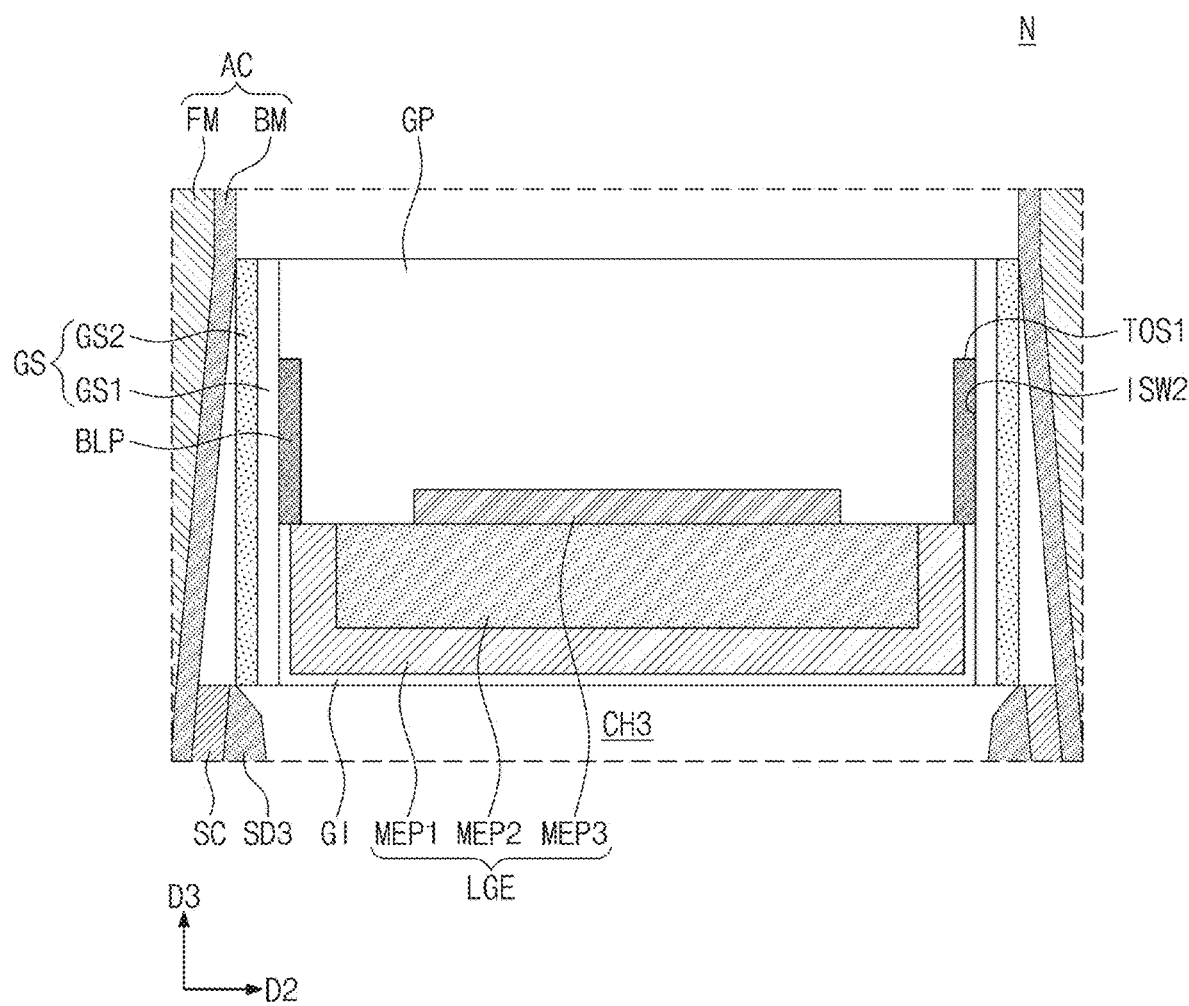
FIG. 7 is an enlarged sectional view of a portion N of FIG. 5E.

FIG. 4 is a plan view illustrating a semiconductor device according to an embodiment of the disclosure. FIGS. 5A to 5E are sectional views taken along lines A-A', B-B', C-C', D-D', and E-E', respectively, of FIG. 4. FIG. 6 is an enlarged sectional view of a portion M of FIG. 5A. FIG. 7 is an enlarged sectional view of a portion N of FIG. 5E.

Referring to FIGS. 4 and 5A to 5E, the substrate 100 may include a first region RG1 and a second region RG2. The substrate 100 may be a semiconductor substrate, which is formed of or includes silicon, germanium, silicon-germanium, or the like, or a compound semiconductor substrate. In an embodiment, the substrate 100 may be a silicon substrate.

The first region RG1 may be a logic cell region. The first and second single height cells SHC1 and SHC2 may be provided on the first region RG1. Logic transistors constituting the logic circuit may be disposed on each of the first and second single height cells SHC1 and SHC2. The first and second single height cells SHC1 and SHC2 according to the present embodiment are a more specific example of the first and second single height cells SHC1 and SHC2 of FIG. 3.

The second region RG2 may be a peripheral region. The second region RG2 may include a long gate transistor having a relatively long gate length (i.e., channel length). A transistor on the second region RG2 may be operated under high power condition, compared with a transistor on the first region RG1. Hereinafter, the transistor of the first region RG1 will be described in more detail with reference to FIGS. 4 and 5A to 5D.

The first region RG1 may include the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may be extended in the second direction D2.

The first PMOSFET region PR1, the second PMOSFET region PR2, the first NMOSFET region NR1, and the second NMOSFET region NR2 may be defined by a second trench TR2, which is formed in an upper portion of the substrate 100. For example, the second trench TR2 may be located between the first NMOSFET region NR1 and the first PMOSFET region PR1. The second trench TR2 may be located between the first PMOSFET region PR1 and the second PMOSFET region PR2. The second trench TR2 may be located between the second PMOSFET region PR2 and the second NMOSFET region NR2.

First active patterns AP1 may be provided on each of the first and second PMOSFET regions PR1 and PR2. Second active patterns AP2 may be provided on each of the first and second NMOSFET regions NR1 and NR2.

The first and second active patterns AP1 and AP2 may be extended in the second direction D2 to be parallel to each other. The first and second active patterns AP1 and AP2 may be vertically protruding portions of the substrate 100. A first trench TR1 may be defined between adjacent ones of the first active patterns AP1 and between adjacent ones of the second active patterns AP2. The first trench TR1 may be shallower than the second trench TR2.

A device isolation layer ST may fill the first and second trenches TR1 and TR2. The device isolation layer ST may be formed of or include silicon oxide. An upper portion of each of the first and second active patterns AP1 and AP2 may be a protruding pattern, which is vertically extended above the device isolation layer ST (e.g., see FIG. 5D). The upper portion of each of the first and second active patterns AP1 and AP2 may have a fin shape. The device isolation layer ST may not cover the upper portion of each of the first and second active patterns AP1 and AP2. The device isolation layer ST may cover a lower side surface of each of the first and second active patterns AP1 and AP2.

First source/drain patterns SD1 may be provided on each of the first and second PMOSFET regions PR1 and PR2. The first source/drain patterns SD1 may be provided in the upper portion of each of the first active patterns AP1. The first source/drain patterns SD1 may be impurity regions of a first conductivity type (e.g., p-type). A first channel pattern CH1 may be interposed between each pair of the first source/drain patterns SD1, which are adjacent to each other in the second direction D2.

Second source/drain patterns SD2 may be provided on each of the first and second NMOSFET regions NR1 and NR2. The second source/drain patterns SD2 may be provided in the upper portion of each of the second active patterns AP2. The second source/drain patterns SD2 may be impurity regions of a second conductivity type (e.g., n-type). A second channel pattern CH2 may be interposed between each pair of the second source/drain patterns SD2, which are adjacent to each other in the second direction D2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain pattern SD1 may include a semiconductor material (e.g., SiGe) having a lattice constant greater than that of the substrate 100. In this case, the pair of the first source/drain patterns SD1 may exert a compressive stress on the first channel pattern CH1 therebetween. In an embodiment, the second source/drain pattern SD2 may be formed of or include the same semiconductor material (e.g., Si) as the substrate 100.

Gate electrodes GE may be provided to cross the first and second active patterns AP1 and AP2 and to extend in the first direction D1. The gate electrodes GE may be arranged at a first pitch in the second direction D2. The gate electrodes GE may be vertically overlapped with the first and second channel patterns CH1 and CH2. Each of the gate electrodes GE may be provided to face a top surface and opposite side surfaces of each of the first and second channel patterns CH1 and CH2.

Referring back to FIG. 5D, the gate electrode GE may be provided on a first top surface TS1 and at least one of first side surfaces SW1 of the channel pattern CH1 or CH2. In other words, the transistor according to the present embodiment may be a three-dimensional field-effect transistor (e.g., FinFET), in which the gate electrode GE is provided to three-dimensionally surround the channel patterns CH1 and CH2.

Referring back to FIGS. 4 and 5A to 5D, the first single height cell SHC1 may have a first border BD1 and a second border BD2, which are opposite to each other in the second direction D2. The first and second borders BD1 and BD2 may be extended in the first direction D1. The first single height cell SHC1 may have a third border BD3 and a fourth border BD4, which are opposite to each other in the first direction D1. The third and fourth borders BD3 and BD4 may be extended in the second direction D2.

Gate cutting patterns CT may be disposed on a border, which is parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may be disposed to be overlapped with the gate electrodes GE, respectively.

Figure 5D:
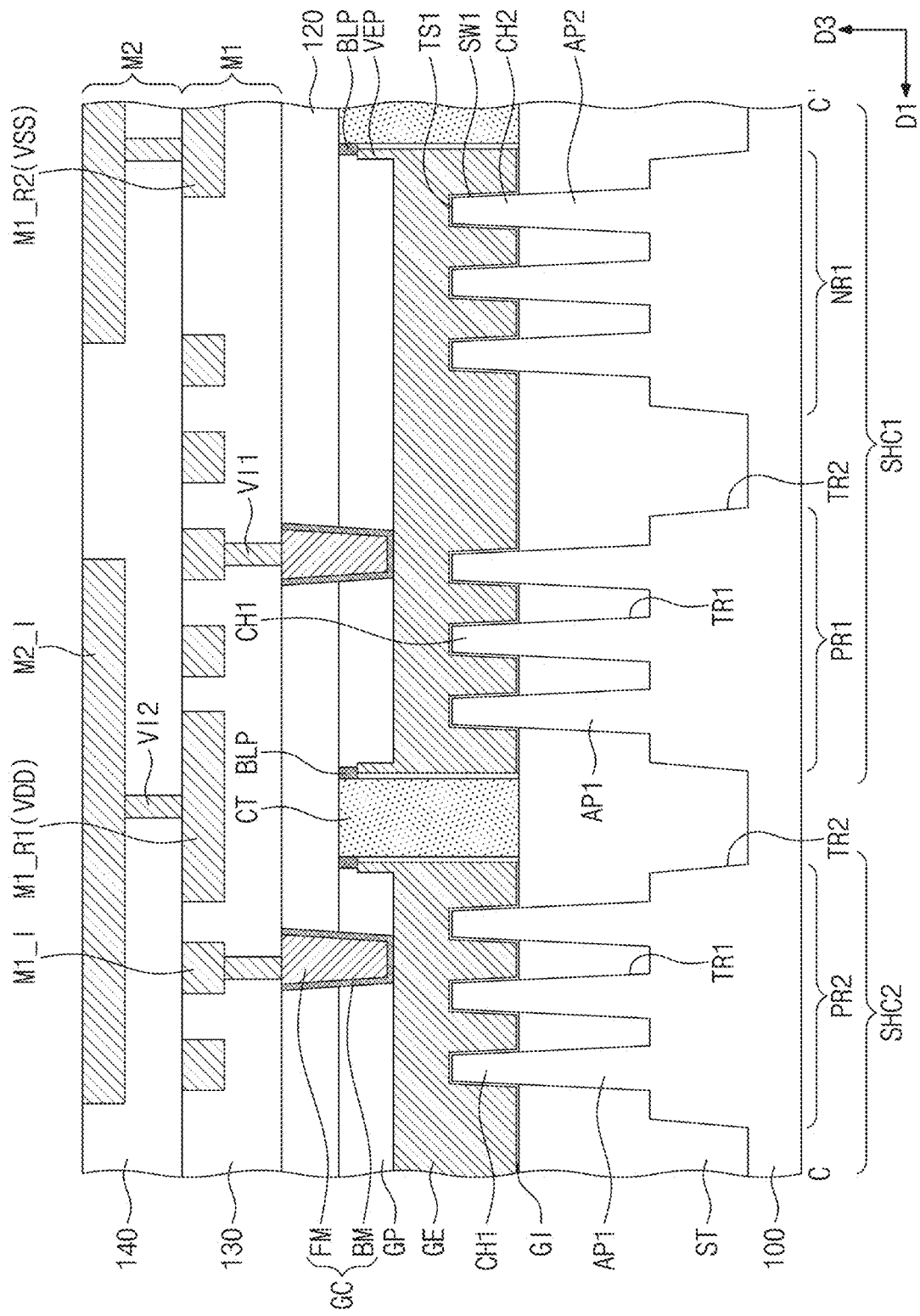

Referring to FIG. 5D, the gate cutting pattern CT may be extended from the device isolation layer ST to a second interlayer insulating layer 120 in a third direction D3. A top surface of the gate cutting pattern CT may be higher than the top surface of the gate electrode GE. The top surface of the gate cutting pattern CT may be substantially coplanar with a top surface of a gate capping pattern GP. The gate cutting pattern CT may be formed of or include at least one of insulating materials (e.g., silicon nitride, silicon oxide, or combinations thereof).

The gate electrode GE on the first single height cell SHC1 may be separated from the gate electrode GE on the second single height cell SHC2 by the gate cutting pattern CT. The gate cutting pattern CT may be interposed between the gate electrodes GE on the first and second single height cells SHC1 and SHC2 which are aligned to each other in the first direction D1. In other words, the gate electrode GE extending in the first direction D1 may be divided into a plurality of the gate electrodes GE by the gate cutting patterns CT.

A pair of gate spacers GS may be disposed on opposite side surfaces of each of the gate electrodes GE. The gate spacers GS may be extended along the gate electrodes GE and in the first direction D1. A top surface of the gate spacer GS may be higher than the top surface of the gate electrode GE adjacent thereto. The top surface of the gate spacer GS may be lower than the top surface of the gate capping pattern GP, which will be described below. The top surface of the gate spacer GS may be lower than the top surface of the gate cutting pattern CT.

The gate spacer GS may be formed of or include at least one of SiCN, SiOCN, or SiN. In an embodiment, referring to FIG. 6, the gate spacer GS may have a multi-layered structure including a first spacer GS1 and a second spacer GS2. The first spacer GS1 and the second spacer GS2 may be formed of or include different materials from each other. For example, the first spacer GS1 may be formed of or include an Si-containing low-k dielectric material (e.g., SiOCN) and the second spacer GS2 may be formed of or include an insulating material (e.g., SiN), which has an excellent etch resistant property and contains silicon. A dielectric constant of the first spacer GS1 may be smaller than a dielectric constant of the second spacer GS2.

Referring back to FIGS. 4 and 5A to 5D, a gate capping pattern GP may be provided on each of the gate electrodes GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiOCN, or SiN.

A gate insulating layer GI may be interposed between the gate electrode GE and the first active pattern AP1 and between the gate electrode GE and the second active pattern AP2. The gate insulating layer GI may be extended along a bottom surface of the gate electrode GE thereon. As an example, the gate insulating layer GI may cover the first top surface TS1 and the first side surface SW1 of the channel pattern CH1 or CH2. The gate insulating layer GI may cover a top surface of the device isolation layer ST below the gate electrode GE (e.g., see FIG. 5D).

In an embodiment, the gate insulating layer GI may be formed of or include a high-k dielectric material whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the disclosure is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from 0.5 to 10 nm, but the disclosure is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring to FIG. 6, the gate electrode GE may include a first metal pattern MEP1 and a second metal pattern MEP2 on the first metal pattern. The first metal pattern MEP1 may be provided on the gate insulating layer GI. For example, the gate insulating layer GI may be interposed between the first metal pattern MEP1 and the first channel pattern CH1.

The first metal pattern MEP1 may be formed of or include at least one of metal nitrides having relatively high work functions. In other words, the first metal pattern MEP1 may include a p-type work function metal. For example, the first metal pattern MEP1 may be formed of or include at least one of titanium nitride (TiN), tantalum nitride (TaN), titanium oxynitride (TiON), titanium silicon nitride (TiSiN), titanium aluminum nitride (TiAlN), tungsten carbon nitride (WCN), or molybdenum nitride (MoN).

The second metal pattern MEP2 may be provided on the first metal pattern MEP1. The second metal pattern MEP2 may be formed of or include at least one of metal carbides having relatively low work functions. In other words, the second metal pattern MEP2 may include an n-type work function metal. The second metal pattern MEP2 may be formed of or include at least one of metal carbides which are doped with silicon and/or aluminum or contains silicon and/or aluminum. As an example, the second metal pattern MEP2 may be formed of or include at least one of aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC). As another example, the second metal pattern MEP2 may be formed of or include at least one of titanium carbide doped with aluminum and silicon (TiAlSiC) or tantalum carbide doped with aluminum and silicon (TaAlSiC). As other example, the second metal pattern MEP2 may be formed of or include aluminum-doped titanium (TiAl).

By adjusting a doping concentration of dopants (e.g., silicon or aluminum) in the second metal pattern MEP2, it may be possible to control a work function of the second metal pattern MEP2. In an embodiment, the concentration of the dopants (e.g., silicon or aluminum) in the second metal pattern MEP2 may range from 0.1 at % to 25 at %.

According to an embodiment of the disclosure, the first and second metal patterns MEP1 and MEP2 may be adjacent to the first channel pattern CH1. The first and second metal patterns MEP1 and MEP2 may serve as a work function metal adjusting a threshold voltage of a transistor. In other words, by adjusting a thickness and composition of each of the first and second metal patterns MEP1 and MEP2, it may be possible to realize a transistor having a desired threshold voltage.

Although not shown, the gate electrode GE on the second channel pattern CH2 may also include the first and second metal patterns MEP1 and MEP2. However, each of the first and second metal patterns MEP1 and MEP2 of the gate electrode GE on the second channel pattern CH2 may be different from a corresponding one of the first and second metal patterns MEP1 and MEP2 of the gate electrode GE on the first channel pattern CH1 described above, in terms of their thickness and composition.

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with the top surfaces of the gate capping patterns GP and the top surfaces of the gate spacers GS. The top surface of the first interlayer insulating layer 110 may be substantially coplanar with the top surfaces of the gate cutting patterns CT.

A second interlayer insulating layer 120 may be provided on the first interlayer insulating layer 110 to cover the gate capping patterns GP and the gate cutting patterns CT. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

A pair of division structures DB may be provided at both sides of each of the first and second single height cells SHC1 and SHC2 to be opposite to each other in the second direction D2. For example, the pair of the division structures DB may be provided on the first and second borders BD1 and BD2, respectively, of the first single height cell SHC1. The isolation structure DB may be extended in the first direction D1 and parallel to the gate electrodes GE. A pitch between the division structure DB and the gate electrode GE adjacent thereto may be equal to the first pitch.

The division structure DB may penetrate the first and second interlayer insulating layers 110 and 120 and may be extended into the first and second active patterns AP1 and AP2. The division structure DB may penetrate an upper portion of each of the first and second active patterns AP1 and AP2. The division structure DB may electrically separate an active region of each of the first and second single height cells SHC1 and SHC2 from an active region of a neighboring cell.

Active contacts AC may be provided to penetrate the first and second interlayer insulating layers 110 and 120 and may be electrically connected to the first and second source/drain patterns SD1 and SD2, respectively. Each of the active contacts AC may be provided between a pair of the gate electrodes GE. When viewed in a plan view, each of the active contacts AC may be a bar- or line-shaped pattern extending in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

Silicide patterns SC may be respectively interposed between the active contacts AC and the first and second source/drain patterns SD1 and SD2. The active contacts AC may be electrically connected to the first and second source/drain patterns SD1 and SD2, respectively, through the silicide patterns SC. The silicide pattern SC may be formed of or include at least one of metal silicide materials (e.g., titanium silicide, tantalum silicide, tungsten silicide, nickel silicide, or cobalt silicide).

Referring back to FIG. 5C, at least one of the active contacts AC on the first single height cell SHC1 may be used to electrically connect the first source/drain pattern SD1 of the first PMOSFET region PR1 to the second source/drain pattern SD2 of the first NMOSFET region NR1. The active contact AC may be extended from the second source/drain pattern SD2 of the first NMOSFET region NR1 to the first source/drain pattern SD1 of the first PMOSFET region PR1 in the first direction D1. The active contact AC may include a first body portion BP1 on the first source/drain pattern SD1 and a second body portion BP2 on the second source/drain pattern SD2. The first body portion BP1 may be connected to the top surface of the first source/drain pattern SD1 through the silicide pattern SC, and the second body portion BP2 may be connected to the top surface of the second source/drain pattern SD2 through the silicide pattern SC. A first active contact AC1 may further include a protruding portion PRP, which is interposed between the first body portion BP1 and the second body portion BP2. The protruding portion PRP may be provided on the device isolation layer ST between the first PMOSFET and NMOSFET regions PR1 and NR1.

The protruding portion PRP may be extended from the first body portion BP1 toward the device isolation layer ST along a slanted side surface of the first source/drain pattern SD1. The protruding portion PRP may be extended from the second body portion BP2 toward the device isolation layer ST along a slanted side surface of the second source/drain pattern SD2. The protruding portion PRP may have a bottom surface that is lower than a bottom surface of each of the first and second body portions BP1 and BP2. The bottom surface of the protruding portion PRP may be located at a level higher than the device isolation layer ST. In other words, the protruding portion PRP may be spaced apart from the device isolation layer ST with the first interlayer insulating layer 110 interposed therebetween.

In an embodiment, the active contact AC may be connected to the top surface of the first source/drain pattern SD1 through the first body portion BP1 and may also be connected to the slanted side surface of the first source/drain pattern SD1 through the protruding portion PRP. In other words, the protruding portion PRP may increase a contact area between the active contact AC and the first source/drain pattern SD1. Thus, a resistance between the active contact AC and the first source/drain pattern SD1 may be reduced. Similar, the protruding portion PRP may reduce a resistance between the active contact AC and the second source/drain pattern SD2. As a result, it may be possible to improve an operation property (e.g., an operation speed) of the semiconductor device according to an embodiment of the disclosure.

Gate contacts GC, which are electrically and respectively connected to the gate electrodes GE, may be provided to penetrate the second interlayer insulating layer 120 and the gate capping pattern GP. When viewed in a plan view, the gate contacts GC on the first single height cell SHC1 may be disposed to be overlapped with the first PMOSFET region PR1. In other words, the gate contacts GC on the first single height cell SHC1 may be provided on the first active pattern AP1 (e.g., see FIG. 5A).

The gate contact GC may be freely disposed on the gate electrode GE, without any limitation in its position. For example, the gate contacts GC on the second single height cell SHC2 may be respectively disposed on the second PMOSFET region PR2, the second NMOSFET region NR2, and the device isolation layer ST filling the second trench TR2.

In an embodiment, referring to FIGS. 5A and 5C, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, or cobalt). The barrier pattern BM may cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A blocking pattern BLP may be interposed between the gate contact GC and the gate spacer GS. The blocking pattern BLP may be in direct contact with a lower side surface of the gate contact GC. The blocking pattern BLP may prevent the gate contact GC from being extended into a region beyond the gate spacer GS (e.g., toward the active contact AC and/or the source/drain pattern SD1 or SD2 adjacent to the gate spacer GS). The blocking pattern BLP may be formed of or include a material having an etch selectivity with respect to the gate spacer GS. For example, the blocking pattern BLP may be formed of or include at least one of polysilicon, silicon oxide, or combinations thereof.

A first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and M1_I of the first metal layer M1 may be extended in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be arranged at a second pitch in the first direction D1. The second pitch may be smaller than the first pitch. A line width of each of the first interconnection lines M1_I may be smaller than a line width of each of the first to third power lines M1_R1, M1_R2, and M1_R3.

The first metal layer M1 may further include first vias VI1. The first vias VI1 may be respectively provided below the interconnection lines M1_R1, M1_R2, M1_R3, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern extending in the first direction D1. In other words, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from that of the second metal layer M2. For example, the interconnection lines of the first and second metal layers M1 and M2 may be formed of or include at least one of metallic materials (e.g., aluminum, copper, tungsten, molybdenum, or cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

Figure 5E:
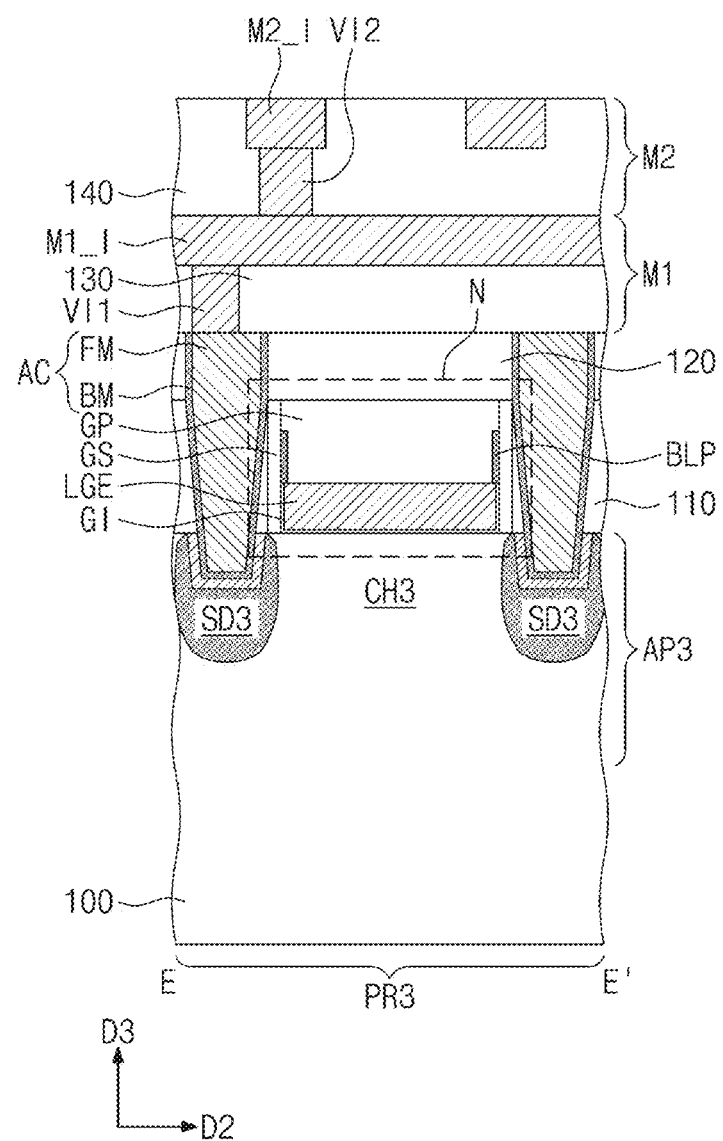

First, the transistor on the second region RG2 will be described in more detail with reference to FIGS. 4 and 5E. For example, the second region RG2 may include a third PMOSFET region PR3 and a fourth PMOSFET region PR4. A third active pattern AP3 may be provided on each of the third and fourth PMOSFET regions PR3 and PR4.

Third source/drain patterns SD3 may be provided on the third active pattern AP3. The third source/drain patterns SD3 may be impurity regions of a first conductivity type (e.g., p-type). A third channel pattern CH3 may be interposed between a pair of the third source/drain patterns SD3. A width of the third channel pattern CH3 in the second direction D2 may be larger than the width of each of the first and second channel patterns CH1 and CH2 described above.

A long gate electrode LGE may be provided to cross the third active pattern AP3 and to extend in the first direction D1. A width of the long gate electrode LGE in the second direction D2 may be larger than the width of the gate electrode GE on the first region RG1 described above. The gate insulating layer GI may be interposed between the long gate electrode LGE and the third active pattern AP3.

Referring to FIG. 7, the long gate electrode LGE may include the first metal pattern MEP1, the second metal pattern MEP2 on the first metal pattern MEP1, and a third metal pattern MEP3 on the second metal pattern MEP2. The first and second metal patterns MEP1 and MEP2 of the long gate electrode LGE may be configured to have the same or similar features as the first and second metal patterns MEP1 and MEP2 of the gate electrode GE described above.

The third metal pattern MEP3 may have lower resistance than the first and second metal patterns MEP1 and MEP2. As an example, the third metal pattern MEP3 may be formed of or include at least one of low resistance metals (e.g., aluminum (Al), tungsten (W), titanium Ti, and tantalum (Ta)). In an embodiment, the third metal pattern MEP3 may be omitted.

The blocking pattern BLP may be provided on the long gate electrode LGE. The blocking pattern BLP may be interposed between the gate spacer GS and the gate capping pattern GP.

The active contacts AC may be provided to penetrate the first and second interlayer insulating layers 110 and 120 and may be electrically connected to the third source/drain patterns SD3, respectively. At least one gate contact GC may be provided to penetrate the second interlayer insulating layer 120 and the gate capping pattern GP and to be electrically connected to the long gate electrode LGE. The first metal layer M1 and the second metal layer M2 may be provided on the active contacts AC and the gate contact GC.

The structures of the gate electrode GE, the gate spacer GS, the blocking pattern BLP, and the gate contact GC according to an embodiment of the disclosure will be described in more detail with reference to FIG. 6. The gate spacer GS may include the first spacer GS1 and the second spacer GS2, which are disposed side by side in the second direction D2. The first spacer GS1 may have a third top surface TOS3, and the second spacer GS2 may have a second top surface TOS2. The second top surface TOS2 may be higher than the third top surface TOS3. The third top surface TOS3 may be located at a height that is substantially equal to or lower than the top surface of the gate electrode GE.

A bottom surface BOS2 of the gate contact GC may be in contact with the top surface of the gate electrode GE. The bottom surface BOS2 of the gate contact GC may be located at a height that is substantially equal to or higher than the third top surface TOS3 of the first spacer GS1.

The blocking pattern BLP may be interposed between the gate contact GC and the second spacer GS2. The blocking pattern BLP may include a pair of blocking patterns BLP, which are respectively provided on lower portions of opposite side surfaces of the gate contact GC.

The blocking pattern BLP may be extended from the third top surface TOS3 of the first spacer GS1 in a vertical direction (i.e., the third direction D3). The blocking pattern BLP may be vertically extended from the third top surface TOS3 along an inner side surface ISW1 of the second spacer GS2. A bottom surface BOS1 of the blocking pattern BLP may be in direct contact with the third top surface TOS3. The blocking pattern BLP may have a first top surface TOS1. The first top surface TOS1 may be lower than the second top surface TOS2 of the second spacer GS2. The bottom surface BOS1 of the blocking pattern BLP may be located at a height which is equal to or lower than the bottom surface BOS2 of the gate contact GC.

A thickness T1 of the blocking pattern BLP in the second direction D2 may decrease in the third direction D3. In other words, the thickness of the blocking pattern BLP may decrease in a direction from the first spacer GS1 toward the gate capping pattern GP.

The largest thickness of the blocking pattern BLP may be a first thickness T1. The first thickness T1 may range from 1 nm to 4 nm. The first spacer GS1 may have a second thickness T2 in the second direction D2. The second thickness T2 may be larger than the first thickness T1.

The gate capping pattern GP may be disposed on the gate electrode GE and the gate spacer GS. The gate capping pattern GP may directly cover the first top surface TOS1 of the blocking pattern BLP and the second top surface TOS2 of the second spacer GS2.

The structures of the long gate electrode LGE, the gate spacer GS, and the blocking pattern BLP according to an embodiment of the disclosure will be described in more detail with reference to FIG. 7. The gate spacer GS on the second region RG2 may include the first spacer GS1 and the second spacer GS2, which are disposed side by side in the second direction D2. The first spacer GS1, the second spacer GS2, and the gate capping pattern GP may have top surface that are substantially coplanar with each other.

The blocking pattern BLP may be interposed between an inner side surface ISW2 of the first spacer GS1 and the gate capping pattern GP. In an embodiment, the blocking pattern BLP on the second region RG2 may be formed together when the blocking pattern BLP on the first region RG1 is formed.

The blocking pattern BLP may be vertically extended from the top surface of the long gate electrode LGE (or the top surface of the gate insulating layer GI) along the inner side surface ISW2 of the first spacer GS1. The top surface TOS1 of the blocking pattern BLP may be covered with the gate capping pattern GP.

Figure 8:
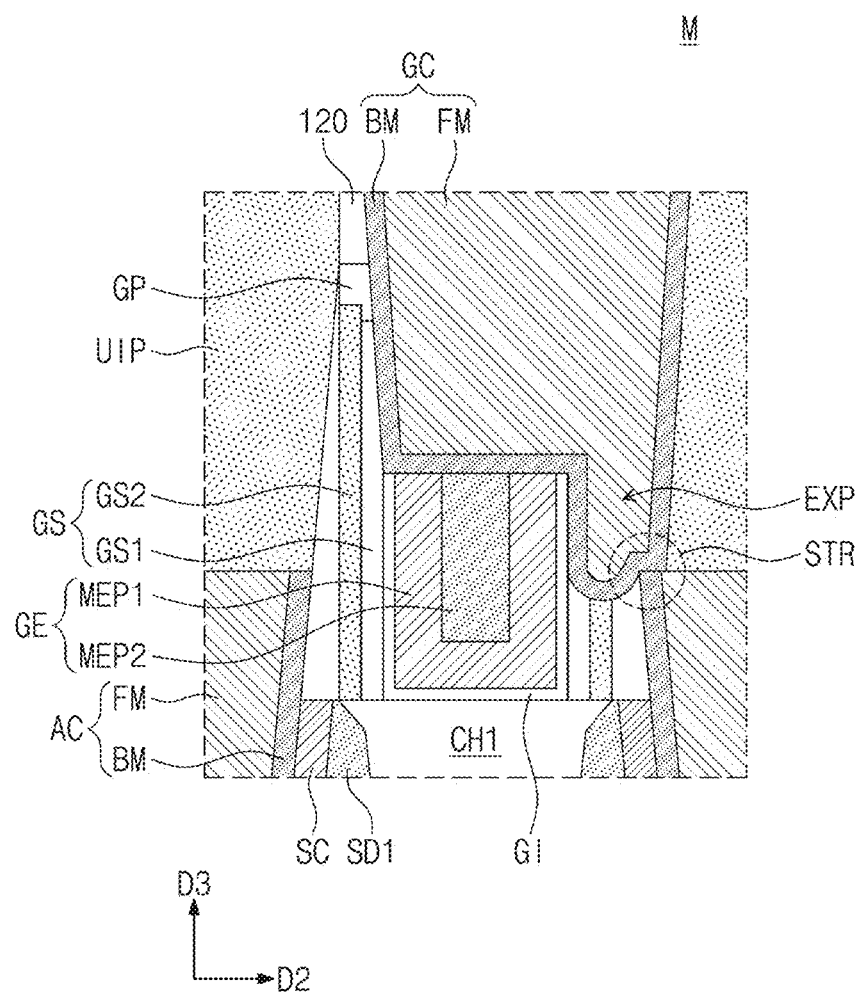
FIG. 8 is an enlarged sectional view of the portion M of FIG. 5A according to a comparative example of the disclosure.

FIG. 8 is an enlarged sectional view of the portion M of FIG. 5A according to a comparative example of the disclosure. Referring to FIG. 8, the blocking pattern BLP may be omitted in the comparative example. In the case where the blocking pattern BLP is omitted, the gate contact GC may be formed to have an expansion portion EXP. In detail, if, during the formation of the gate contact GC, an etching process is performed in an over-etching manner, the gate spacer GS may be recessed, and in this case, the expansion portion EXP may be formed. The expansion portion EXP may be extended along the side surface of the gate electrode GE in a downward direction and may be in contact with the active contact AC or the source/drain pattern SD1 or SD2.

In this case, a short region STR, at which the expansion portion EXP of the gate contact GC is in contact with the active contact AC, may be formed. The short region STR may mean that there is a process defect that seriously degrades the reliability characteristics of the semiconductor device.

By contrast, according to the embodiment of FIG. 6, the blocking pattern BLP may include polysilicon, and thus, in the process of forming the gate contact GC, the blocking pattern BLP may have a better etch resistant property than the first and second spacers GS1 and GS2. Accordingly, the blocking pattern BLP may prevent the expansion portion EXP from being formed in the gate contact GC. In other words, a pair of the blocking patterns BLP may serve as a guiding element of preventing the gate contact GC from being formed in an unintended region and thereby allowing the gate contact GC to be in contact with only the top surface of the gate electrode GE. As a result, the blocking pattern BLP according to an embodiment of the disclosure may prevent a short circuit issue from occurring between the gate contact GC and the active contact AC, and this make it possible to improve the reliability characteristics of the semiconductor device.

Referring back to FIG. 5D, the gate electrode GE may include a vertically-extended portion VEP, which is extended along the side surface of the gate cutting pattern CT in the third direction D3. According to an embodiment of the disclosure, since the gate electrode GE is formed after the formation of the gate cutting pattern CT, the vertically-extended portion VEP, which is vertically extended along the side surface of the gate cutting pattern CT, may be formed during the formation of the gate electrode GE. The vertically-extended portion VEP may be exposed to a region above the gate capping pattern GP, and in this case, the vertically-extended portion VEP may be in contact with the active contact AC adjacent thereto; that is, it may cause a short circuit issue.

Meanwhile, according to an embodiment of the disclosure, the blocking pattern BLP may be provided on the vertically-extended portion VEP of the gate electrode GE. The blocking pattern BLP may cover the top surface of the vertically-extended portion VEP and the upper side surface of the gate cutting pattern CT. Since the blocking pattern BLP is provided on the top surface of the vertically-extended portion VEP, it may be possible to prevent the vertically-extended portion VEP from being exposed. As a result, the blocking pattern BLP may prevent a short circuit from being formed between the vertically-extended portion VEP of the gate electrode GE and the active contact AC adjacent thereto and thereby improve the reliability characteristics of the semiconductor device.

Figure 9A:
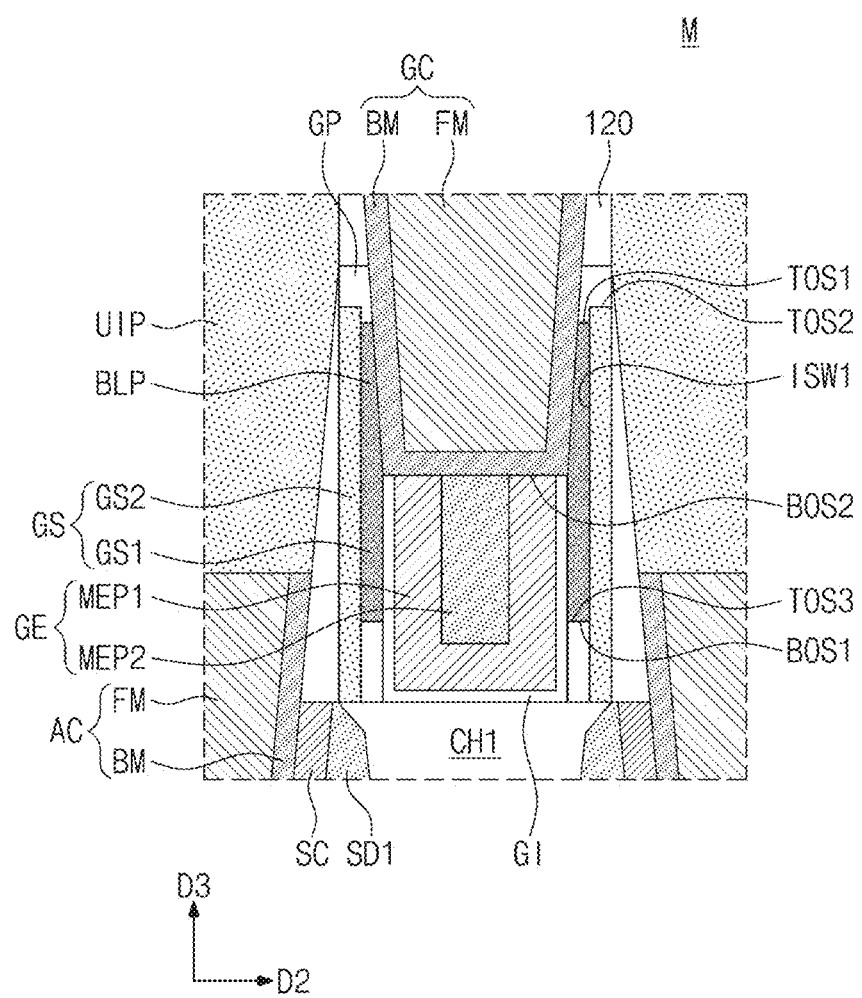
FIGS. 9A and 9B are enlarged sectional views, each of which illustrates the portion M of FIG. 5A according to an embodiment of the disclosure the disclosure.
Figure 9B:
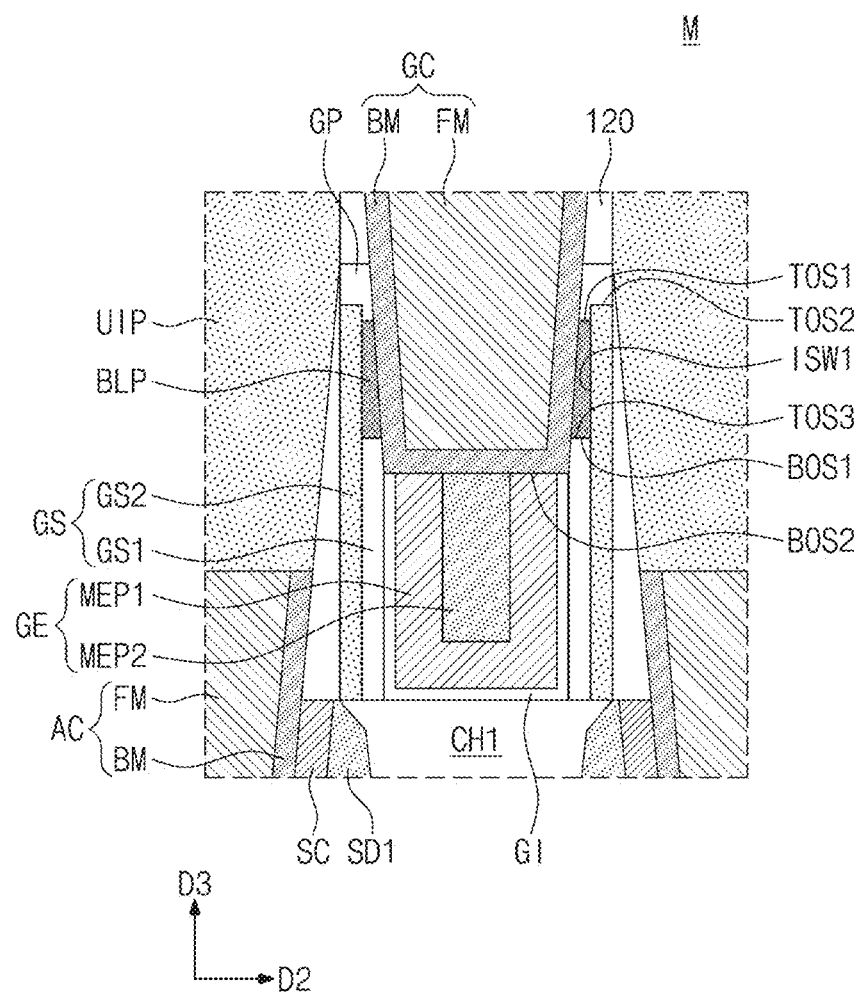
Figure 10:
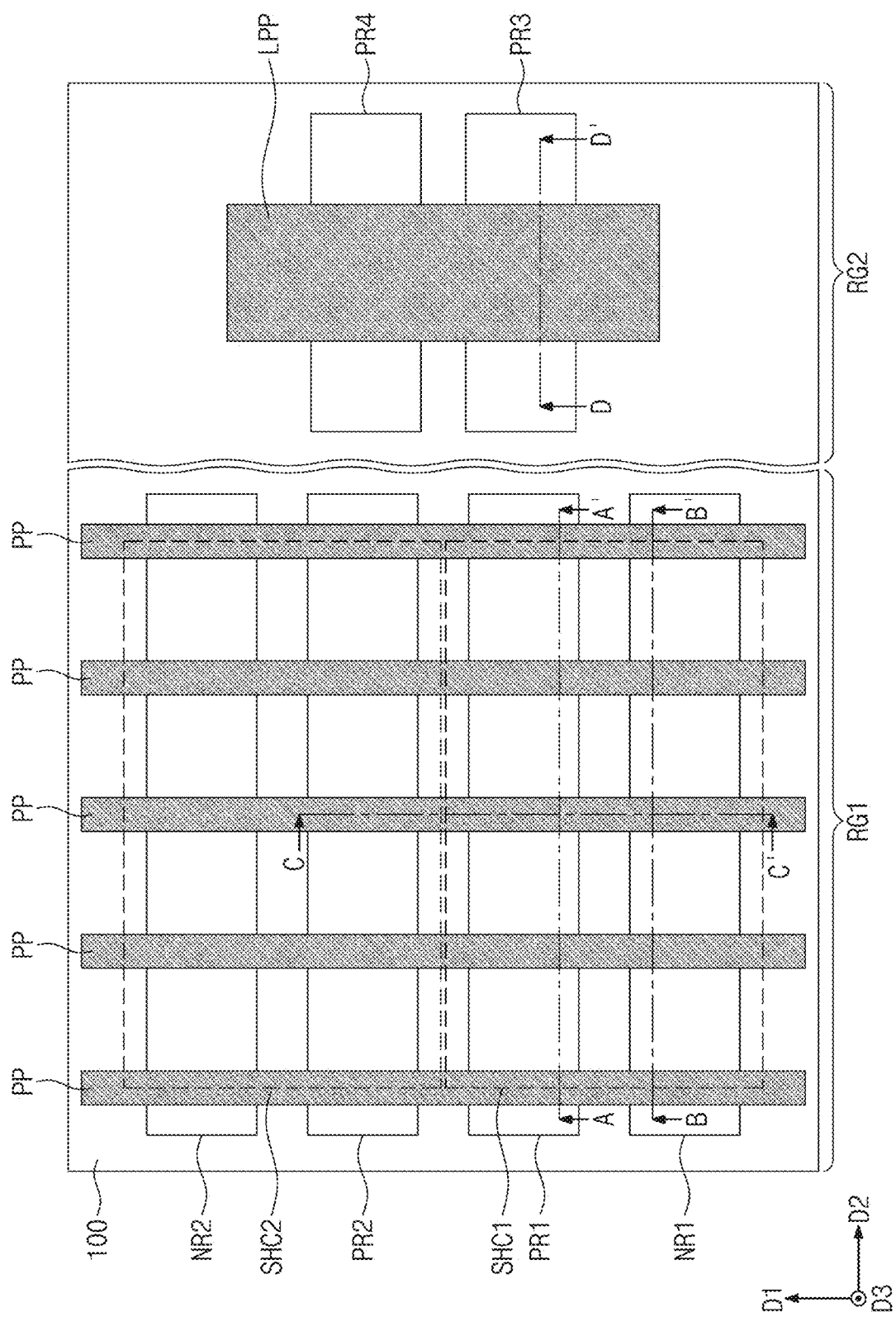
FIGS. 10, 12, 14, and 16 are plan views illustrating a method of fabricating a semiconductor device, according to an embodiment of the disclosure.
Figure 11A:
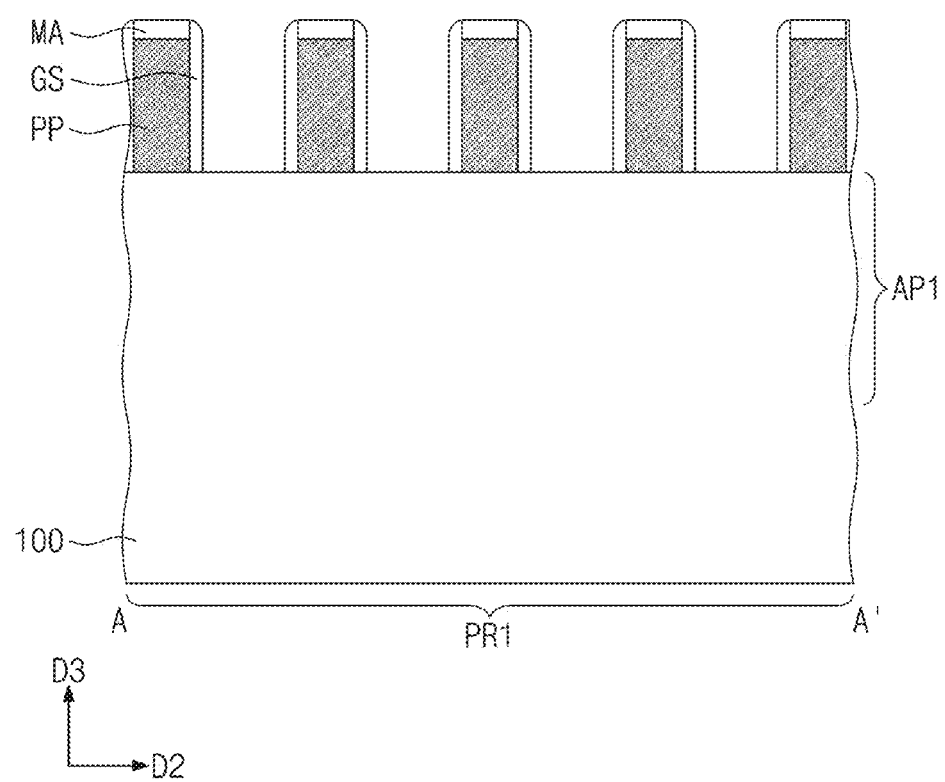
FIGS. 11A, 13A, 15A, and 17A are sectional views taken along lines A-A' of FIGS. 10, 12, 14, and 16, respectively.
Figure 11B:
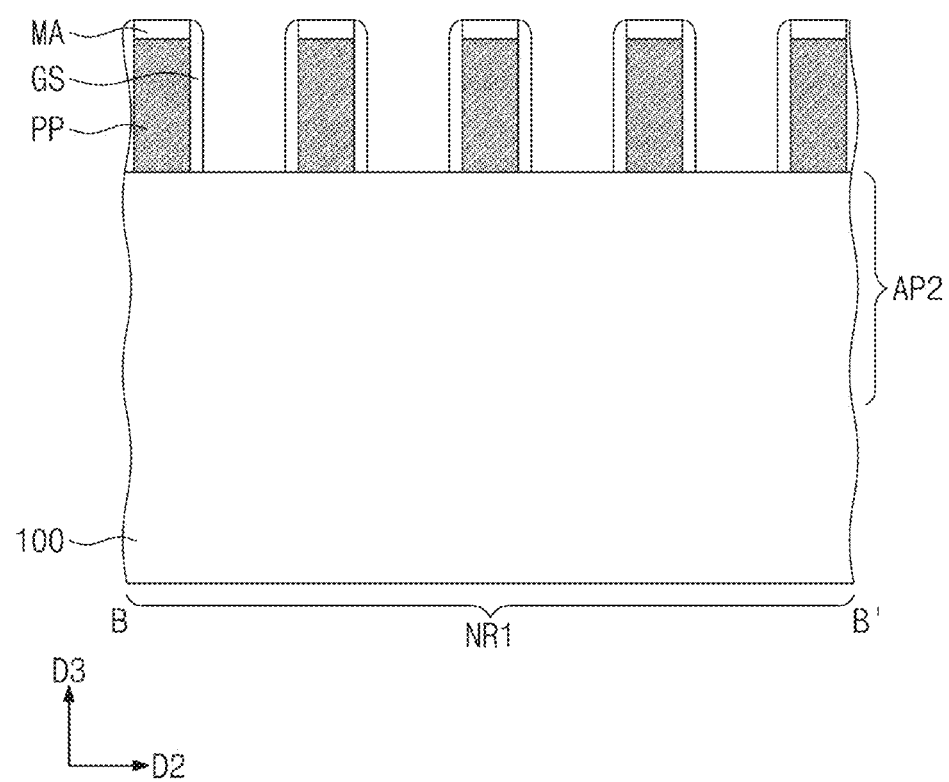
FIGS. 11B, 13B, 15B, and 17B are sectional views taken along lines B-B' of FIGS. 10, 12, 14, and 16, respectively.
Figure 11C:
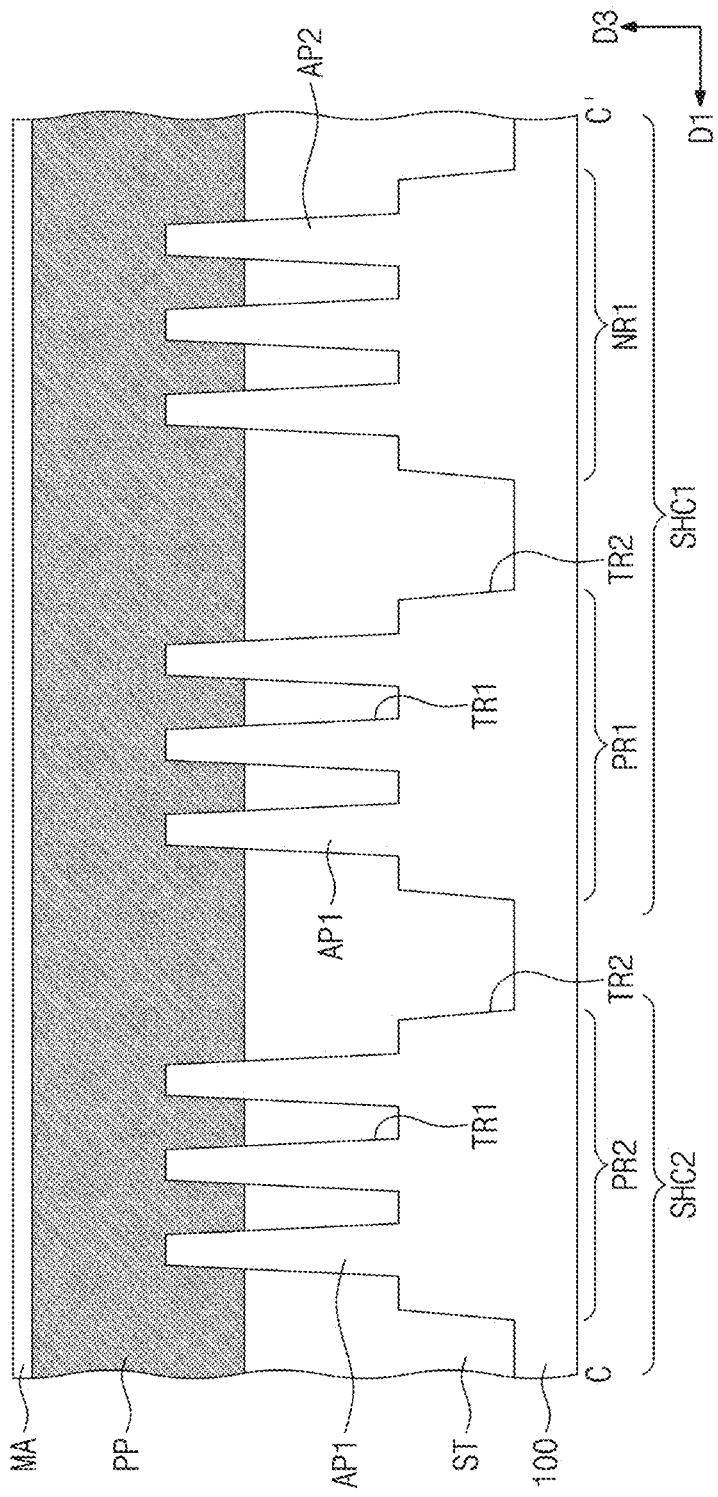
FIGS. 11C, 13C, 15C, and 17C are sectional views taken along lines C-C' of FIGS. 10, 12, 14, and 16, respectively.
Figure 11D:
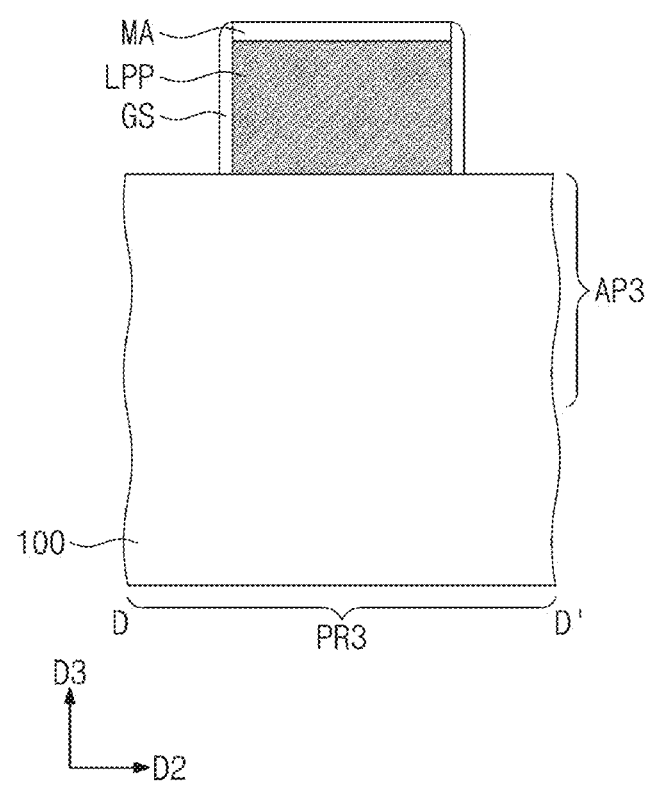
FIGS. 11D, 13D, 15D, and 17D are sectional views taken along lines D-D' of FIGS. 10, 12, 14, and 16, respectively.
Figure 12:
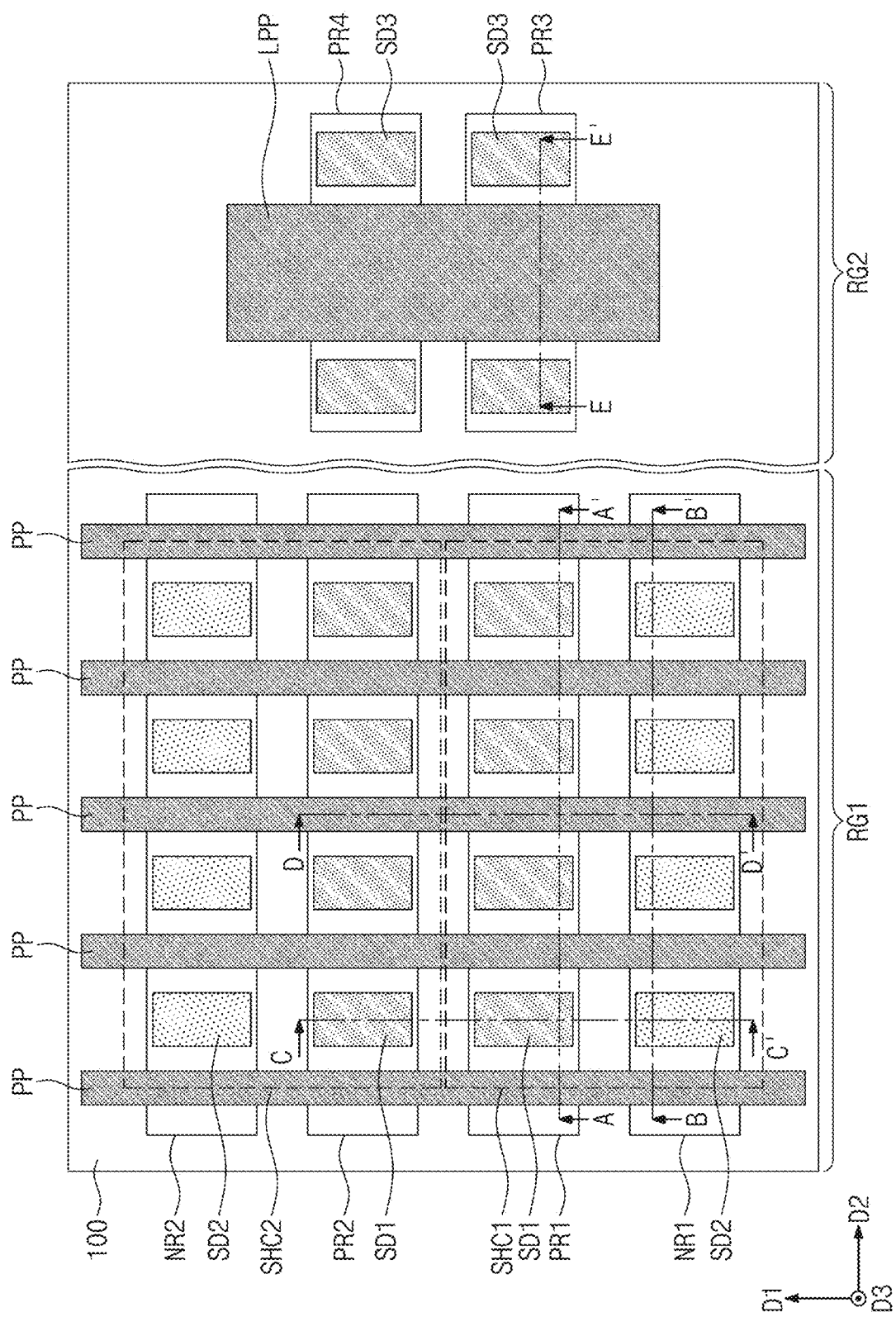

FIGS. 9A and 9B are enlarged sectional views, each of which illustrates the portion M of FIG. 5A according to an embodiment of the disclosure the disclosure. In the following description, an element previously described with reference to FIGS. 4 and 5A to 5E may be identified by the same reference number without repeating an overlapping description thereof.

Referring to FIG. 9A, the bottom surface BOS1 of the blocking pattern BLP may be lower than the bottom surface BOS2 of the gate contact GC. The lowering of the bottom surface BOS1 of the blocking pattern BLP may result in the lowering of the top surface TOS3 of the first spacer GS1. The top surface TOS3 of the first spacer GS1 may be lower than the top surface of the gate electrode GE.

The blocking pattern BLP may be interposed between the gate contact GC and the second spacer GS2 as well as between the gate electrode GE and the second spacer GS2. The blocking pattern BLP may be interposed between the gate electrode GE and the active contact AC.

According to the present embodiment, since the blocking pattern BLP is interposed between the gate electrode GE and the active contact AC, it may be possible to more effectively prevent the gate contact GC from having the expansion portion EXP (e.g., see FIG. 8), which may be in contact with the active contact AC. Thus, it may be possible to further improve the reliability characteristics of the semiconductor device.

Referring to FIG. 9B, the bottom surface BOS1 of the blocking pattern BLP may be higher than the bottom surface BOS2 of the gate contact GC. The bottom surface BOS1 of the blocking pattern BLP may be higher than the top surface of the gate electrode GE. The elevation of the bottom surface BOS1 of the blocking pattern BLP may result in the elevation of the top surface TOS3 of the first spacer GS1. The top surface TOS3 of the first spacer GS1 may be higher than the top surface of the gate electrode GE.

The first spacer GS1 may be positioned between the gate contact GC and the active contact AC. Since the first spacer GS1 including a low-k dielectric material is disposed between the gate contact GC and the active contact AC, it may be possible to reduce a parasitic capacitance between the gate contact GC and the active contact AC. As a result, the electric characteristics of the semiconductor device may be improved.

Figure 13A:
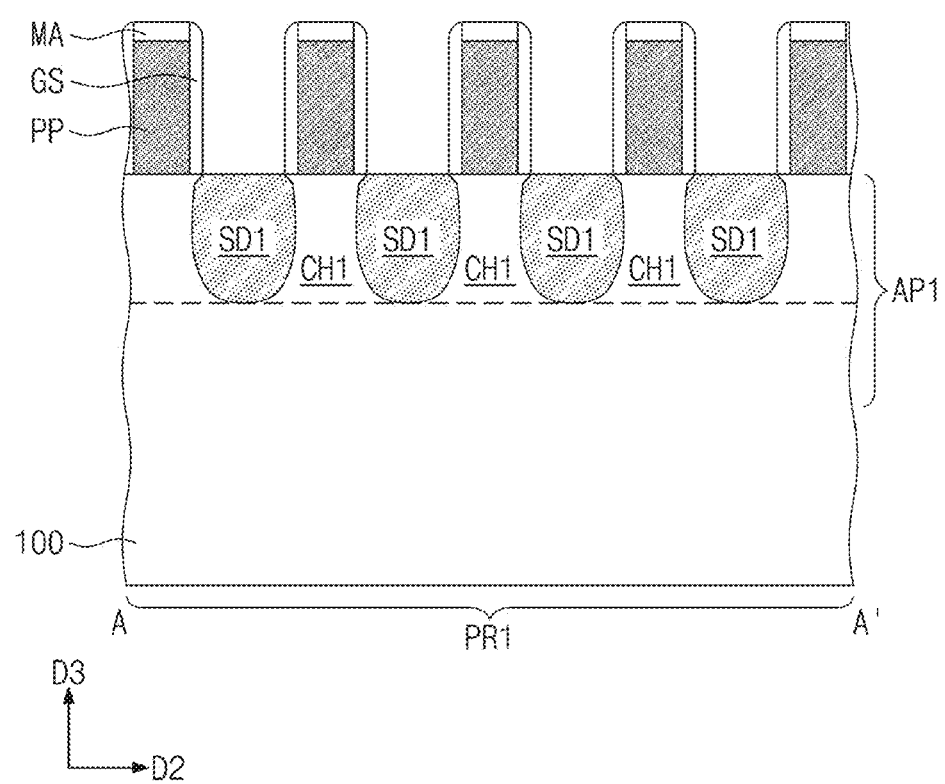
Figure 13B:
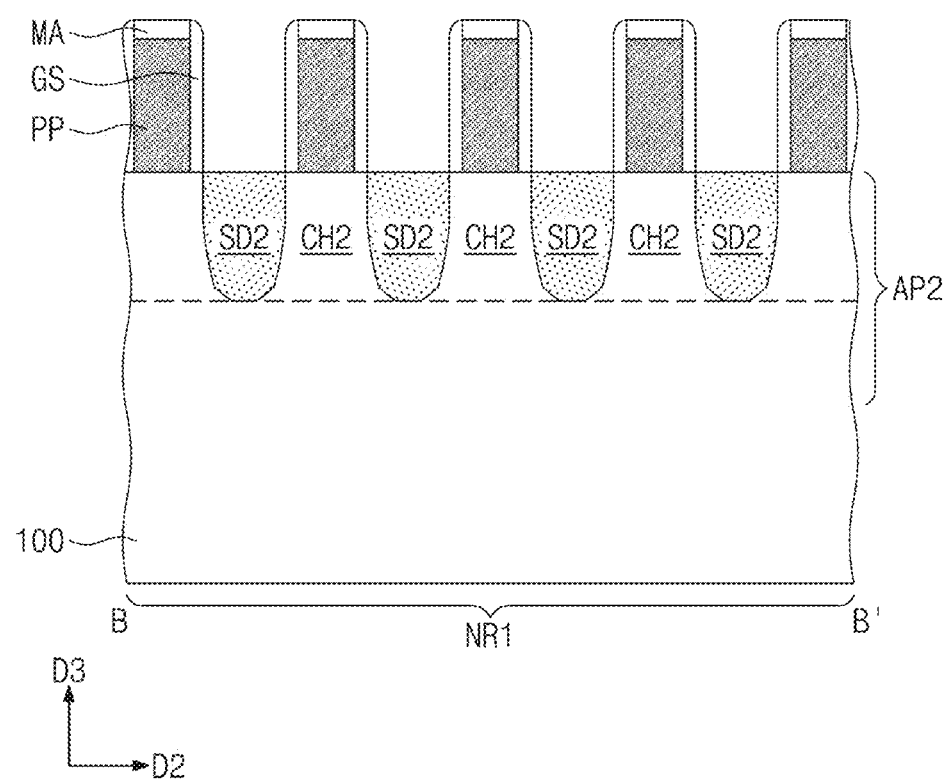
Figure 13C:
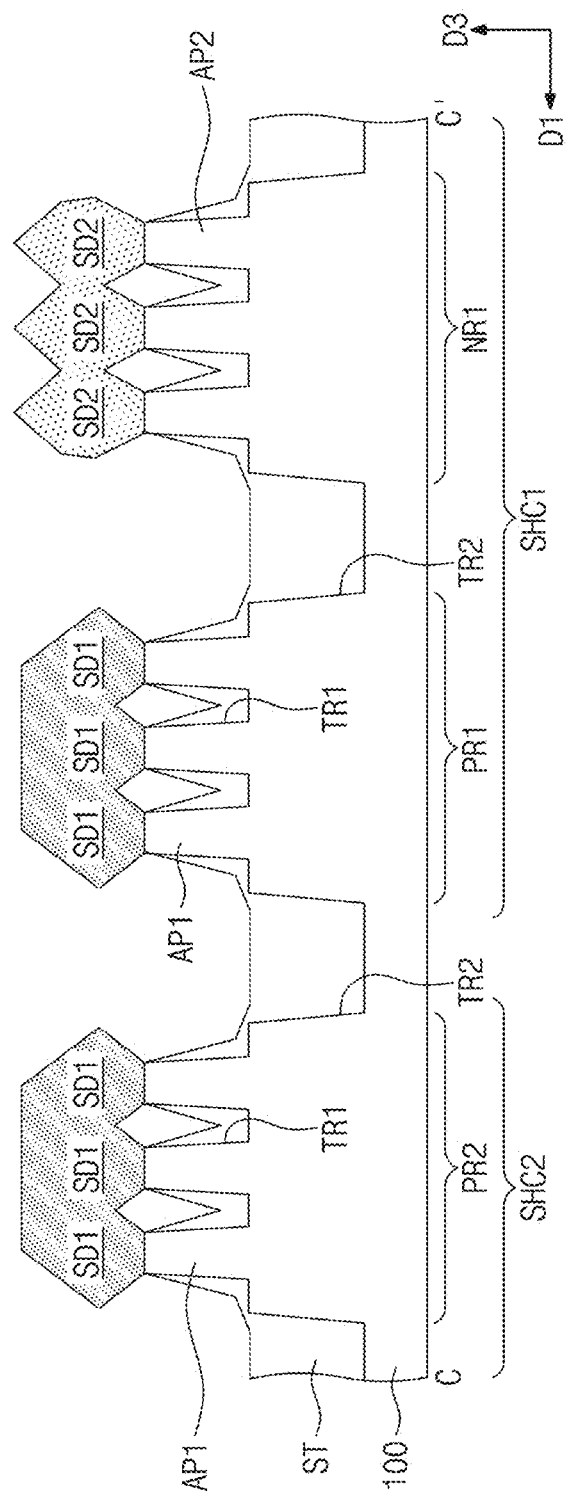
Figure 13D:
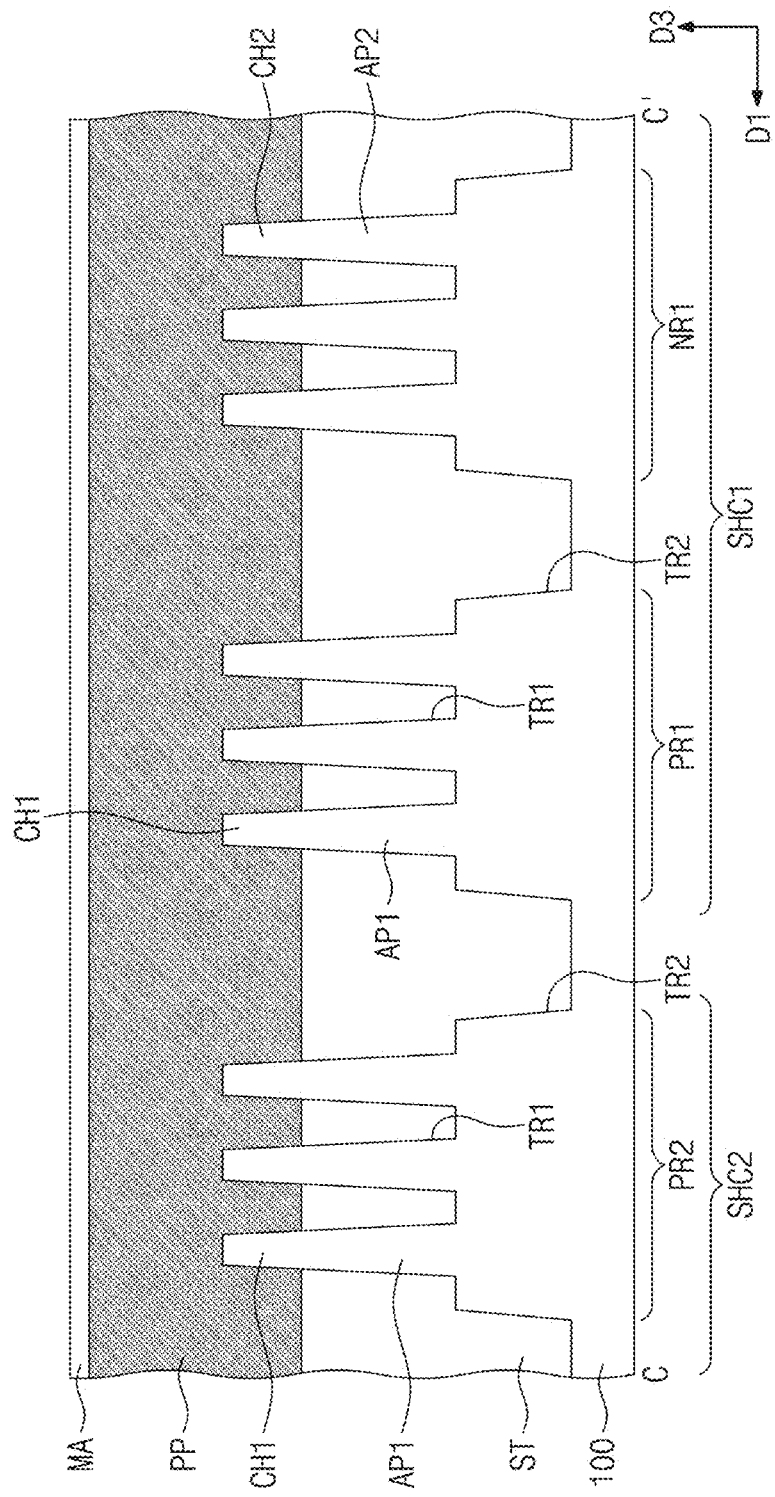
Figure 13E:
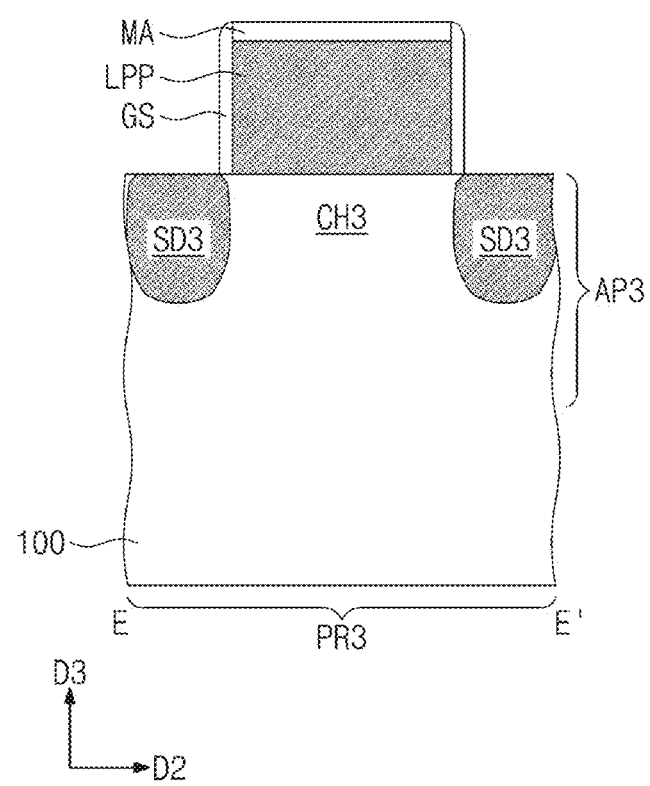
FIGS. 13E, 15E, and 17E are sectional views taken along lines E-E' of FIGS. 12, 14, and 16, respectively.
Figure 14:
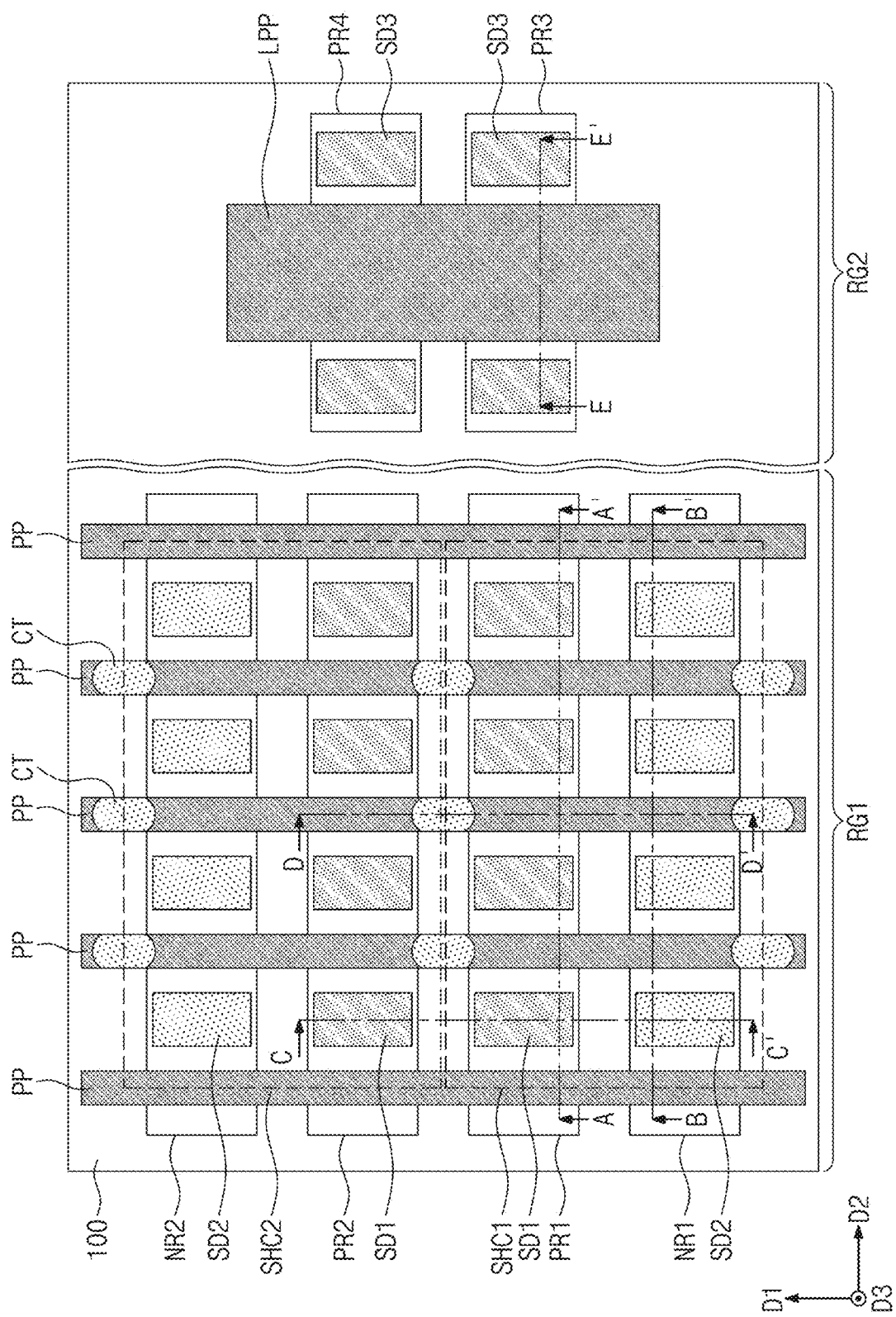
Figure 15A:
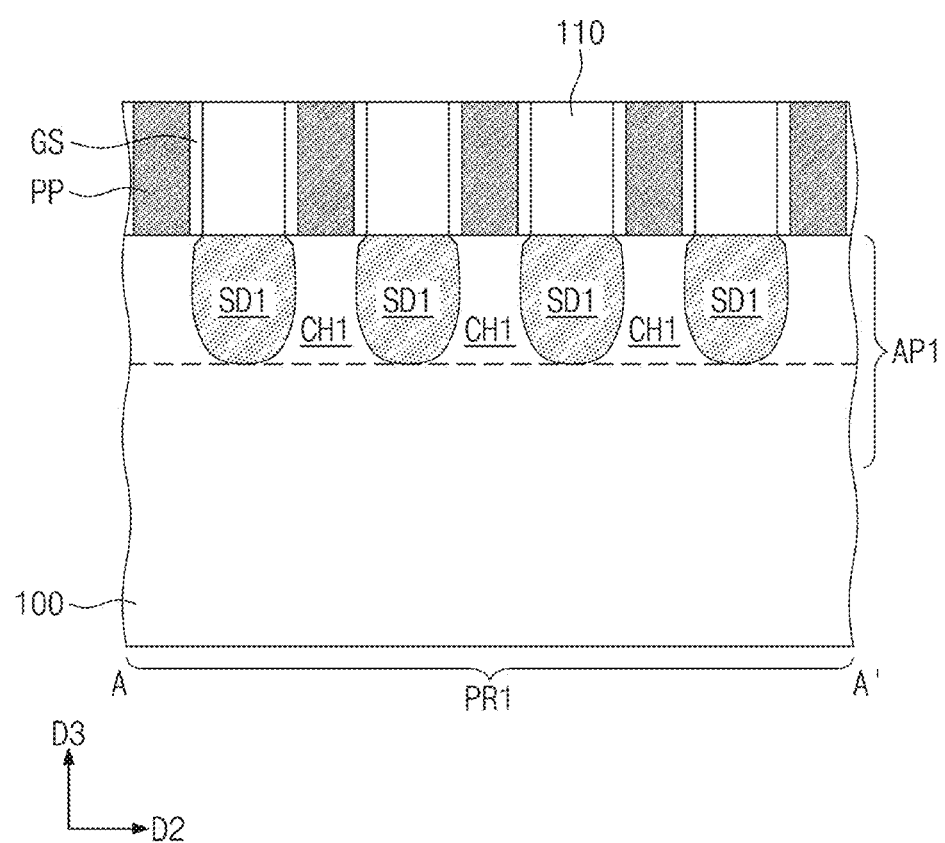
Figure 15B:
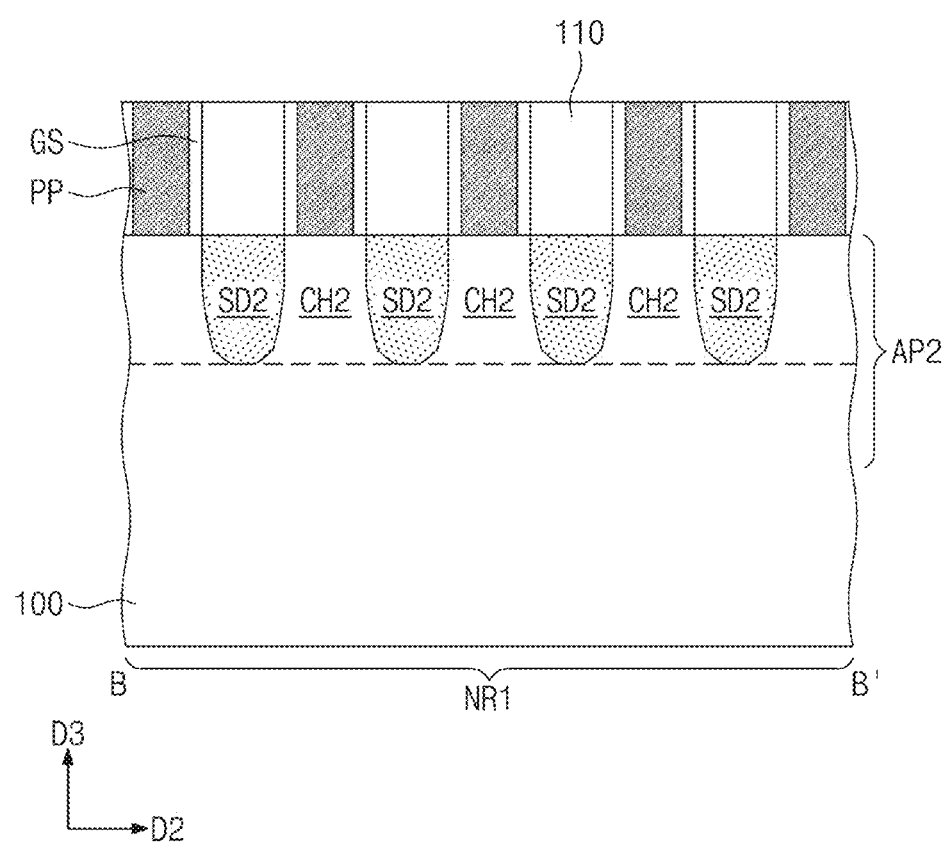
Figure 15C:
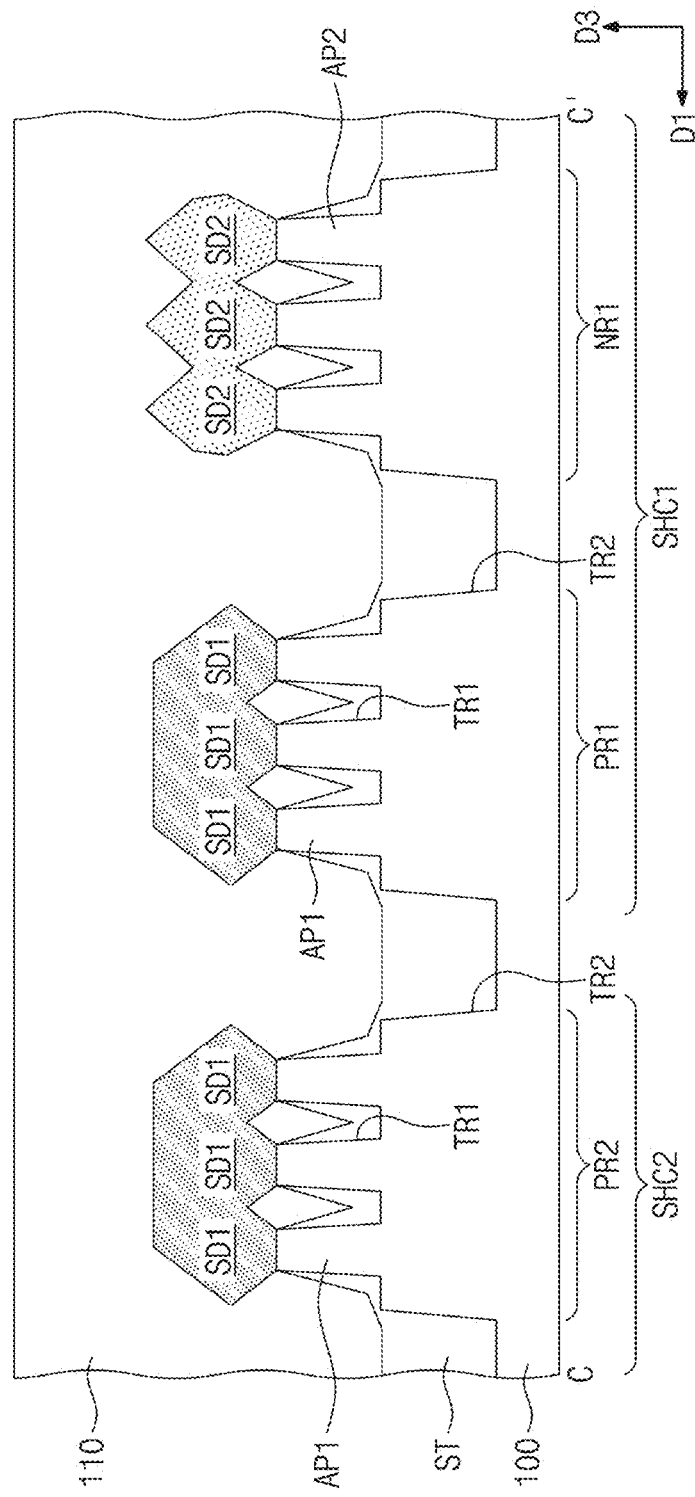
Figure 15D:
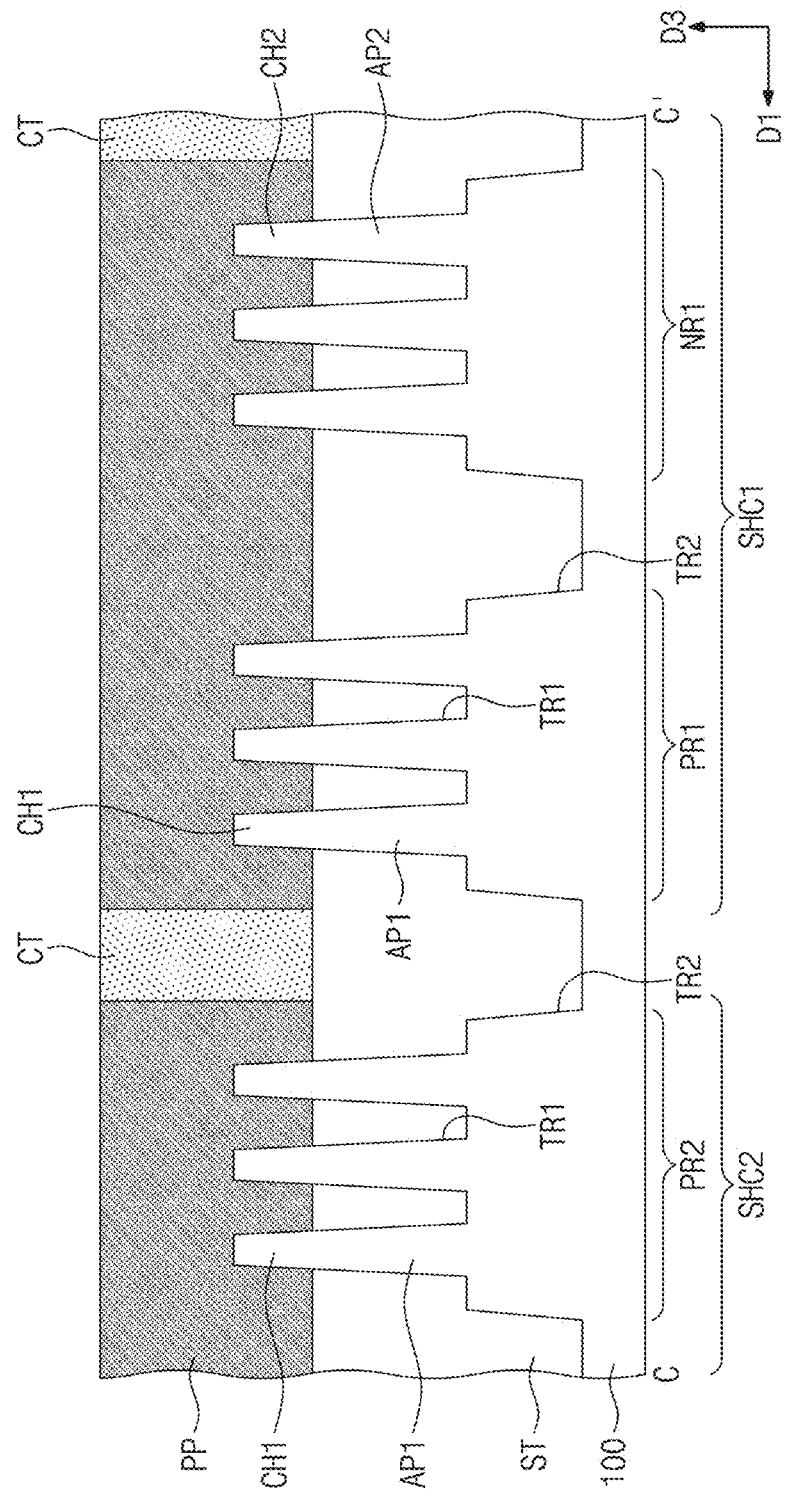
Figure 15E:
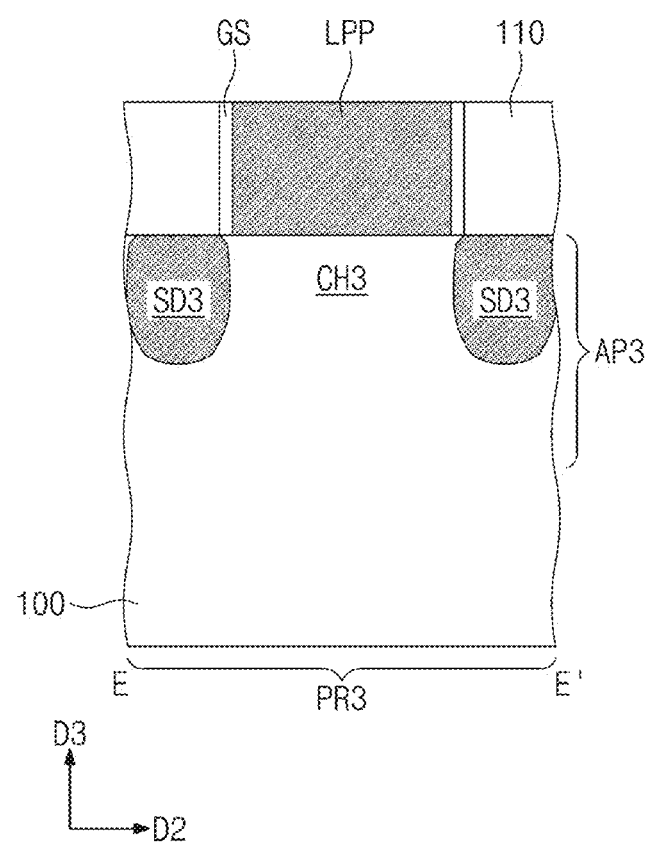
Figure 16:
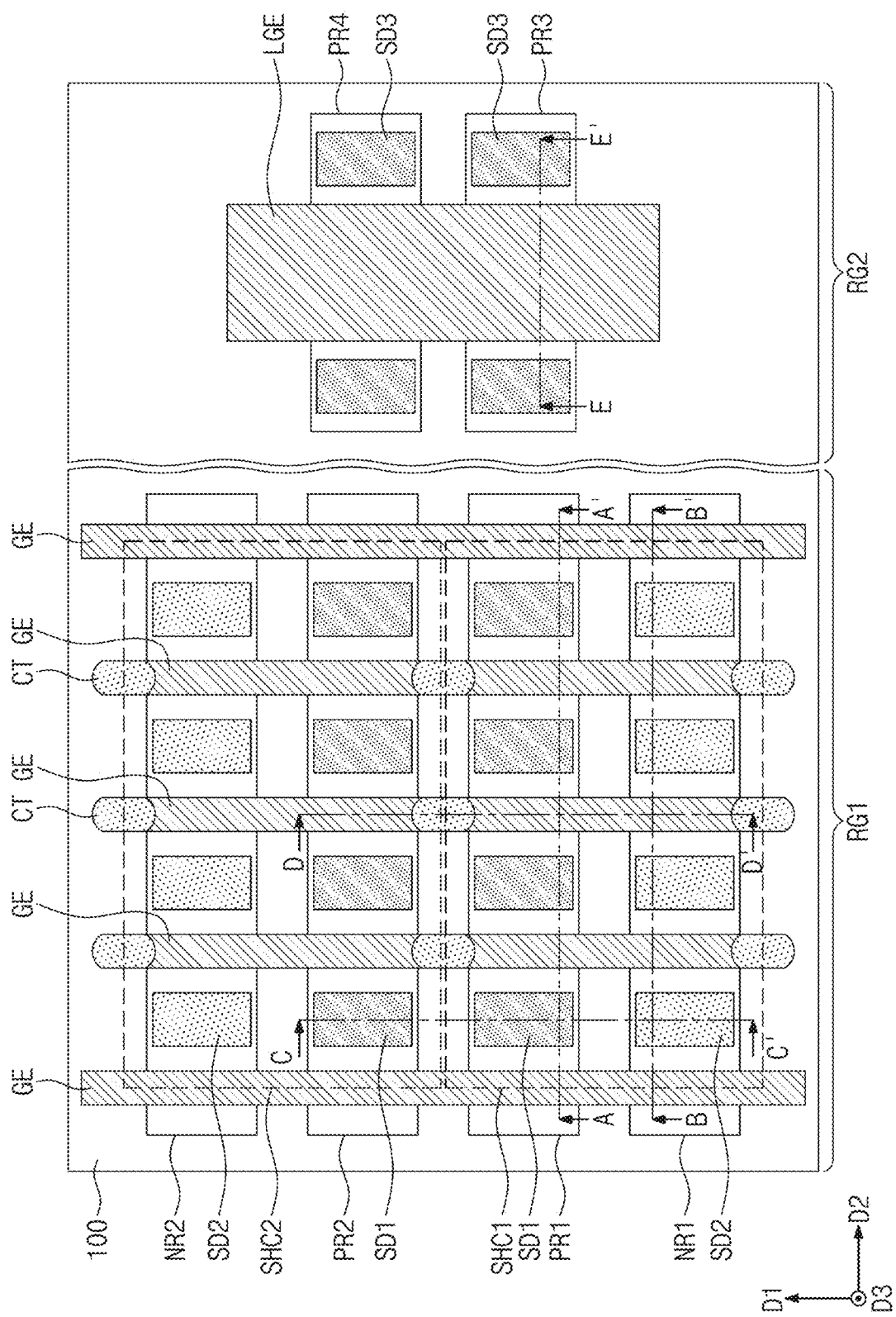

FIGS. 10, 12, 14, and 16 are plan views illustrating a method of fabricating a semiconductor device, according to an embodiment of the disclosure. FIGS. 11A, 13A, 15A, and 17A are sectional views taken along lines A-A' of FIGS. 10, 12, 14, and 16, respectively. FIGS. 11B, 13B, 15B, and 17B are sectional views taken along lines B-B' of FIGS. 10, 12, 14, and 16, respectively. FIGS. 11C, 13C, 15C, and 17C are sectional views taken along lines C-C' of FIGS. 10, 12, 14, and 16, respectively. FIGS. 11D, 13D, 15D, and 17D are sectional views taken along lines D-D' of FIGS. 10, 12, 14, and 16, respectively. FIGS. 13E, 15E, and 17E are sectional views taken along lines E-E' of FIGS. 12, 14, and 16, respectively.

Referring to FIGS. 10 and 11A to FIG. 11D, the substrate 100 including the first region RG1 and the second region RG2 may be provided. The first region RG1 may include the first PMOSFET region PR1, the second PMOSFET region PR2, the first NMOSFET region NR1, and the second NMOSFET region NR2. The first NMOSFET region NR1 and the first PMOSFET region PR1 may define the first single height cell SHC1, and the second NMOSFET region NR2 and the second PMOSFET region PR2 may define the second single height cell SHC2. The second region RG2 may include the third PMOSFET region PR3 and the fourth PMOSFET region PR4.

The substrate 100 may be patterned to form the first to third active patterns AP1, AP2, and AP3. The first active patterns AP1 may be formed on each of the first and second PMOSFET regions PR1 and PR2. The second active patterns AP2 may be formed on each of the first and second NMOSFET regions NR1 and NR2. The third active patterns AP3 may be formed on each of the third and fourth PMOSFET regions PR3 and PR4.

The device isolation layer ST may be formed on the substrate 100. The device isolation layer ST may be formed of or include at least one of insulating materials (e.g., silicon oxide). The device isolation layer ST may be recessed until an upper portion of each of the first to third active patterns AP1, AP2, and AP3 is exposed. Accordingly, the upper portion of each of the first to third active patterns AP1, AP2, and AP3 may protrude above the device isolation layer ST (i.e., in the upward direction).

Sacrificial patterns PP may be formed to cross the first and second active patterns AP1 and AP2. A long sacrificial pattern LPP may be formed to cross the third active pattern AP3. Each of the sacrificial patterns PP and the long sacrificial pattern LPP may be formed to have a line or bar shape extending in the first direction D1.

In detail, the formation of the sacrificial patterns PP and the long sacrificial pattern LPP may include forming a first sacrificial layer on the substrate 100, forming mask patterns MA on the first sacrificial layer, and patterning the first sacrificial layer using the mask patterns MA as an etch mask. The first sacrificial layer may be formed of or include polysilicon.

In an embodiment, the patterning process to form the sacrificial patterns PP may include a lithography process using an extreme ultraviolet (EUV) light. In the present specification, the EUV light may have a wavelength ranging from 4 nm and 124 nm and, in particular, from 4 nm and 20 nm and may be, for example, an ultraviolet light having a wavelength of 13.5 nm. The EUV light may have an energy of 6.21 eV to 124 eV, and, in particular, from 90 eV to 95 eV.

The lithography process using the EUV light may include performing an exposing process of irradiating the EUV light onto a photoresist layer and performing a developing process. As an example, the photoresist layer may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a honeycomb shape, or a circular shape, but the disclosure is not limited to these examples.

The hard mask patterns MP may be formed by patterning at least one layer, which is disposed therebelow, using the photoresist patterns as an etch mask. Thereafter, desired patterns (i.e., the sacrificial patterns PP) may be formed on a wafer by patterning a target layer (i.e., the sacrificial layer) using the hard mask patterns MP as an etch mask.

In a comparative example of the disclosure, a multi-patterning technology (MPT) using two or more photomasks is required to form fine-pitch patterns on the wafer. By contrast, in the case where the EUV lithography process according to an embodiment of the disclosure is performed, the sacrificial patterns PP may be formed to have a fine pitch, using just one photomask.

For example, the minimum pitch between the sacrificial patterns PP, which are realized by the EUV lithography process according to the present embodiment, may be less than or equal to 45 nm. In other words, the EUV lithography process may be performed to precisely and finely form the sacrificial patterns PP, without a multi-patterning technology.

In an embodiment, the EUV lithography process may be used in the patterning process for forming not only the sacrificial patterns PP but also the first and second active patterns AP1 and AP2 described above, but the disclosure is not limited to this example.

A pair of the gate spacers GS may be formed on opposite side surfaces of each of the sacrificial patterns PP and the long sacrificial pattern LPP. The formation of the gate spacers GS may include conformally forming a gate spacer layer on the substrate 100 and anisotropically etching the gate spacer layer. The gate spacer layer may be formed of or include at least one of SiCN, SiOCN, or SiN.

The gate spacer GS may have a multi-layered structure including the first spacer GS1 and the second spacer GS2, as previously described with reference to FIGS. 6 and 7. The first spacer GS1 may be formed of a low-k dielectric material (e.g., SiOCN). The second spacer GS2 may be formed of silicon nitride (SiN) having a high etch resistant property. The first spacer GS1 may be formed to be thicker than the second spacer GS2.

Referring to FIGS. 12 and 13A to 13E, the first source/drain patterns SD1 may be formed on or in upper portions of each of the first active patterns AP1. A pair of the first source/drain patterns SD1 may be formed at both sides of each of the sacrificial patterns PP.

In detail, first recesses may be formed by etching the upper portion of the first active pattern AP1 using the hard mask patterns MP and the gate spacers GS as an etch mask. During the etching of the upper portion of the first active pattern AP1, the device isolation layer ST between the first active patterns AP1 may be recessed, as shown in FIG. 13C.

The first source/drain pattern SD1 may be formed by performing a selective epitaxial growth process using an inner surface of the first recess of the first active pattern AP1 as a seed layer. As a result of the formation of the first source/drain patterns SD1, the first channel pattern CH1 may be defined between each pair of the first source/drain patterns SD1. As an example, the selective epitaxial growth process may include a chemical vapor deposition (CVD) process or a molecular beam epitaxy (MBE) process. The first source/drain patterns SD1 may include a semiconductor material (e.g., SiGe) having a lattice constant greater than that of the substrate 100. Each of the first source/drain patterns SD1 may be a multi-layered structure including a plurality of semiconductor layers.

In an embodiment, the first source/drain patterns SD1 may be doped in an in-situ manner during a selective epitaxial growth process. In another embodiment, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed in an upper portion of the second active pattern AP2. A pair of the second source/drain patterns SD2 may be formed at both sides of each of the sacrificial patterns PP.

In detail, second recesses may be formed by etching an upper portion of the second active pattern AP2 using the hard mask patterns MP and the gate spacers GS as an etch mask. The second source/drain pattern SD2 may be formed by performing a selective epitaxial growth process using an inner surface of the second recess of the second active pattern AP2 as a seed layer. As a result of the formation of the second source/drain patterns SD2, the second channel pattern CH2 may be defined between each pair of the second source/drain patterns SD2. As an example, the second source/drain patterns SD2 may be formed of or include the same semiconductor material (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. In other words, the first source/drain patterns SD1 and the second source/drain patterns SD2 may not be formed at the same time.

The third source/drain patterns SD3 may be formed in an upper portion of the third active pattern AP3. A pair of the third source/drain patterns SD3 may be respectively formed at both sides of the long sacrificial pattern LPP. For example, the third source/drain patterns SD3 may be formed together with the first source/drain patterns SD1, when the first source/drain patterns SD1 described above are formed.

Referring to FIGS. 14 and 15A to 15E, the first interlayer insulating layer 110 may be formed to cover the first and second source/drain patterns SD1 and SD2, the hard mask patterns MP, and the gate spacers GS. In an embodiment, the first interlayer insulating layer 110 may be formed of or include silicon oxide.

The first interlayer insulating layer 110 may be planarized to expose the top surfaces of the sacrificial patterns PP and the long sacrificial pattern LPP. The planarization of the first interlayered insulating layer 110 may be performed using an etch-back or chemical mechanical polishing (CMP) process. In an embodiment, the hard mask patterns MP may be fully removed during the planarization process. Accordingly, the first interlayer insulating layer 110 may have a top surface that is coplanar with the top surfaces of the sacrificial patterns PP, the top surface of the long sacrificial pattern LPP, and the top surfaces of the gate spacers GS.

The gate cutting patterns CT may be formed on a border of each of the first and second single height cells SHC1 and SHC2 parallel to the second direction D2. In detail, a photolithography process may be performed to form a mask layer with openings, and here, the openings may be used to define positions and shapes of the gate cutting patterns CT. The sacrificial pattern PP exposed by the openings may be selectively removed using an etching process. The gate cutting pattern CT may be formed by filling a region, which is formed by removing the sacrificial pattern PP, with an insulating material. In an embodiment, the sacrificial patterns PP covered with the mask layer may not be removed by the etching process. Thereafter, the mask layer may be selectively removed.

Referring to FIGS. 16 and 17A to 17E, the remaining portions of the sacrificial patterns PP may be replaced with the gate electrodes GE. The long sacrificial pattern LPP may be replaced with the long gate electrode LGE. In detail, the exposed sacrificial pattern PP may be selectively removed. As a result of the removal of the sacrificial pattern PP, an empty space may be formed. The gate insulating layer GI and the gate electrode GE may be formed in the empty space. The long gate electrode LGE may be formed in the same manner as the gate electrode GE.

Figure 17A:
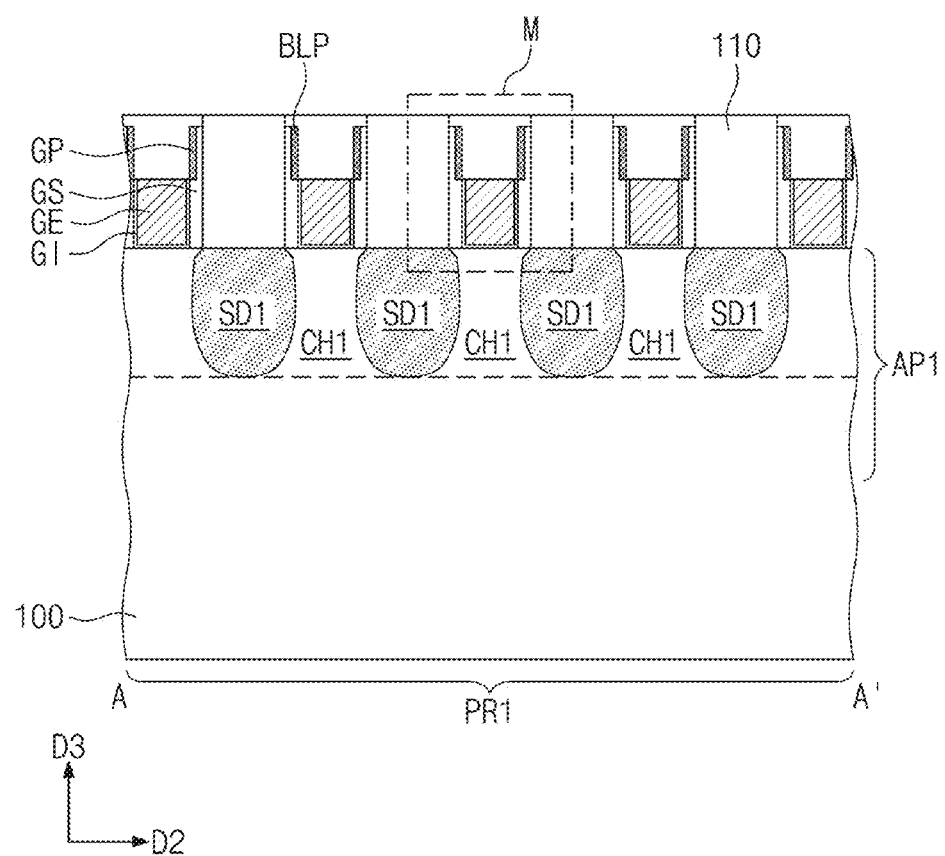
Figure 17B:
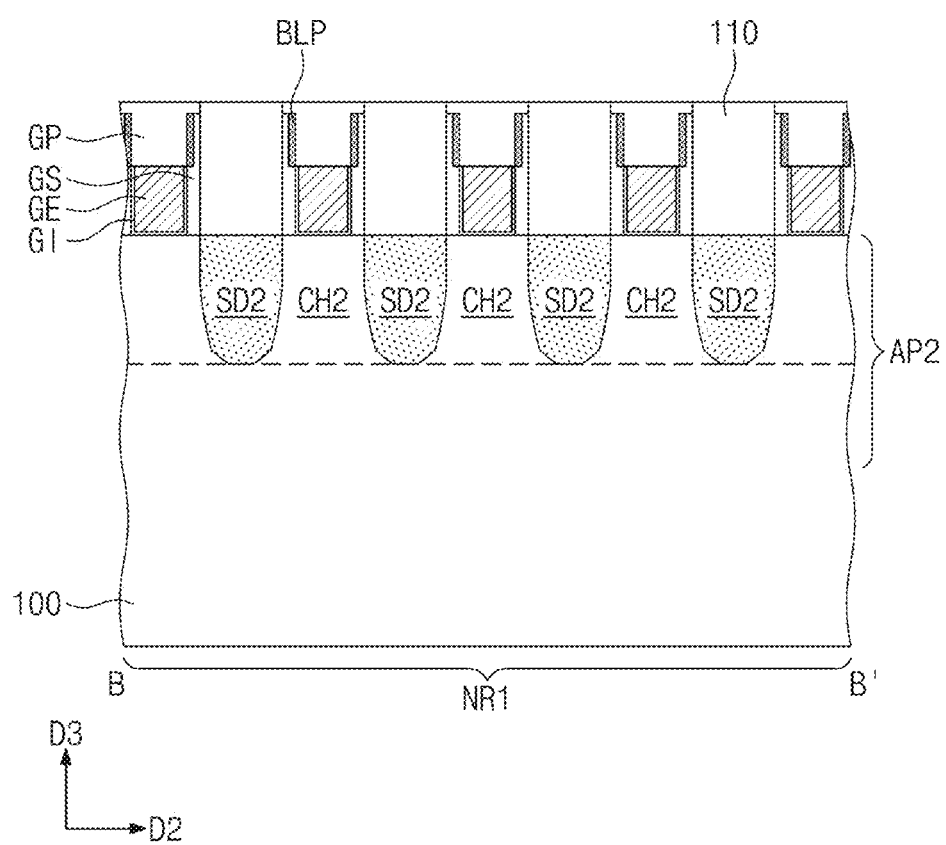
Figure 17C:
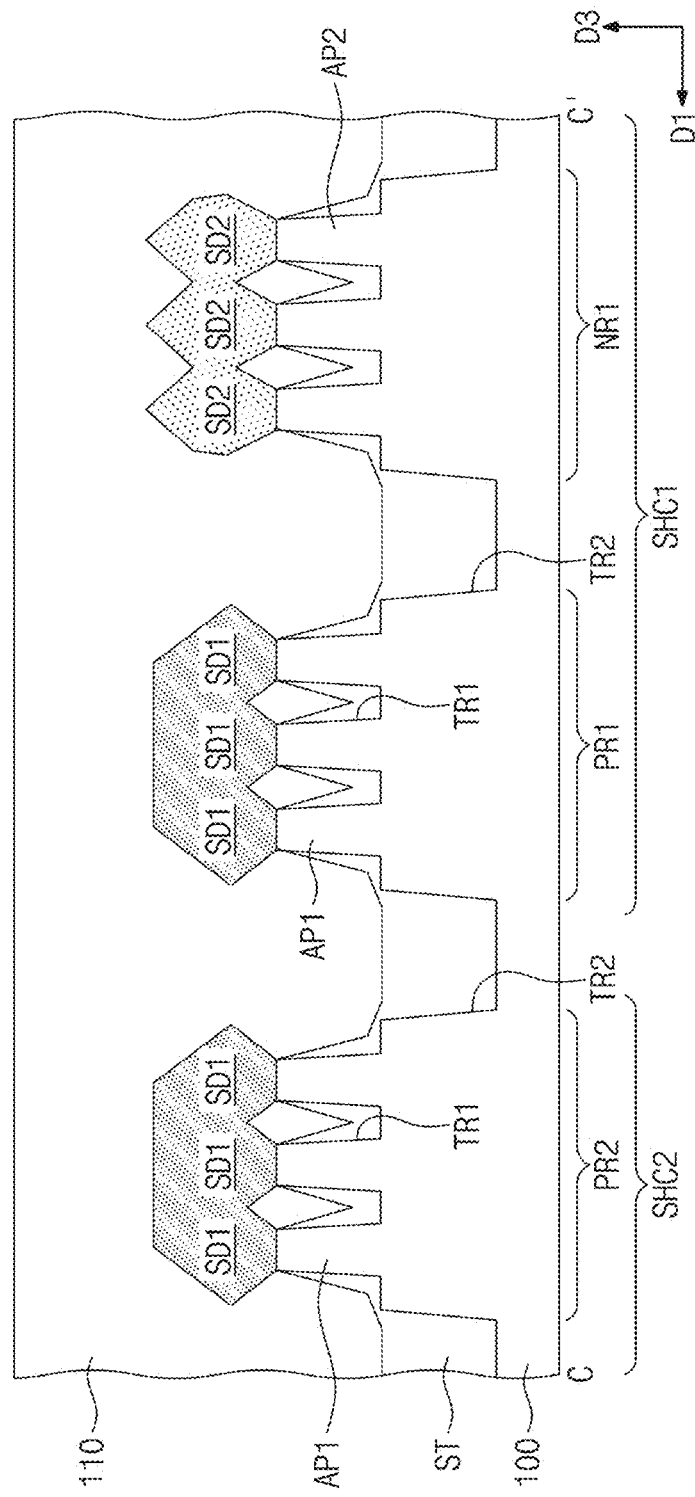
Figure 17D:
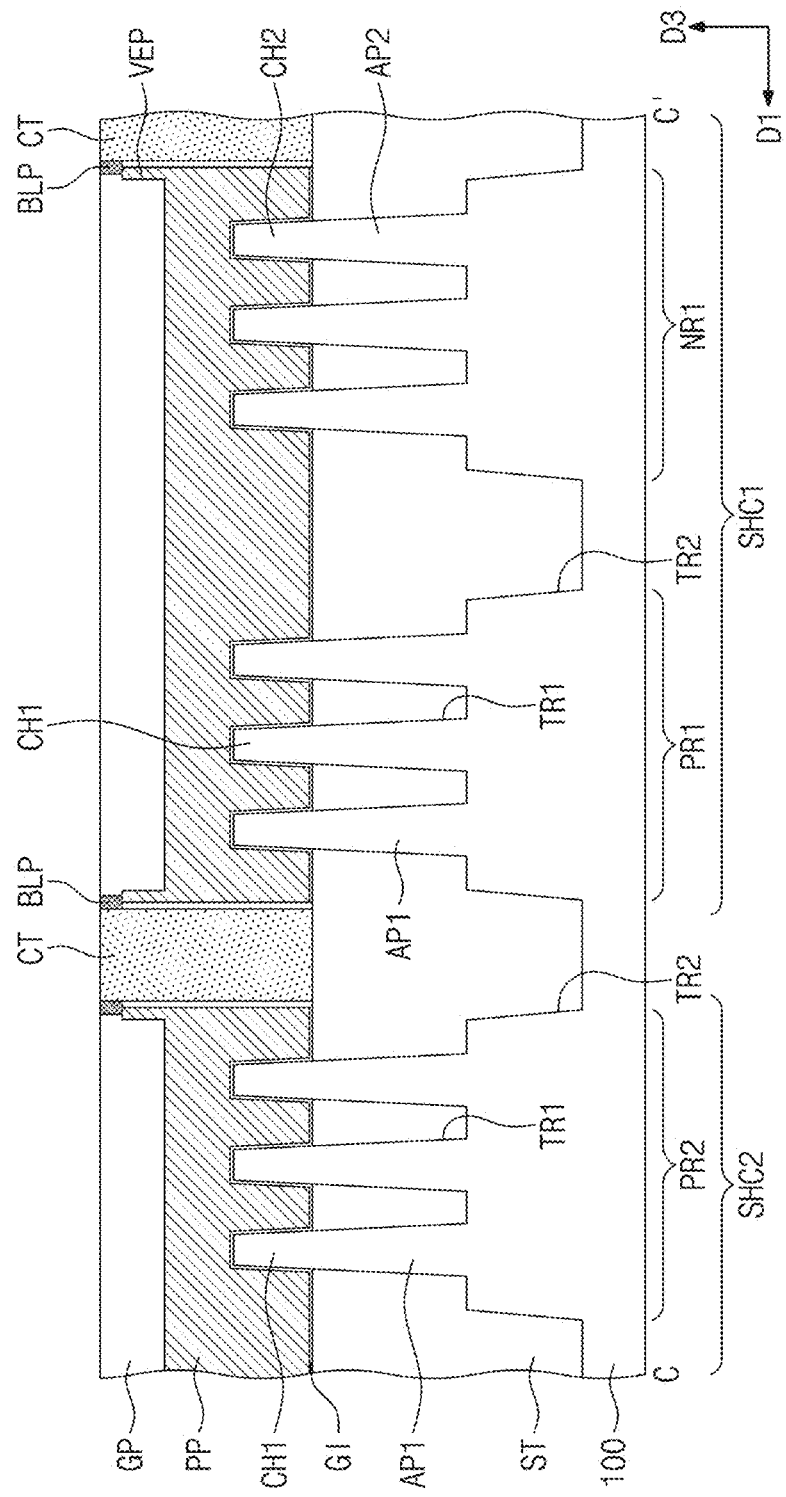
Figure 17E:
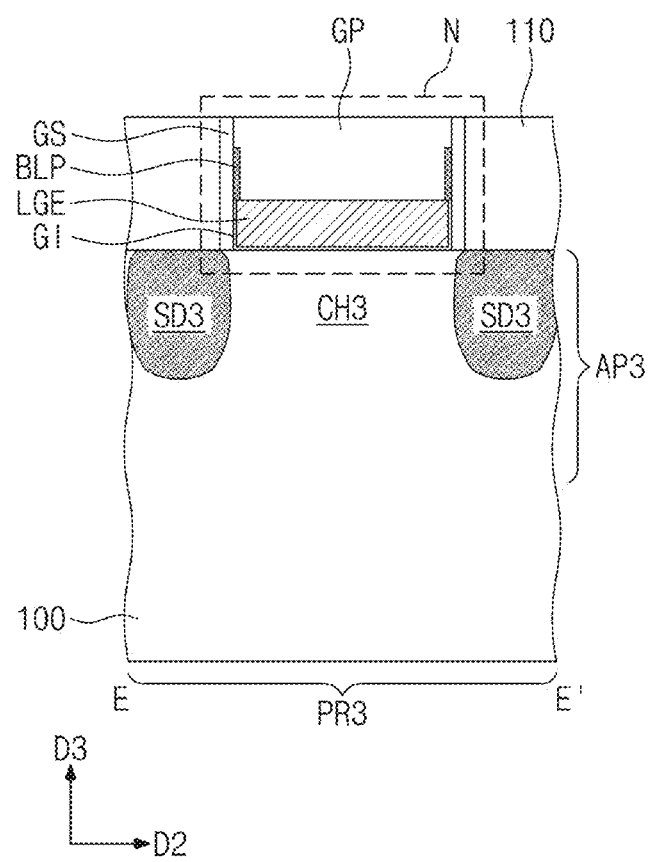

FIGS. 18A, 19A, 20A, 21A, 22A, and 23A are enlarged sectional views illustrating a method of forming a portion M of FIG. 17A. FIGS. 18B, 19B, 20B, 21B, 22B, and 23B are enlarged sectional views illustrating a method of forming a portion N of FIG. 17E.

Figure 18A:
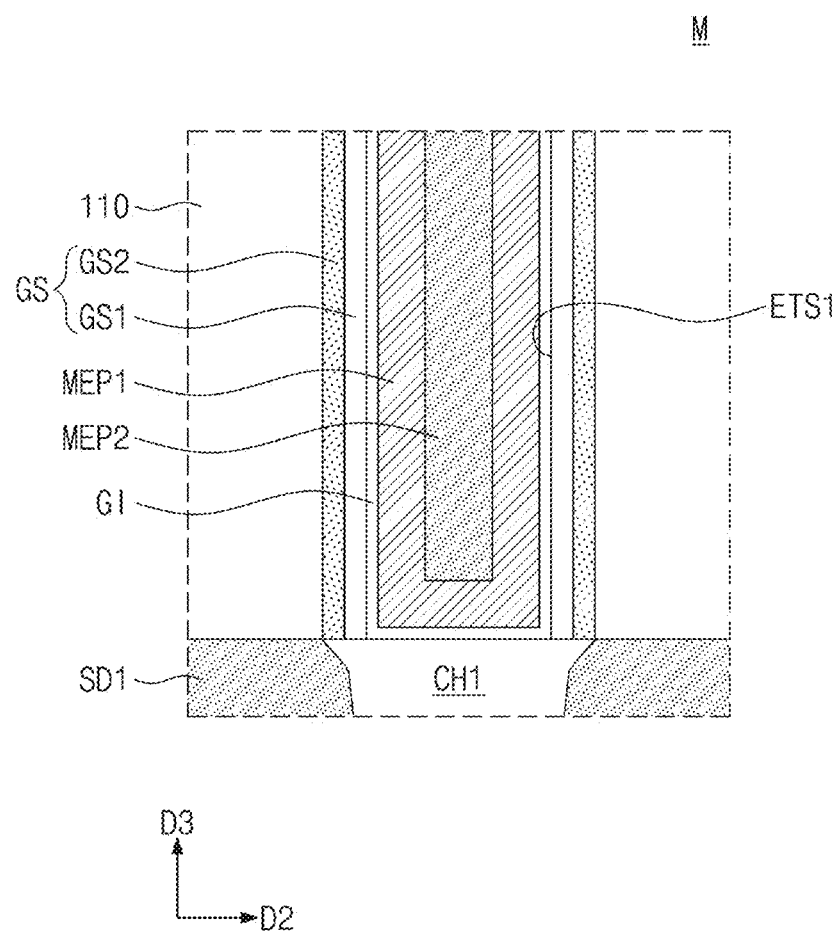
FIGS. 18A, 19A, 20A, 21A, 22A, and 23A are enlarged sectional views illustrating a method of forming a portion M of FIG. 17A.
Figure 18B:
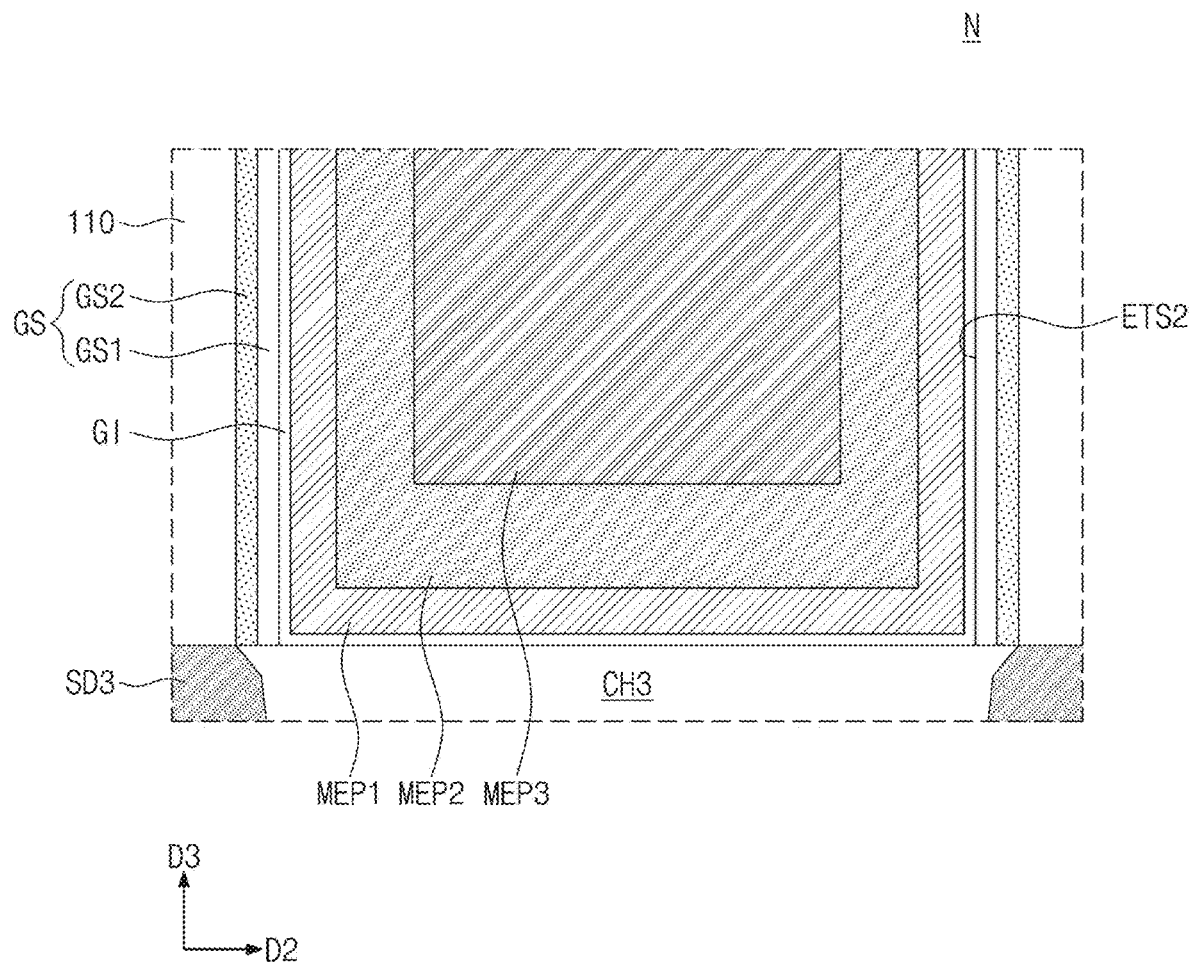
FIGS. 18B, 19B, 20B, 21B, 22B, and 23B are enlarged sectional views illustrating a method of forming a portion N of FIG. 17E.

Referring to FIGS. 18A and 18B, a first empty space ETS1 may be defined by selectively removing the sacrificial pattern PP. A second empty space ETS2 may be defined by selectively removing the long sacrificial pattern LPP.

The gate insulating layer GI, the first metal pattern MEP1, and the second metal pattern MEP2 may be sequentially formed in each of the first and second empty spaces ETS1 and ETS2. The third metal pattern MEP3 may be further formed in the second empty space ETS2. The first to third metal patterns MEP1, MEP2, and MEP3 may be formed by an atomic layer deposition process, a chemical vapor deposition process, and/or a physical vapor deposition process.

The gate insulating layer GI may include a silicon oxide layer, high-k dielectric layers, or combinations thereof. The first metal pattern MEP1 may be formed of or include at least one of metal nitrides having relatively high work functions. The second metal pattern MEP2 may be formed of or include at least one of metal carbides having relatively low work functions. The third metal pattern MEP3 may be formed of or include at least one of low resistance metals.

Figure 19A:
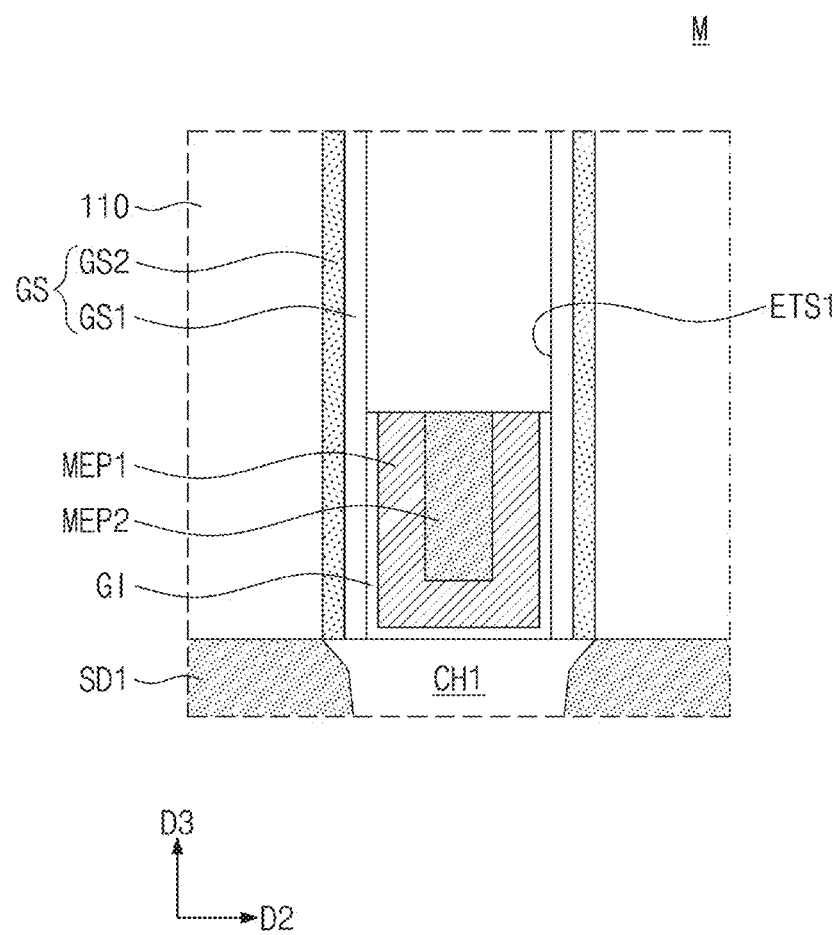
Figure 19B:
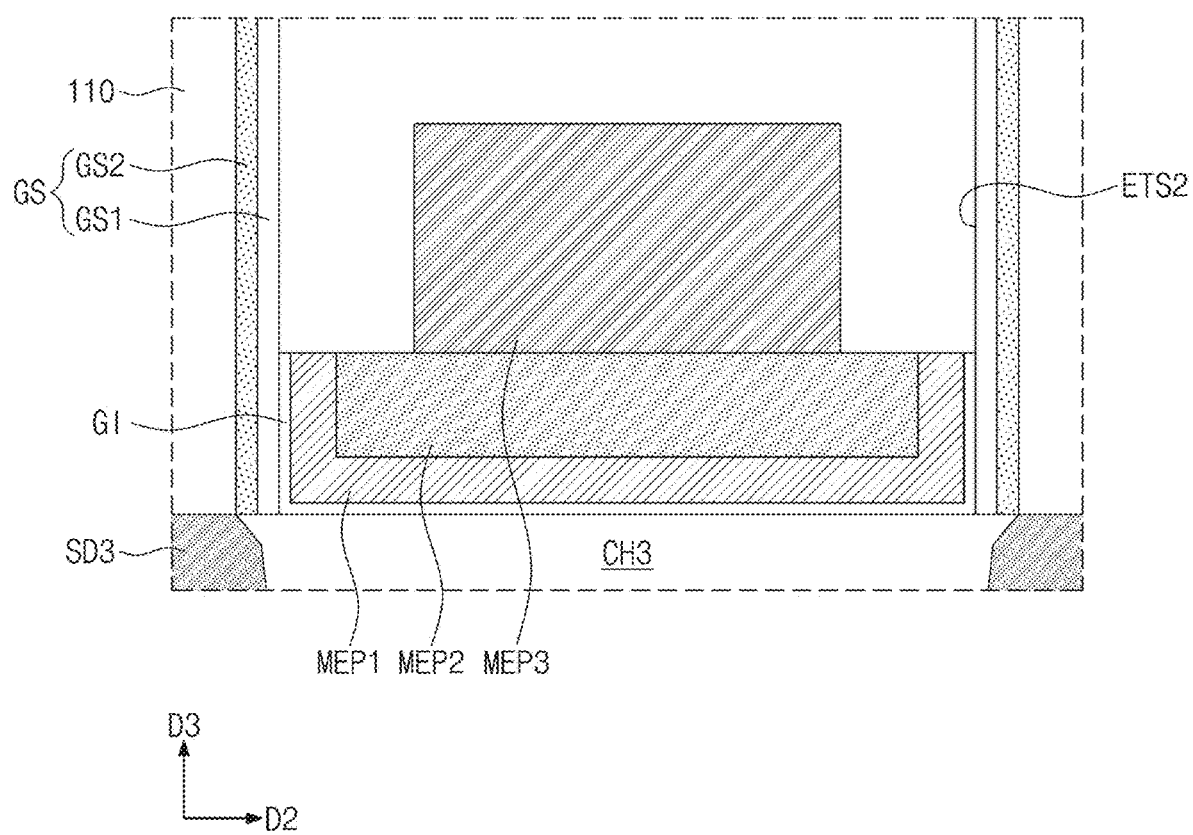

Referring to FIGS. 19A and 19B, the gate insulating layer GI, the first metal pattern MEP1, and the second metal pattern MEP2 in each of the first and second empty spaces ETS1 and ETS2 may be selectively recessed. However, for the third metal pattern MEP3, just an upper portion thereof may be recessed in a relatively small depth.

Since the second empty space ETS2 is wider than the first empty space ETS1, the first and second metal patterns MEP1 and MEP2 in the second empty space ETS2 may be more recessed than the first and second metal patterns MEP1 and MEP2 in the first empty space ETS1.

Figure 20A:
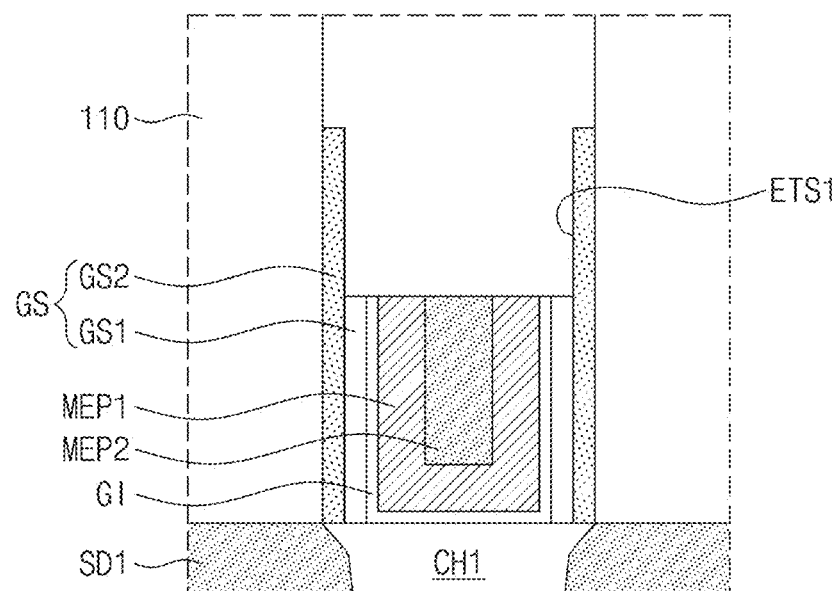
Figure 20B:
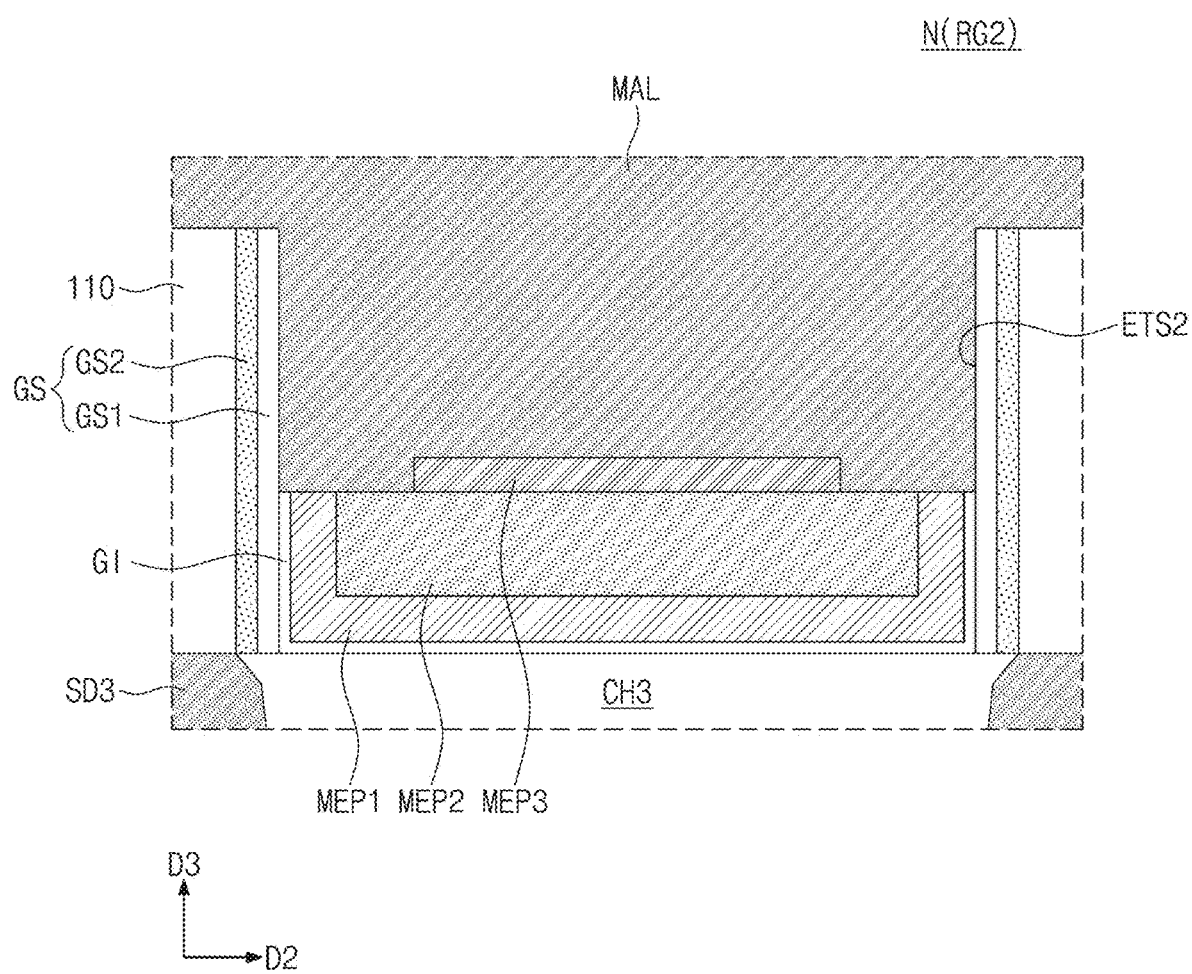

Referring to FIGS. 20A and 20B, a mask layer MAL may be formed to fill the second empty space ETS2 but to expose the first empty space ETS1. The first spacer GS1 on the first region RG1 exposed by the mask layer MAL may be selectively recessed. The first spacer GS1 may have a top surface that is located at a height substantially equal to or lower than top surfaces of the first and second metal patterns MEP1 and MEP2. During the recessing of the first spacer GS1, the second spacer GS2 on the first region RG1 may also be slightly recessed.

Meanwhile, the first and second spacers GS1 and GS2 on the second region RG2 may not be recessed and may be left as they are, because they are protected by the mask layer MAL.

Figure 21A:
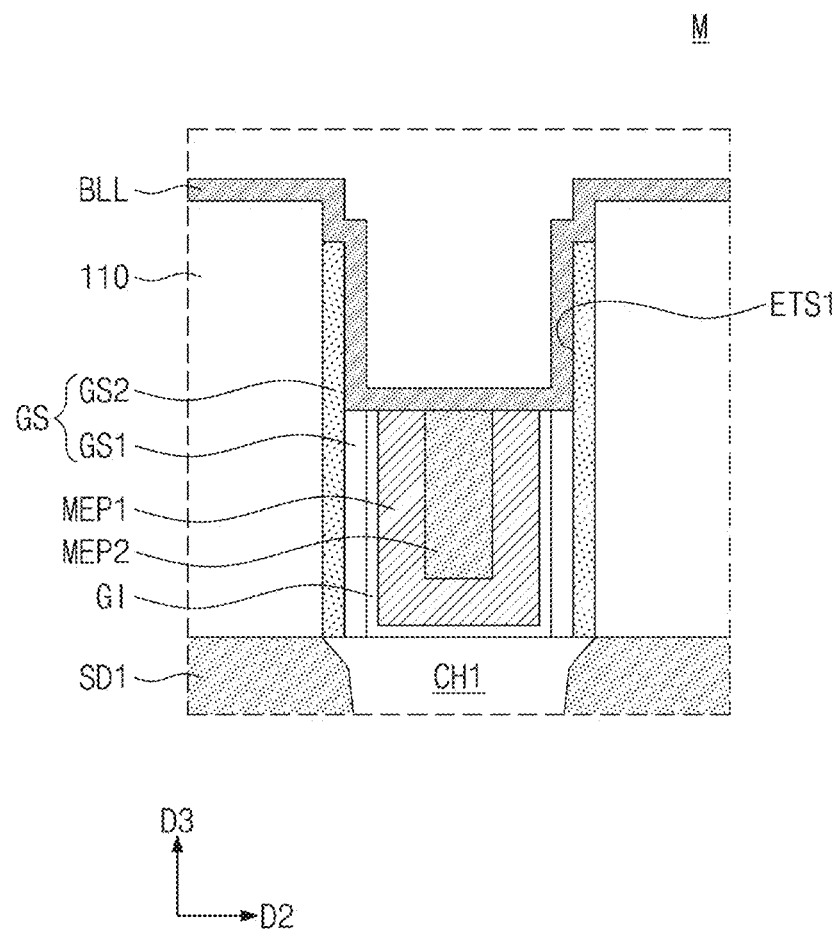
Figure 21B:
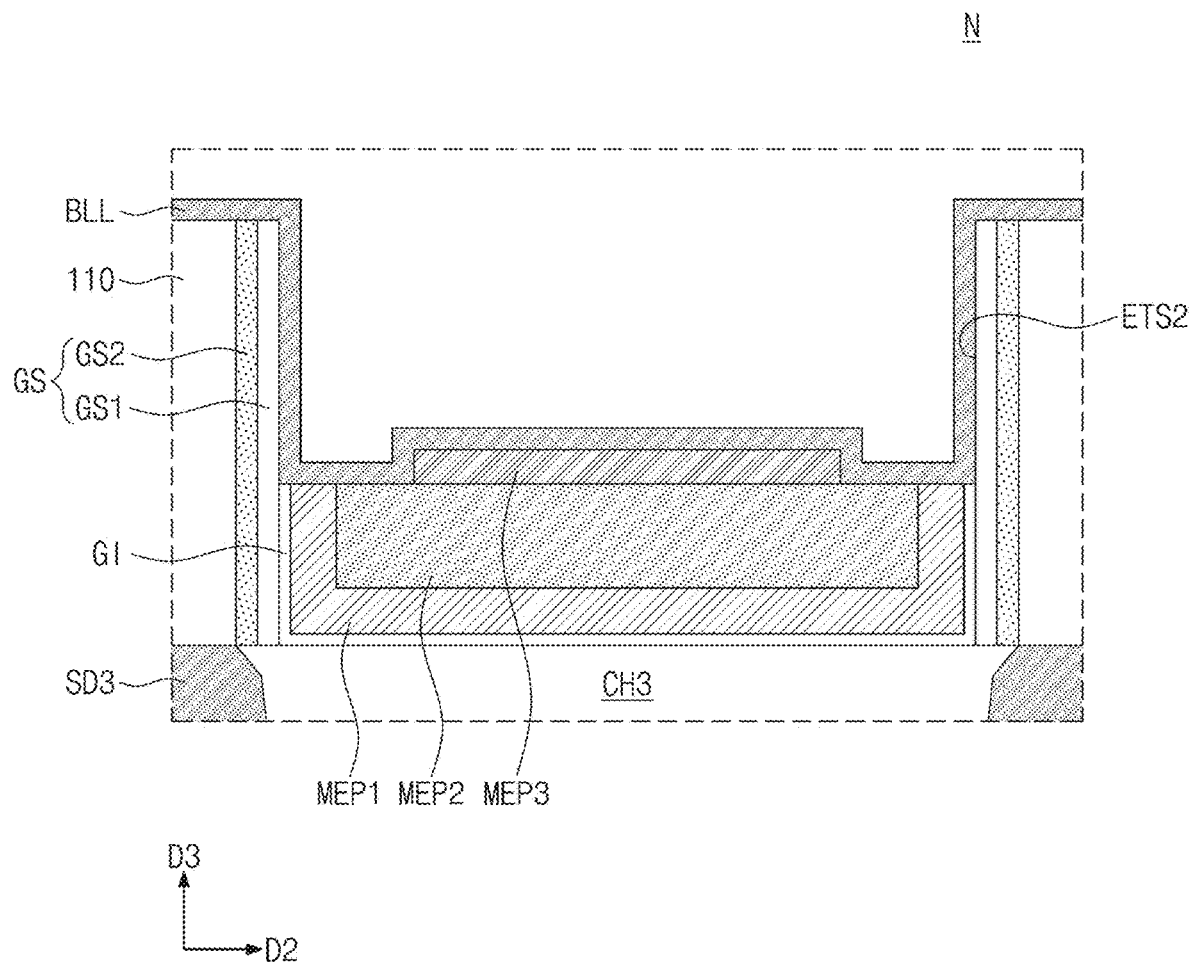

Referring to FIGS. 21A and 21B, the mask layer MAL may be selectively removed. A blocking layer BLL may be conformally formed in each of the first and second empty spaces ETS1 and ETS2. The blocking layer BLL may be formed by an atomic layer deposition process or a chemical vapor deposition process. The blocking layer BLL may be formed to have a thickness of 1 nm to 4 nm. The blocking layer BLL may be formed of or include polysilicon.

Figure 22A:
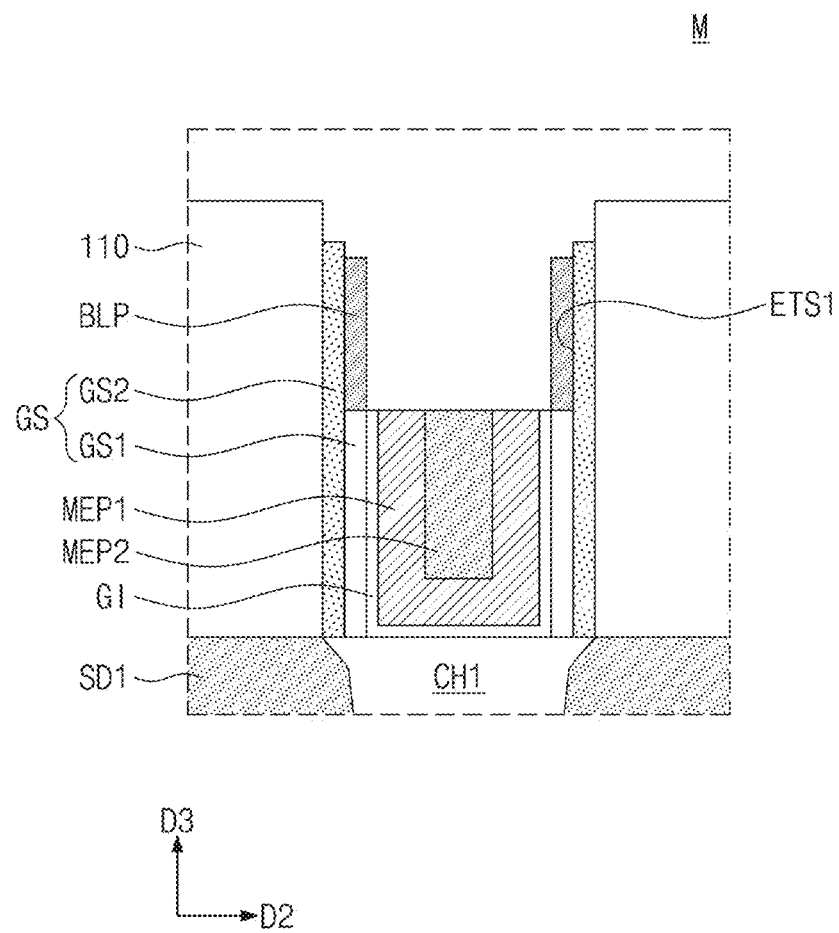
Figure 22B:
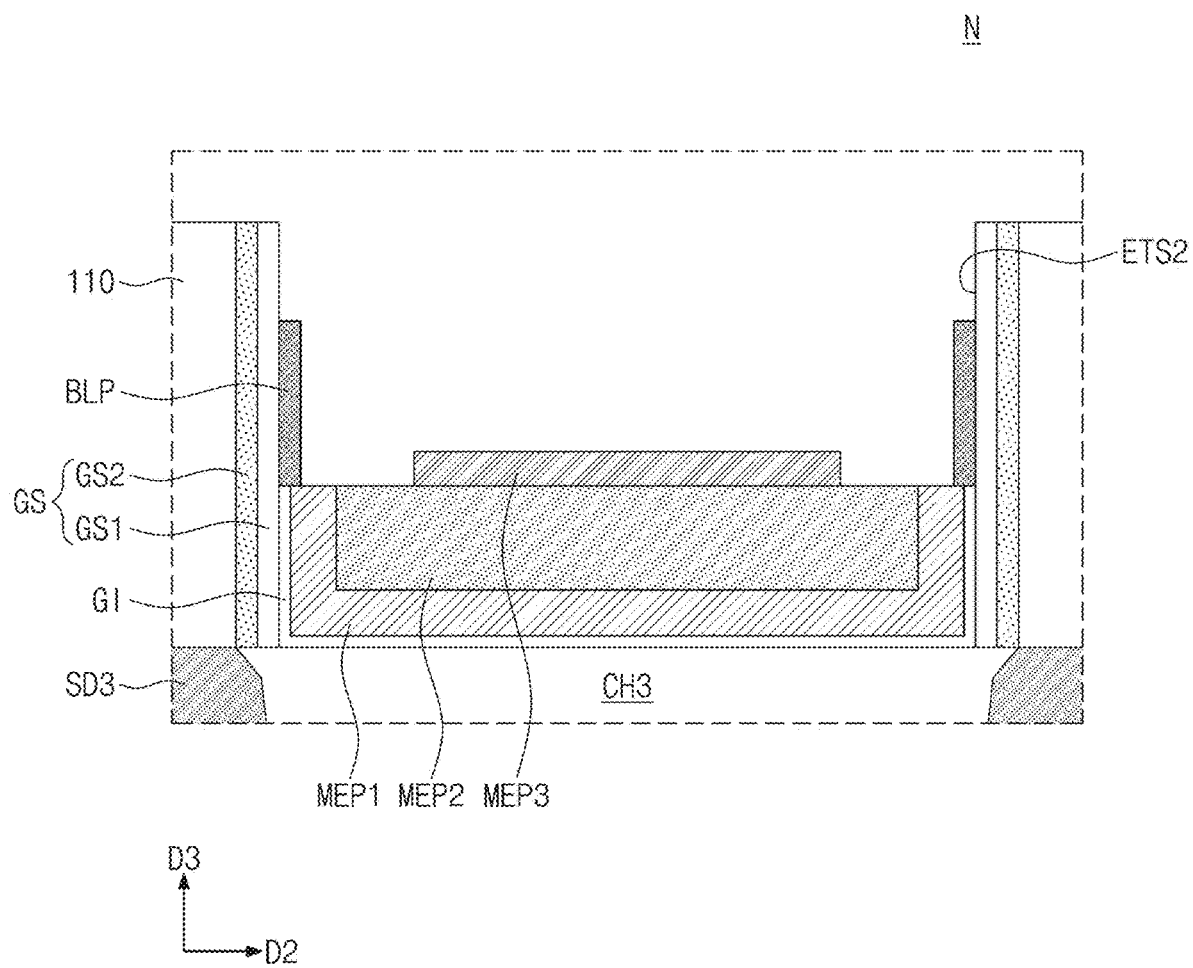

Referring to FIGS. 22A and 22B, a chamfering process and/or an anisotropic etching process may be performed on the blocking layer BLL, and thus, the blocking pattern BLP may be formed in the form of a spacer. In the first empty space ETS1, the blocking pattern BLP may be formed in a shape vertically extending from the top surface of the first spacer GS1 along the inner side surface of the second spacer GS2. In the second empty space ETS2, the blocking pattern BLP may be formed in a shape vertically extending from the top surface of the first metal pattern MEP1 along the inner side surface of the first spacer GS1.

Figure 23A:
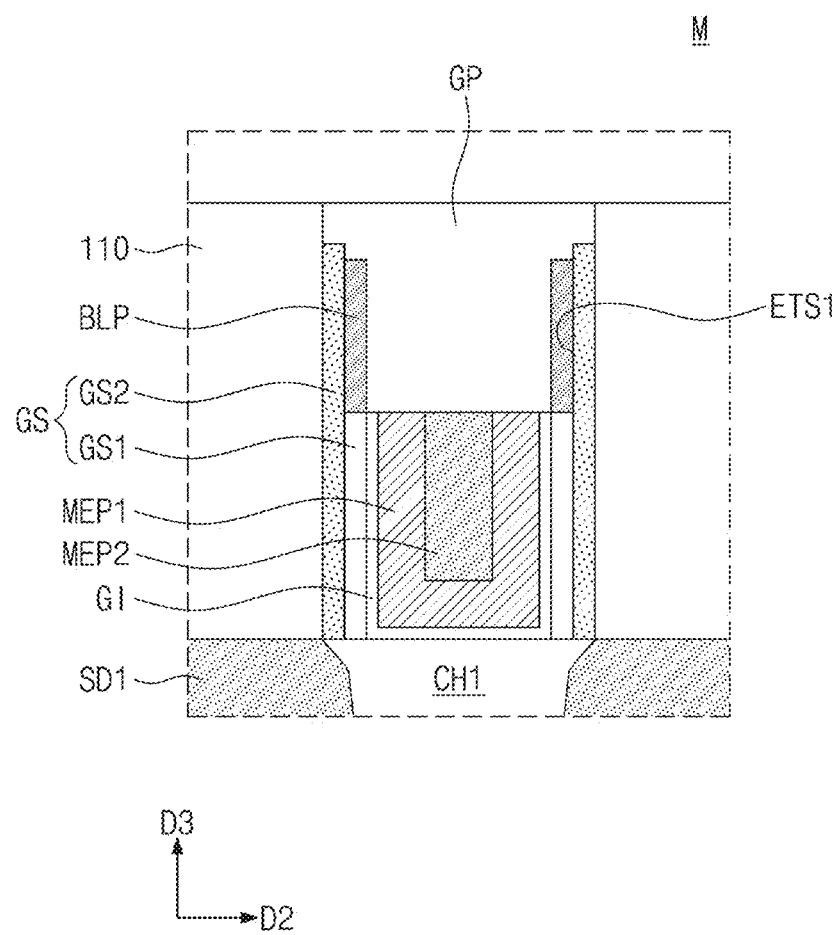
Figure 23B:
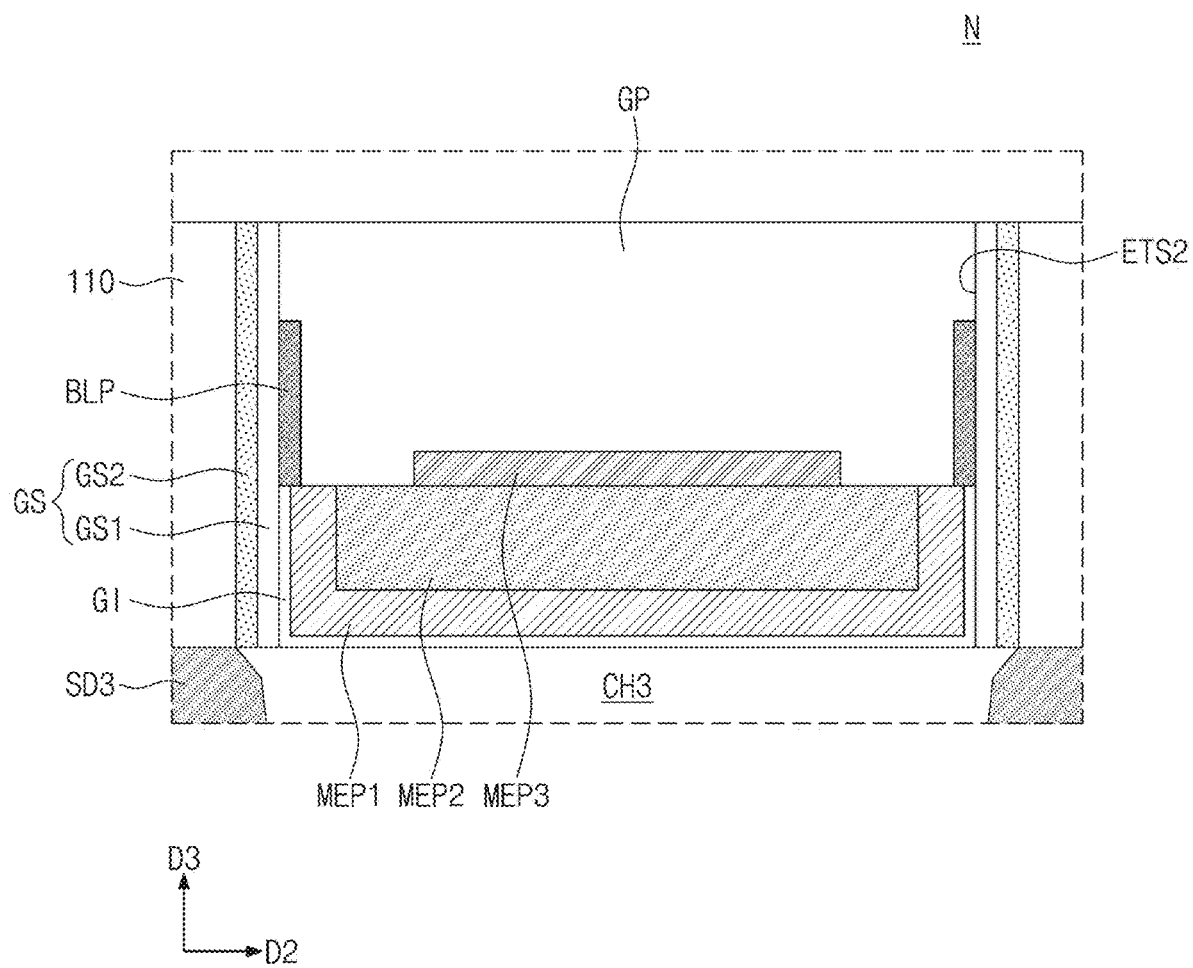
Figure 24A:
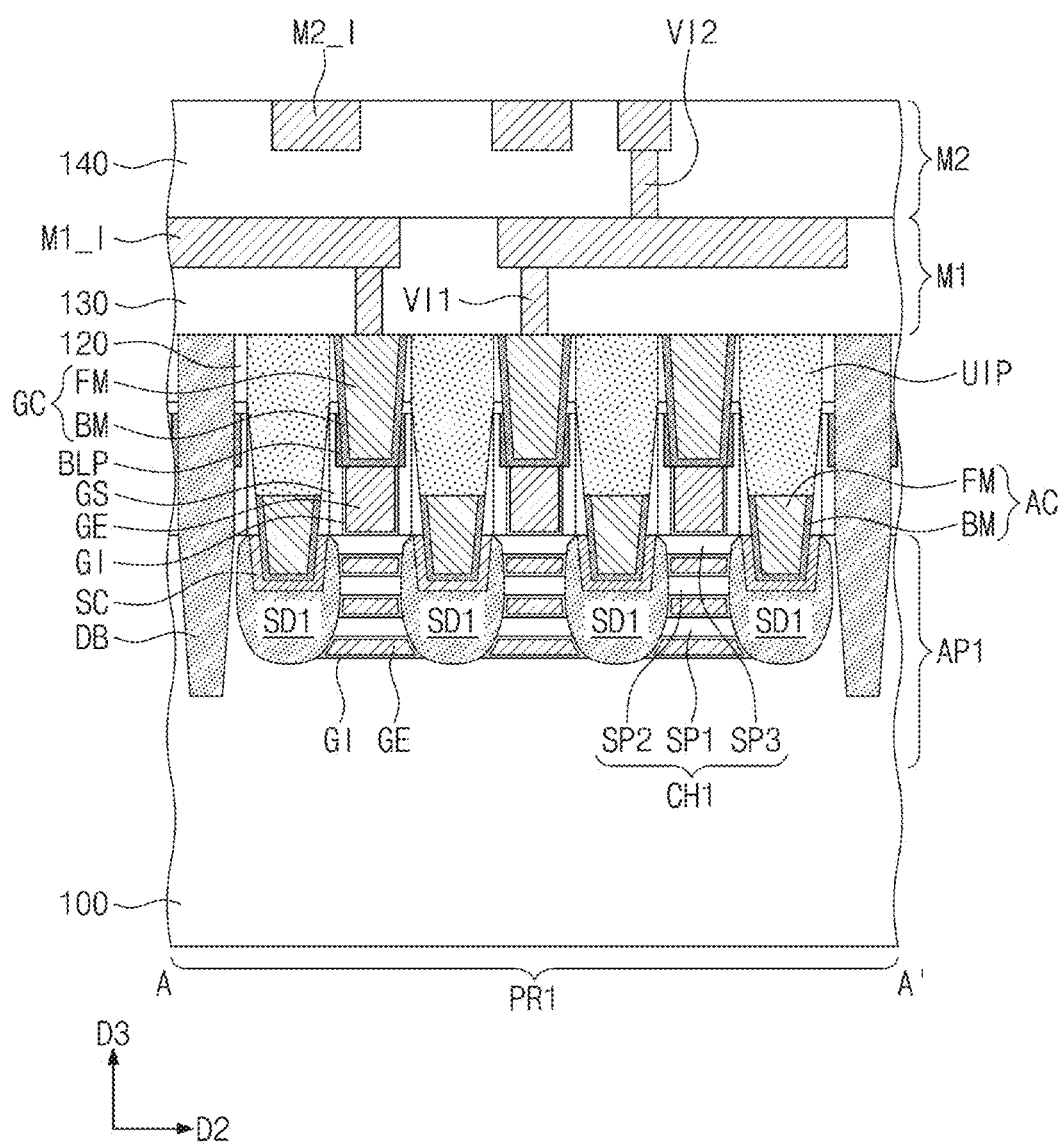
FIGS. 24A to 24E are sectional views, which are respectively taken along lines A-A', B-B', C-C', D-D', and E-E' of FIG. 4 to illustrate a semiconductor device according to an embodiment of the disclosure.
Figure 24B:
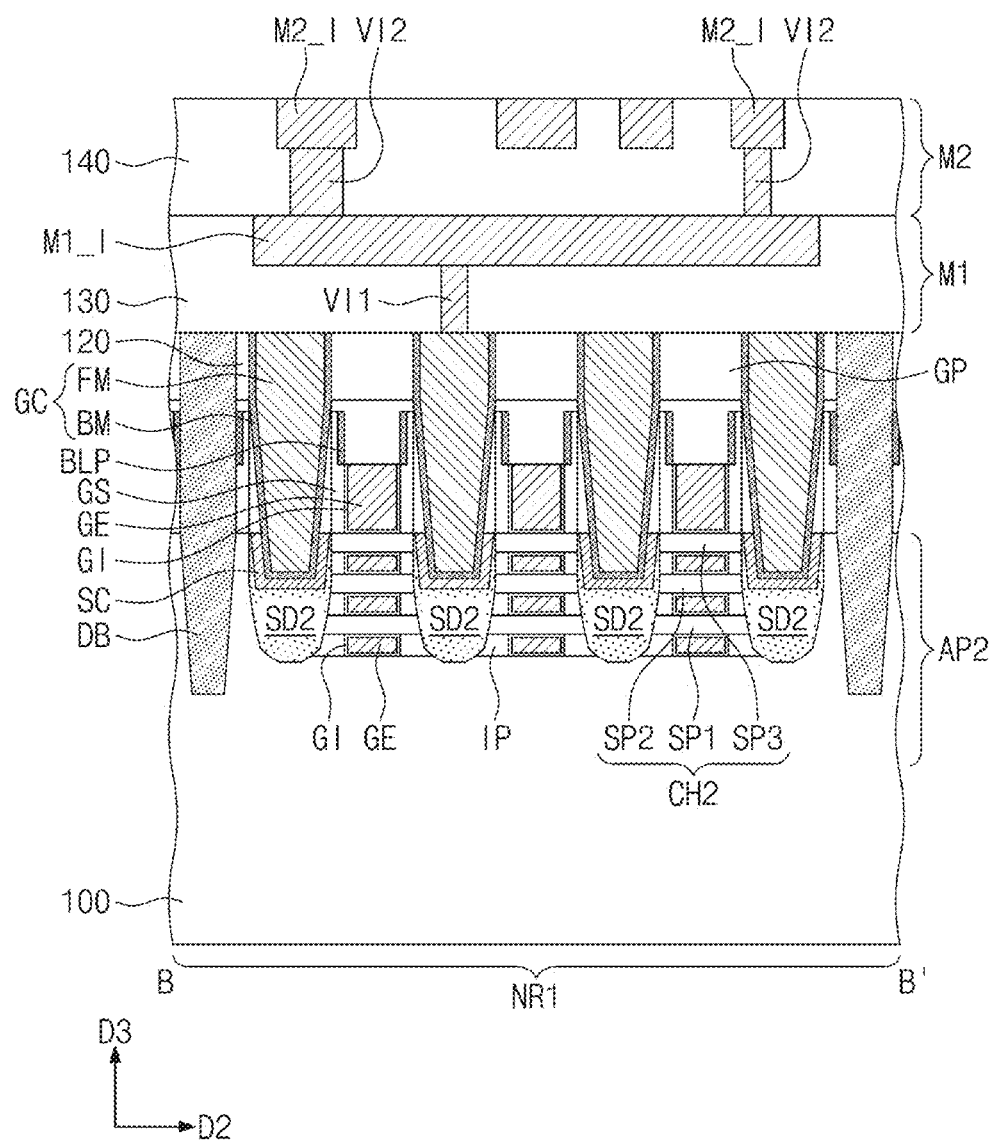
Figure 24C:
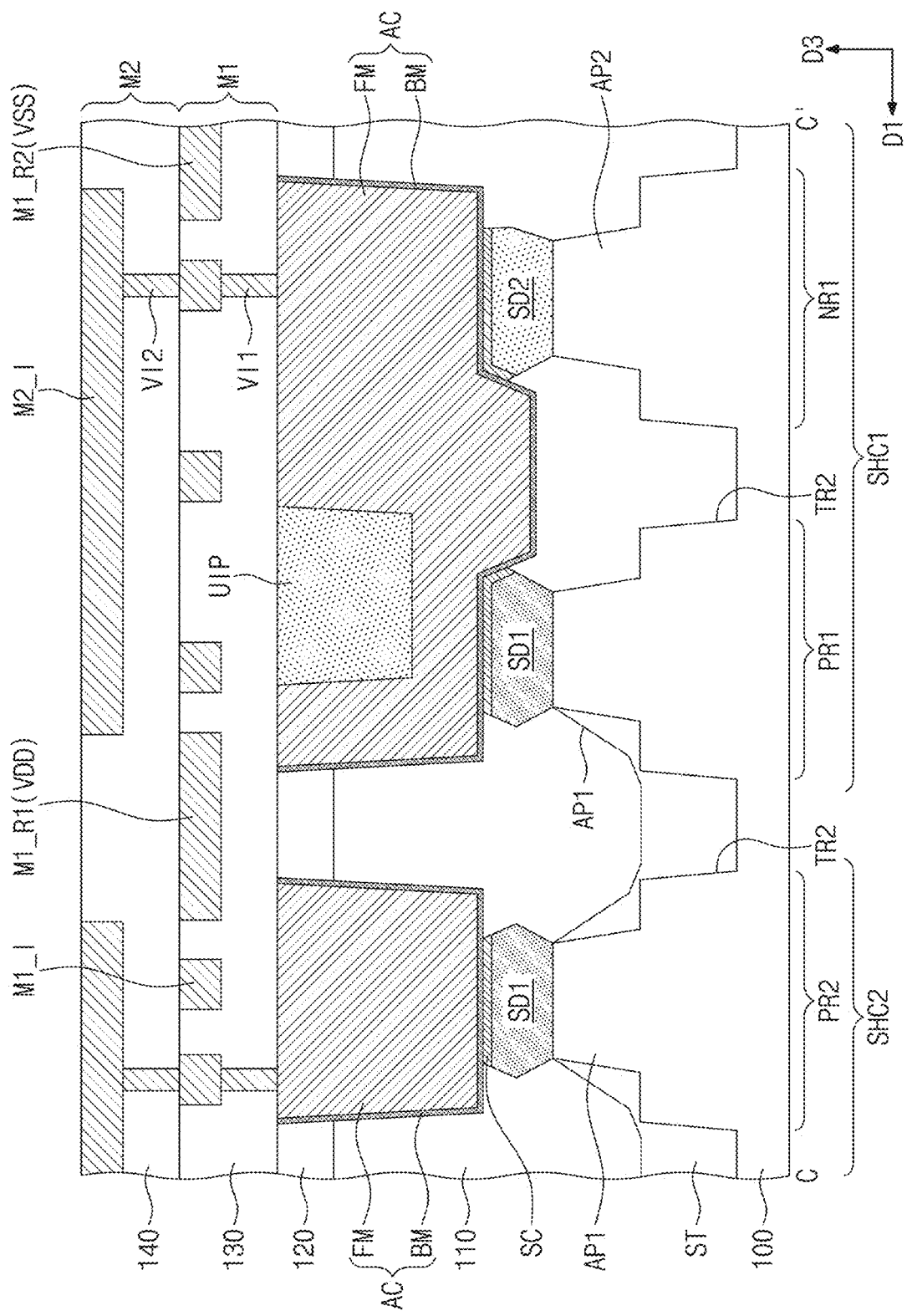
Figure 24D:
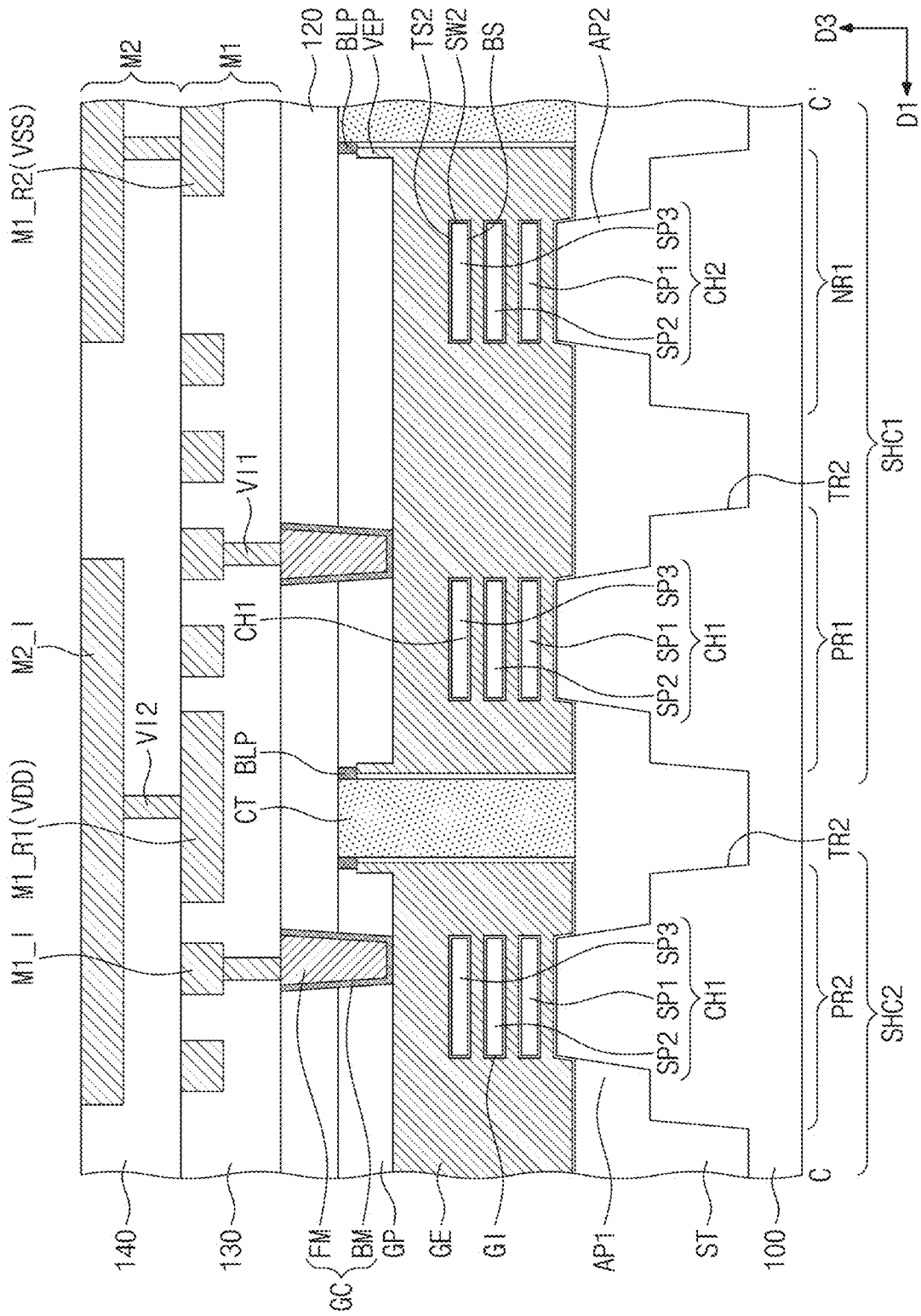
Figure 24E:
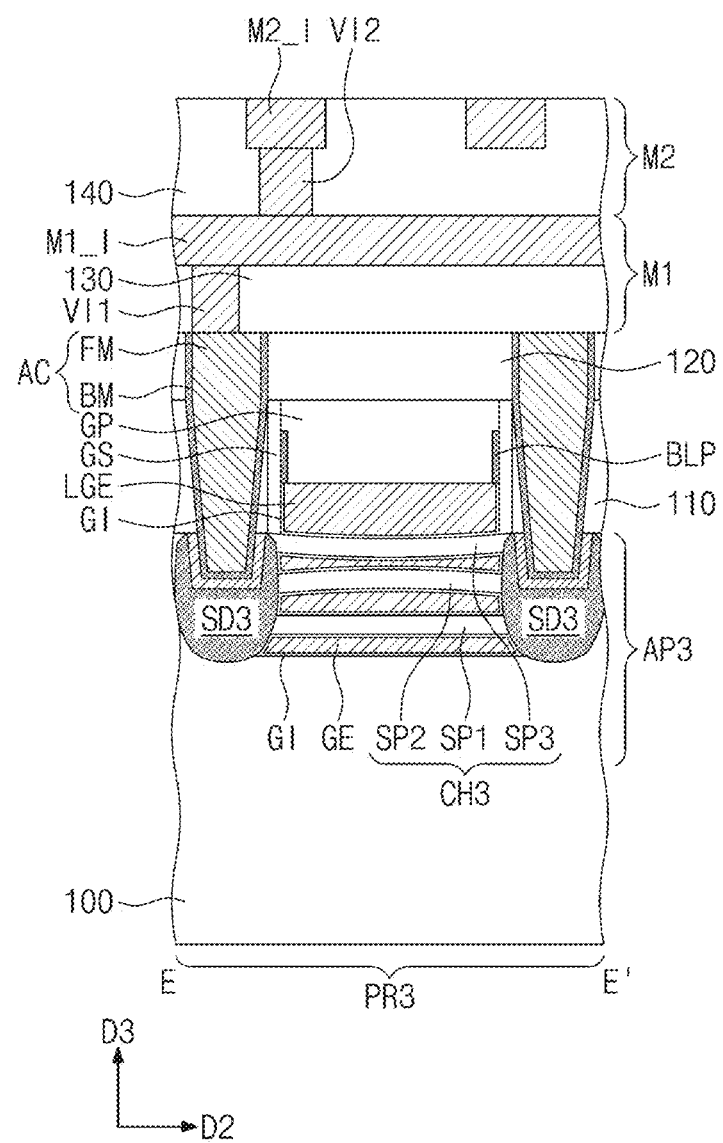

Referring to FIGS. 23A and 23B, the gate capping pattern GP may be formed in each of the first and second empty spaces ETS1 and ETS2. In the first empty space ETS1, the gate capping pattern GP may be formed to cover the top surface of the second spacer GS2 and the top surface of the blocking pattern BLP. In the second empty space ETS2, the gate capping pattern GP may be formed to cover the top surface of the blocking pattern BLP and the third metal pattern MEP3.

Referring back to FIGS. 4 and 5A to 5E, the second interlayer insulating layer 120 may be formed on the first interlayer insulating layer 110. The second interlayer insulating layer 120 may include a silicon oxide layer. A pair of the division structures DB may be respectively formed at both sides of the first single height cell SHC1. The division structures DB may be overlapped with the gate electrodes GE, which are respectively formed at both sides of the first single height cell SHC1. For example, the formation of the division structures DB may include forming a hole to penetrate the first and second interlayer insulating layers 110 and 120 and the gate electrode GE and to extend into the first and second active patterns AP1 and AP2 and then filling the hole with an insulating layer.

The active contacts AC may be formed to penetrate the second interlayer insulating layer 120 and the first interlayer insulating layer 110 and to be electrically connected to the first to third source/drain patterns SD1, SD2, and SD3. The upper insulating pattern UIP may be formed by partially replacing an upper portion of each of the active contacts AC with an insulating material. The gate contact GC may be formed to penetrate the second interlayer insulating layer 120 and the gate capping pattern GP and to be electrically connected to each of the gate electrode GE and the long gate electrode LGE.

As previously described with reference to FIG. 8, the expansion portion EXP may be formed by an over-etching process, which may be performed when the gate contact GC is formed on the gate electrode GE. However, according to an embodiment of the disclosure, a pair of the blocking patterns BLP, which are formed of polysilicon, may prevent the expansion portion EXP from being formed in the gate contact GC. Accordingly, in the fabricating method according to an embodiment of the disclosure, it may be possible to prevent a short circuit from being formed between the gate contact GC and the source/drain pattern SD1 or SD2 and thereby to improve the reliability characteristics of the semiconductor device.

The third interlayer insulating layer 130 may be formed on the second interlayer insulating layer 120. The first metal layer M1 may be formed in the third interlayer insulating layer 130. The formation of the first metal layer M1 may include forming the first power line M1_R1, the second power line M1_R2, the third power line M1_R3, and the first interconnection lines M1_I.

The fourth interlayer insulating layer 140 may be formed on the first metal layer M1. The second metal layer M2 may be formed in the fourth interlayer insulating layer 140. The formation of the second metal layer M2 may include forming the second interconnection lines M2_I. In an embodiment, the second interconnection lines M2_I may be formed through a dual damascene process.

According to an embodiment of the disclosure, the process of forming the interconnection lines in the first or second metal layer M1 or M2 may be performed using an EUV lithography process. The EUV lithography for the process of forming the interconnection lines (i.e., a BEOL process) may be performed in substantially the same manner as the formation of the sacrificial patterns PP. For example, the minimum pitch between the first interconnection lines M1_I, which are realized by the EUV lithography process according to the present embodiment, may be less than or equal to 45 nm.

FIGS. 24A to 24E are sectional views, which are respectively taken along lines A-A', B-B', C-C', D-D', and E-E' of FIG. 4 to illustrate a semiconductor device according to an embodiment of the disclosure. In the following description, an element previously described with reference to FIGS. 4 and 5A to 5E may be identified by the same reference number without repeating an overlapping description thereof.

Referring to FIGS. 4 and 24A to 24E, the device isolation layer ST may define the first active pattern AP1, the second active pattern AP2, and the third active pattern AP3 in an upper portion of the substrate 100. The first active pattern AP1 may be defined on each of the first and second PMOSFET regions PR1 and PR2, the second active pattern AP2 may be defined on each of the first and second NMOSFET regions NR1 and NR2, and the third active pattern AP3 may be defined on each of the third and fourth PMOSFET regions PR3 and PR4.

The first active pattern AP1 may include the first channel pattern CH1 provided at an upper portion thereof. The second active pattern AP2 may include the second channel pattern CH2 provided at an upper portion thereof. The third active pattern AP3 may include the third channel pattern CH3 provided at an upper portion thereof.

Each of the first to third channel patterns CH1, CH2, and CH3 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., the third direction D3). The first to third semiconductor patterns SP1, SP2, and SP3 of the third channel pattern CH3 may have a bent shape in an upward or downward direction, because they have a relatively large length in the second direction D2.

Each of the first to third semiconductor patterns SP1, SP2, and SP3 may be formed of or include at least one of silicon (Si), germanium (Ge), or silicon-germanium (SiGe). For example, each of the first to third semiconductor patterns SP1, SP2, and SP3 may be formed of or include crystalline silicon.

The first active pattern AP1 may further include the first source/drain patterns SD1. The stacked first to third semiconductor patterns SP1, SP2, and SP3 of the first channel pattern CH1 may be interposed between each adjacent pair of the first source/drain patterns SD1. The stacked first to third semiconductor patterns SP1, SP2, and SP3 may connect each adjacent pair of the first source/drain patterns SD1 to each other.

The second active pattern AP2 may further include the second source/drain patterns SD2. The stacked first to third semiconductor patterns SP1, SP2, and SP3 of the second channel pattern CH2 may be interposed between each adjacent pair of the second source/drain patterns SD2. The stacked first to third semiconductor patterns SP1, SP2, and SP3 may connect each adjacent pair of the second source/drain patterns SD2 to each other.

The third active pattern AP3 may further include the third source/drain patterns SD3. The stacked first to third semiconductor patterns SP1, SP2, and SP3 of the third channel pattern CH3 may be interposed between each adjacent pair of the third source/drain patterns SD3. The stacked first to third semiconductor patterns SP1, SP2, and SP3 may connect each adjacent pair of the third source/drain patterns SD3 to each other.

The gate electrodes GE may be provided to cross the first and second channel patterns CH1 and CH2 and to extend in the first direction D1. The gate electrode GE may be vertically overlapped with the first and second channel patterns CH1 and CH2. A pair of the gate spacers GS may be disposed on opposite side surfaces of the gate electrode GE. The gate capping pattern GP may be provided on the gate electrode GE. The long gate electrode LGE may be provided to cross the third channel pattern CH3 and to extend in the first direction D1.

Referring back to FIG. 24D, the gate electrode GE may be provided to surround the first to third semiconductor patterns SP1, SP2, and SP3 of each of the first and second channel patterns CH1 and CH2. The transistor according to the present embodiment may be a three-dimensional field effect transistor (e.g., MBCFET or GAAFET) in which the gate electrode GE is provided to three-dimensionally surround the channel pattern CH1 or CH2. For example, each of the first to third semiconductor patterns SP1, SP2, and SP3 may include a second top surface TS2, second side surfaces SW2, which are opposite to each other, and a bottom surface BS. The gate electrode GE may be provided to face the second top surface TS2, the second side surfaces SW2, and the bottom surface BS. The gate insulating layer GI may be provided between each of the first to third semiconductor patterns SP1, SP2, and SP3 and the gate electrode GE. The gate insulating layer GI may surround each of the first and second channel patterns CH1 and CH2.

An inner spacer IP, which is interposed between the gate insulating layer GI and the second source/drain pattern SD2, may be provided on the first and second NMOSFET regions NR1 and NR2. The gate electrode GE may be spaced apart from the second source/drain pattern SD2 by the gate insulating layer GI and the inner spacer IP. By contrast, the inner spacer IP may be omitted on the first and second PMOSFET regions PR1 and PR2.

According to an embodiment of the disclosure, a pair of the blocking patterns BLP may be provided on each of the gate electrode GE and the long gate electrode LGE. The pair of the blocking patterns BLP may prevent the gate contact GC from being extended to a region beyond the gate spacer GS.

The first interlayer insulating layer 110 and the second interlayer insulating layer 120 may be provided on the substrate 100. The active contacts AC may be provided to penetrate the first and second interlayer insulating layers 110 and 120 and to be connected to the first and second source/drain patterns SD1 and SD2, respectively. The gate contacts GC may be provided to penetrate the second interlayer insulating layer 120 and the gate capping pattern GP and to be connected to the gate electrode GE and the long gate electrode LGE, respectively. The active contacts AC and gate contacts GC may be substantially the same as those in the previous embodiment described with reference to FIGS. 4 and 5A to 5E.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first metal layer M1 and the second metal layer M2 may be substantially the same as those in the previous embodiment described with reference to FIGS. 4 and 5A to 5E.

According to an embodiment of the disclosure, a semiconductor device may include a blocking pattern, which is used to guide a gate contact, between the gate contact and a gate spacer. A blocking pattern may prevent an expansion portion from being formed in the gate contact and thereby may prevent a short circuit from being formed between the gate contact and an active contact or source/drain pattern, which is adjacent thereto. As a result, the reliability characteristics of the semiconductor device may be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While example embodiments of the disclosure have been particularly shown and described, it will be understood by one of ordinary skill in the art that variations in form and detail may be made therein without departing from the spirit and scope of the attached claims.

What is claimed is:

1. A semiconductor device comprising:
a first active pattern on a substrate, the first active pattern comprising a pair of first source/drain patterns and a first channel pattern therebetween;
a gate electrode on the first channel pattern;
a first gate spacer on a side surface of the gate electrode, the first gate spacer comprising a first spacer and a second spacer, a top surface of the first spacer being lower than a top surface of the second spacer;
a first blocking pattern on the first spacer; and
a gate contact coupled to the gate electrode, wherein
the first blocking pattern is interposed between the gate contact and the second spacer.

2. The semiconductor device of claim 1, wherein the first blocking pattern is vertically extended from the top surface of the first spacer along an inner side surface of the second spacer.

3. The semiconductor device of claim 1, wherein a bottom surface of the first blocking pattern is located at a height that is equal to or lower than a bottom surface of the gate contact.

4. The semiconductor device of claim 1, wherein the first blocking pattern directly covers a side surface of the gate contact.

5. The semiconductor device of claim 1, further comprising:
an active contact coupled to at least one of the pair of first source/drain patterns, wherein
the first blocking pattern is located between the gate contact and the active contact.

6. The semiconductor device of claim 1, wherein:
the first spacer comprises an Si-containing low-k dielectric material,
the second spacer comprises an Si-containing insulating material, and
the first blocking pattern comprises polysilicon.

7. The semiconductor device of claim 1, further comprising:
a gate cutting pattern penetrating the gate electrode, wherein:
the gate electrode comprises a vertically-extended portion which is vertically extended along a side surface of the gate cutting pattern, and
the first blocking pattern is provided on the vertically-extended portion.

8. The semiconductor device of claim 1, further comprising:
a gate capping pattern on the gate electrode, wherein
the gate capping pattern covers the top surface of the second spacer and a top surface of the first blocking pattern.

9. The semiconductor device of claim 1, wherein a thickness of the first blocking pattern ranges from 1 nm to 4 nm.

10. The semiconductor device of claim 1, further comprising:
a second active pattern on the substrate, the second active pattern comprising a pair of second source/drain patterns and a second channel pattern therebetween, a length of the second channel pattern being longer than a length of the first channel pattern;
a long gate electrode on the second channel pattern;
a second gate spacer on a side surface of the long gate electrode;
a gate capping pattern on the long gate electrode; and
a second blocking pattern between the gate capping pattern and the second gate spacer.

11. A semiconductor device comprising:
an active pattern on a substrate, the active pattern comprising a pair of source/drain patterns and a channel pattern therebetween;
a gate electrode on the channel pattern;
a gate spacer on a side surface of the gate electrode;
a gate capping pattern on the gate electrode;
a gate contact provided to penetrate the gate capping pattern and coupled to the gate electrode; and
a blocking pattern between the gate contact and the gate spacer, wherein:
the blocking pattern is extended along a side surface of the gate contact to prevent the gate contact from being formed in a region beyond the gate spacer, and
the blocking pattern comprises a material having an etch selectivity with respect to the gate spacer.

12. The semiconductor device of claim 11, wherein:
the gate spacer comprises a first spacer and a second spacer,
a top surface of the first spacer is lower than a top surface of the second spacer, and
the blocking pattern is vertically extended from the top surface of the first spacer along an inner side surface of the second spacer.

13. The semiconductor device of claim 11, wherein the gate capping pattern covers a top surface of the gate spacer and a top surface of the blocking pattern.

14. The semiconductor device of claim 11, further comprising:
a gate cutting pattern penetrating the gate electrode, wherein:

the gate electrode comprises a vertically-extended portion which is vertically extended along a side surface of the gate cutting pattern, and the blocking pattern is provided on the vertically-extended portion.

15. The semiconductor device of claim 11, further comprising:

an active contact coupled to at least one of the pair of source/drain patterns, wherein the blocking pattern is positioned between the gate contact and the active contact.

16. A semiconductor device comprising:

a substrate including a PMOSFET region and an NMOSFET region, which are spaced apart from each other in a first direction;

a first active pattern on the PMOSFET region and a second active pattern on the NMOSFET region;

a device isolation layer covering lower side surfaces of the first and second active patterns, an upper portion of each of the first and second active patterns protruding above the device isolation layer;

a gate electrode extended in the first direction to cross the first and second active patterns;

a first source/drain pattern and a second source/drain pattern, which are respectively provided in the upper portions of the first and second active patterns, and each of which is disposed adjacent to a side of the gate electrode;

a gate insulating layer interposed between the gate electrode and the first and second active patterns;

a gate spacer on a side surface of the gate electrode;

a gate capping pattern on a top surface of the gate electrode;

a gate cutting pattern penetrating the gate electrode;

an interlayer insulating layer on the gate capping pattern and the gate cutting pattern;

an active contact, which is provided to penetrate the interlayer insulating layer and is electrically connected to at least one of the first and second source/drain patterns;

a gate contact, which is provided to penetrate the interlayer insulating layer and the gate capping pattern and is electrically connected to the gate electrode;

an upper insulating pattern, which is provided in an upper portion of the active contact adjacent to the gate contact;

a blocking pattern between the gate contact and the gate spacer;

a first metal layer on the interlayer insulating layer, the first metal layer comprising a power line vertically overlapped with the gate cutting pattern and first interconnection lines electrically connected to the active contact and the gate contact, respectively; and a second metal layer on the first metal layer, wherein:

the second metal layer comprises second interconnection lines electrically connected to the first metal layer, the blocking pattern is positioned between the gate contact and the upper insulating pattern, and the gate contact is spaced apart from the active contact with the blocking pattern and the upper insulating pattern interposed therebetween.

17. The semiconductor device of claim 16, wherein:

the gate spacer comprises a first spacer and a second spacer, a top surface of the first spacer is lower than a top surface of the second spacer, and the blocking pattern is vertically extended from the top surface of the first spacer along an inner side surface of the second spacer.

18. The semiconductor device of claim 17, wherein:

the first spacer comprises an Si-containing low-k dielectric material, the second spacer comprises an Si-containing insulating material, and the blocking pattern comprises polysilicon.

19. The semiconductor device of claim 16, wherein:

the gate electrode comprises a vertically-extended portion which is vertically extended along a side surface of the gate cutting pattern, and the blocking pattern is provided on the vertically-extended portion.

20. The semiconductor device of claim 16, wherein a bottom surface of the blocking pattern is located at a height which is equal to or higher than the top surface of the gate electrode.

* * * * *